(12) United States Patent
Zhang

(10) Patent No.: US 11,933,860 B2
(45) Date of Patent: Mar. 19, 2024

(54) SYSTEM FOR FORMING AND TESTING BATTERIES IN PARALLEL AND IN SERIES

(71) Applicant: Chaojiong Zhang, College Station, TX (US)

(72) Inventor: Chaojiong Zhang, College Station, TX (US)

(*) Notice: Subject to any disclaimer, the term of this patent is extended or adjusted under 35 U.S.C. 154(b) by 0 days.

(21) Appl. No.: 17/612,327

(22) PCT Filed: Nov. 30, 2020

(86) PCT No.: PCT/US2020/062548
§ 371 (c)(1),
(2) Date: Nov. 18, 2021

(87) PCT Pub. No.: WO2021/113161
PCT Pub. Date: Jun. 10, 2021

(65) Prior Publication Data
US 2022/0268852 A1    Aug. 25, 2022

Related U.S. Application Data

(60) Provisional application No. 63/053,647, filed on Jul. 19, 2020, provisional application No. 63/049,918, (Continued)

(51) Int. Cl.
*G01R 31/00* (2006.01)
*G01R 31/3842* (2019.01)
(Continued)

(52) U.S. Cl.
CPC ....... *G01R 31/396* (2019.01); *G01R 31/3842* (2019.01); *H01M 10/4285* (2013.01); *H02J 7/0014* (2013.01); *H02J 7/0047* (2013.01)

(58) Field of Classification Search
USPC .......................... 324/426, 432–435
See application file for complete search history.

(56) References Cited

U.S. PATENT DOCUMENTS

| 5,705,929 A | 1/1998 | Caravello et al. |
| 5,894,212 A * | 4/1999 | Balogh ............. H02J 7/0016 320/136 |

(Continued)

OTHER PUBLICATIONS

International Search Report and Written Opinion of the International Searching Authority dated Aug. 3, 2021, for corresponding International Application No. PCT/US2020/062548.

(Continued)

*Primary Examiner* — Vincent Q Nguyen
(74) *Attorney, Agent, or Firm* — Stephen S. Hodgson

(57) ABSTRACT

A circuit assembly for forming and testing batteries connected in parallel and in series includes a parallel test management device (PTMD) that connects to each battery and includes a main relay and a current transducer in series and an auxiliary relay in series with a current limiting resistor, which are parallel to the main relay. Parallel battery groups are formed by connecting multiple PTMD-battery combinations and a voltage equalizer in parallel. Multiple parallel battery groups are connected in series. A battery testing system (BTS) connects to the battery groups. The equalizers and the BTS pass current through the batteries simultaneously. The current through batteries and the voltage drop across the current transducer are about zero at the end of charge and discharge.

47 Claims, 23 Drawing Sheets

Related U.S. Application Data filed on Jul. 9, 2020, provisional application No. 62/944,436, filed on Dec. 6, 2019.

(51) Int. Cl.
  *G01R 31/396* (2019.01)
  *H01M 10/42* (2006.01)
  *H02J 7/00* (2006.01)

(56) References Cited

U.S. PATENT DOCUMENTS

| | | |
|---|---|---|
| 5,914,609 A | 6/1999 | Curry et al. |
| 5,966,014 A | 10/1999 | Zhang et al. |
| 6,291,972 B1 | 9/2001 | Zhang |
| 6,437,539 B2 | 8/2002 | Olsson et al. |
| 6,906,523 B2 | 6/2005 | Bertness et al. |
| 8,476,869 B2 | 7/2013 | Shiu et al. |
| 9,005,788 B2 | 4/2015 | Zhu |
| 10,135,243 B2 | 11/2018 | Isshiki et al. |
| 10,429,449 B2 | 10/2019 | van Bremen |
| 10,992,148 B2 | 4/2021 | Kim |
| 2002/0047711 A1 | 4/2002 | Bertness et al. |
| 2004/0160214 A1 | 8/2004 | Blair et al. |
| 2009/0278489 A1 | 11/2009 | St-Jacques |
| 2010/0277845 A1* | 11/2010 | Park .......................... B60L 3/04 361/87 |
| 2011/0248675 A1 | 10/2011 | Shiu et al. |
| 2013/0313896 A1* | 11/2013 | Gless ...................... B60L 58/10 307/112 |
| 2014/0035532 A1 | 2/2014 | Brandl et al. |
| 2014/0266229 A1* | 9/2014 | McCoy ................ G01R 31/385 324/434 |
| 2015/0180146 A1 | 6/2015 | Filman et al. |
| 2017/0102435 A1 | 4/2017 | Hanking |
| 2017/0199245 A1 | 7/2017 | Schneeweiss et al. |
| 2019/0319460 A1 | 10/2019 | Taylor et al. |

OTHER PUBLICATIONS

International Publication No. WO 2021/113161 A3.
International Publication No. WO 2021/113161 A9.

* cited by examiner

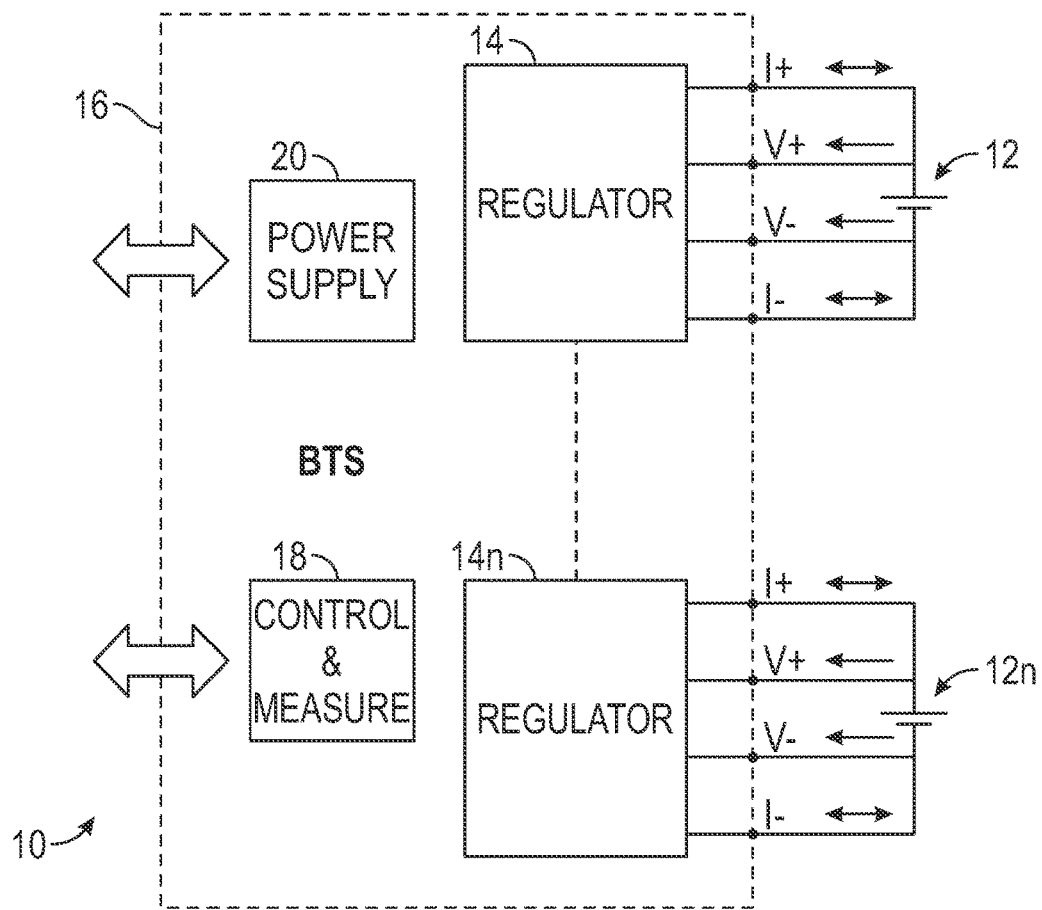
FIG. 1
(Prior Art)
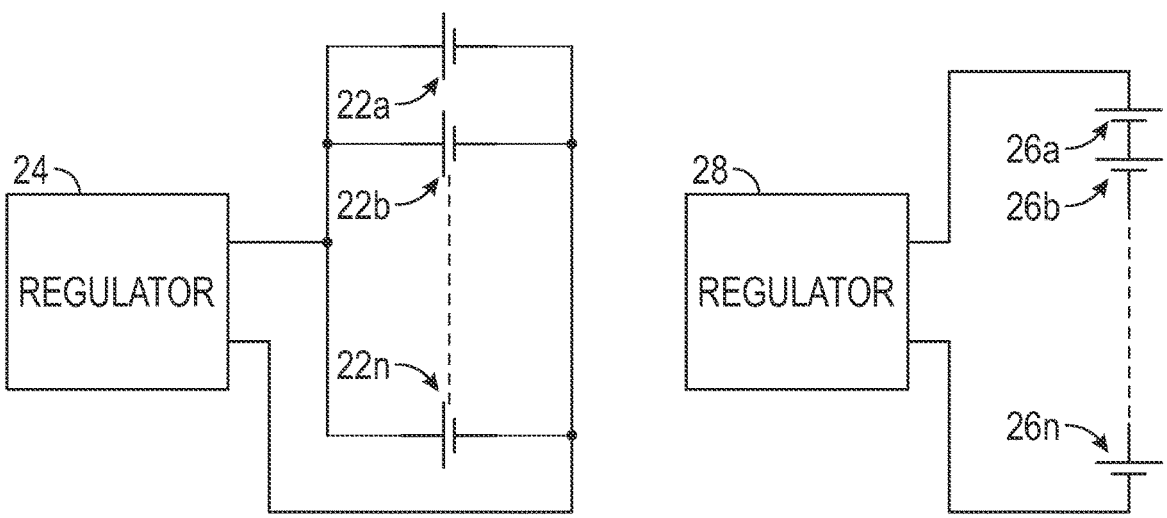
FIG. 2
(Prior Art)
FIG. 3
(Prior Art)

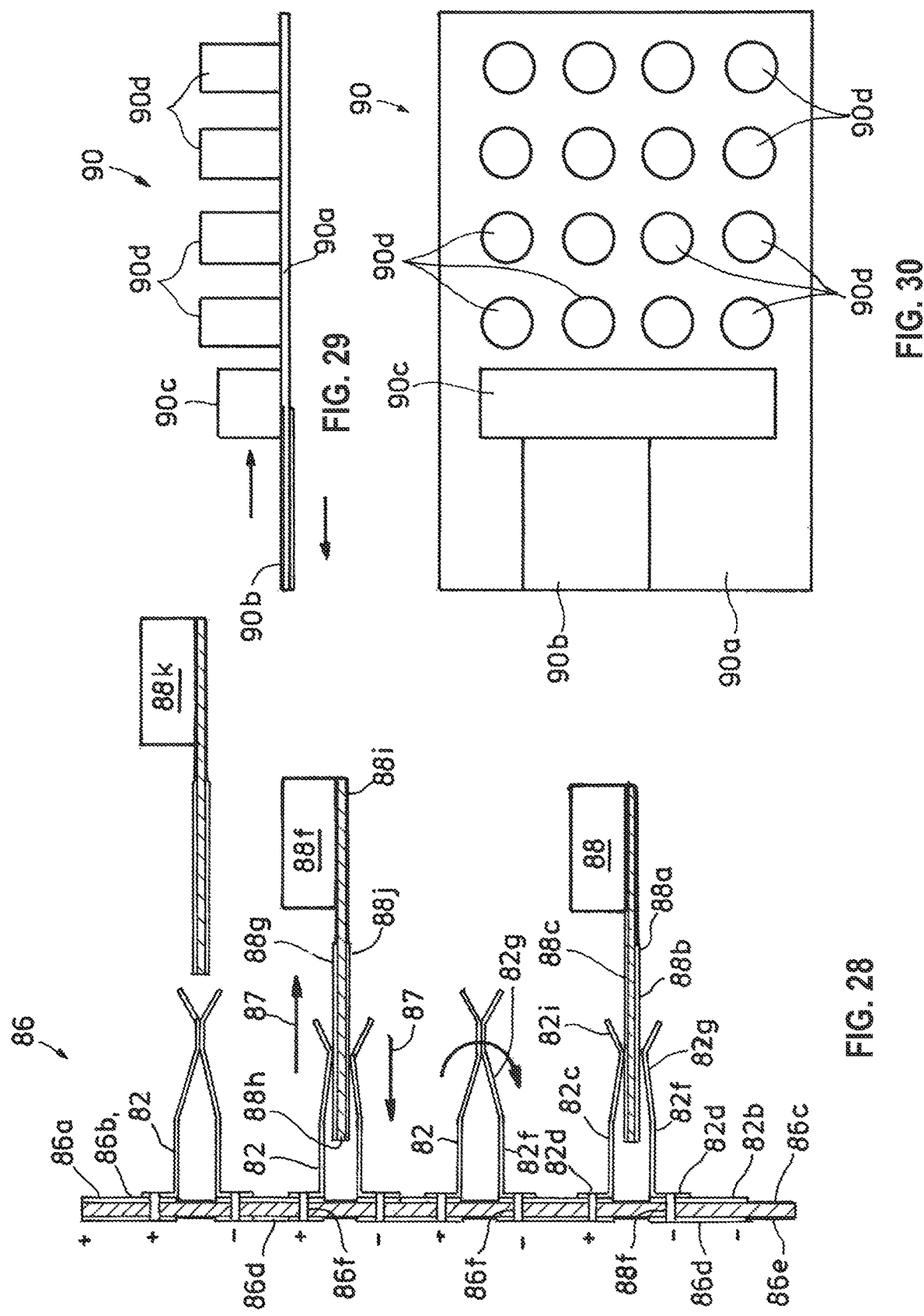

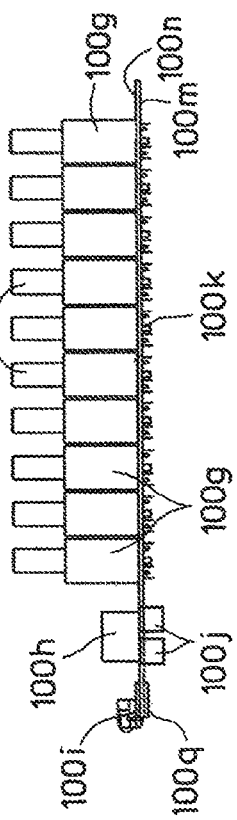
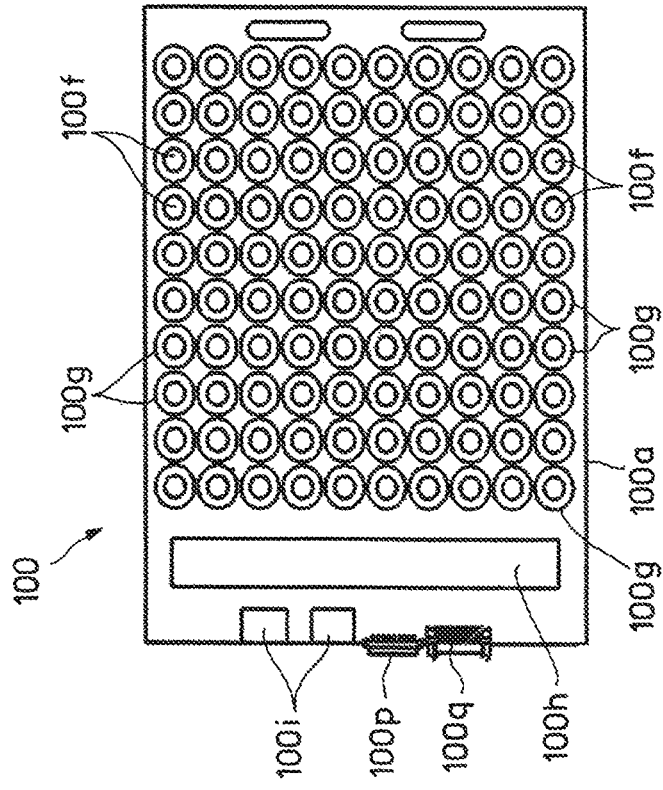
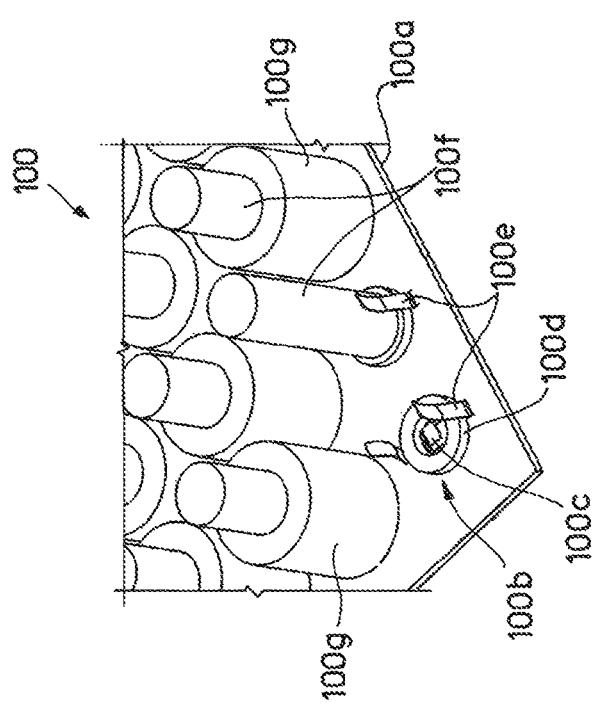
FIG. 34A
FIG. 34B
FIG. 34

SYSTEM FOR FORMING AND TESTING BATTERIES IN PARALLEL AND IN SERIES

CROSS-REFERENCE TO RELATED APPLICATIONS

This application claims priority to and the benefit of U.S. Provisional Patent Application Nos. 62/944,436, filed Dec. 6, 2019; 63/049,918, filed Jul. 9, 2020; and 63/053,647, filed Jul. 19, 2020.

BACKGROUND OF THE INVENTION

1. Field of the Invention

This patent application pertains to battery formation and testing, and more particularly to forming and testing batteries arranged in both a parallel configuration and a series configuration.

2. Description of the Related Art

Batteries are being used more and more frequently in people's daily lives. Batteries generally need to be tested before use to determine whether they are up to standard. Tests on batteries include control and measurement of current, voltage, internal resistance, capacity, overcharge and over discharge. Part of the battery production procedure includes final formation of and sorting of batteries. The present inventor's U.S. Pat. No. 6,291,972 is titled "System for Battery Formation, Charging, Discharging and Equalization," which teaches concepts for forming and testing batteries, and is incorporated by reference in its entirety for all purposes. Very large quantities of batteries are manufactured and need to be tested, so there is a need for faster and more-efficient testing.

SUMMARY OF THE INVENTION

One embodiment of the present invention provides a circuit assembly for forming and testing batteries that includes a battery testing system (BTS) having channels for testing multiple batteries simultaneously; a parallel test management device (PTMD) for each battery, where each PTMD connects to its respective battery serially to form a PTMD-battery combination. The PTMD includes a main relay or switch for connecting to a battery; a current transducer or shunt connected in series with the main relay; and an auxiliary relay connected in series with a current limiting resistor, where the auxiliary relay and the current limiting resistor are parallel to the main relay. Circuits connect PTMD-battery combinations in parallel to form parallel PTMD-battery groups and connect the parallel PTMD-battery groups to a BTS channel, which provides programmed current, voltage or power to the batteries. The current is distributed to each battery in a balanced manner.

One embodiment of the present invention provides a parallel test management device (PTMD) that attaches to a battery for forming and testing batteries. The PTMD includes a main relay or switch, which connects to a battery, a current transducer connected in series with the main relay, and an auxiliary relay is connected in series with a current limiting resistor, which are parallel to the main relay. The PTMD is capable of providing current switching, measurement of current and voltage, current limitation during pre-equalization and battery protection.

Another embodiment of the present invention provides a method for equalizing voltage between a plurality of batteries connected in parallel for formation and testing of the batteries. The method includes connecting a PTMD according to the present invention to each battery to form a PTMD-battery combination; connecting the PTMD-battery combinations in parallel to form a parallel PTMD-battery group; connecting a regulator to the parallel PTMD-battery-group, where the regulator provides a current and voltage source for charging and discharging the batteries; connecting a voltage equalizer to the parallel PTMD-battery group; connecting an equalizer power supply to the voltage equalizer; and passing current from the regulator and from the equalizer through the plurality of batteries simultaneously.

A further embodiment of the present invention provides a method for forming and testing a plurality of batteries connected in parallel and in series, which includes connecting a PTMD according to the present invention to each battery to form a PTMD-battery combination; connecting the PTMD-battery combinations in parallel to form a parallel battery group; connecting a plurality of parallel battery groups in series to form a parallel-serial battery group; connecting a voltage equalizer to each parallel battery group; connecting an equalizer power supply to the voltage equalizers; connecting a regulator to the parallel-serial battery group; and forming and/or testing the batteries by running current from the regulator and from the equalizer through the plurality of batteries simultaneously. Battery capacity and coulombic efficiency are preferably measured using both CCCV charge and CCCV discharge. The current through batteries is preferably about zero at the end of charge and discharge, and the voltage drop across the circuit resistance, such as copper trace, relay and current transducer, is preferably about zero at the end of charge and discharge. Another embodiment of the present invention is a Serial Test Management Device (STMD) for forming and testing a single battery. A current transducer is connected to one terminal of a battery. The STMD comprises a current transducer connected with a battery in series and an equalizer in parallel with the current transducer-battery series. A voltage equalizer is connected between the current transducer and the other terminal of the battery, thereby forming a circuit that includes the battery, the current transducer and the voltage equalizer. The STMD does not have PTMD, but does have a transducer/shunt in series with a battery and does have an equalizer connected with the series of shunt and battery.

A parallel serial test management device or PSTMD for forming and testing a plurality of batteries connected in parallel and in series is also provided by the present invention. The PSTMD includes a PTMD according to the present invention for connecting to a battery to form a PTMD-battery combination; and a parallel PTMD-battery group formed by connecting the PTMD-battery combinations in parallel. A series of parallel battery groups formed by connecting two or more parallel battery groups in series forms a parallel-serial battery group; a voltage equalizer connected to each parallel battery group; an equalizer power supply connected to the voltage equalizers; and a regulator connected to the parallel-serial battery group. Battery testing and formation are performed by running current from the regulator and from the equalizer through the plurality of batteries simultaneously.

A serial-parallel testing module (SPTM) for forming and testing a plurality of batteries is also provided by the present invention. The SPTM includes a circuit board for receiving and connecting to the plurality of batteries and for receiving electrical components and for providing circuits among the electrical components and between the electrical components and the batteries; a parallel test management device (PTMD) for each battery, wherein each PTMD connects to its respective battery serially to form a PTMD-battery combination, the PTMD comprising: a main relay or switch for connecting to a battery, wherein the main relay or switch is capable of isolating a battery that has a problem; a current transducer or shunt connected in series with the main relay, where the main relay is located between the battery and the current transducer, and where the current transducer or shunt is capable of measuring equalization current and all other current through a battery for precise measurement of and calculation of current and charge/discharge capacity through the battery; and an auxiliary relay connected in series with a current limiting resistor, where the auxiliary relay and the current limiting resistor are parallel to the main relay. Circuits are included for connecting PTMD-battery combinations in parallel to form parallel PTMD-battery groups and for connecting the parallel PTMD-battery groups to a BTS channel or to the regulator, where the BTS channel or the regulator provides programmed current, voltage or power, and wherein current is distributed to each battery in a balanced manner. A voltage equalizer is connected to the parallel PTMD-battery group, and an equalizer power supply is connected to the voltage equalizer. The BTS or the regulator and the voltage equalizer power supply are connected to power supply ports. The batteries are formed and tested by running current from the BTS or the regulator and from the equalizer through the plurality of batteries simultaneously.

In another embodiment, the present invention provides an integrated serial-parallel testing module (ISPTM) for forming and testing a plurality of batteries. The ISPTM includes: a circuit board for receiving and connecting to the plurality of batteries and for receiving electrical components and for providing circuits among the electrical components and between the electrical components and the batteries; connectors for connecting to the batteries, wherein the connectors are connected to the circuit board; a battery testing system (BTS) having a channel for testing multiple batteries simultaneously or a regulator for providing a current and voltage charge and discharge source; a parallel test management device (PTMD) for each battery, wherein each PTMD connects to its respective battery serially to form a PTMD-battery combination; circuits for connecting PTMD-battery combinations in parallel to form parallel PTMD-battery groups; a voltage equalizer connected to the parallel PTMD-battery groups; circuits for connecting the parallel PTMD-battery groups in series, thereby forming a parallel-serial battery group, wherein a voltage equalizer is connected to each parallel PTMD-battery group; an equalizer power supply connected to the voltage equalizer; and a power supply port for receiving an electrical current from an outside source, where the BTS and the voltage equalizer are connected to the power supply port, where a BTS channel is connected to the parallel-serial battery group, where the BTS provides a current and voltage source for charging and discharging the batteries, and where the batteries are formed and tested by running current from the BTS and from the equalizer through the plurality of batteries simultaneously. The PTMD includes: a main relay or switch for connecting to a battery, wherein the main relay or switch is capable of isolating a battery that has a problem; a current transducer or shunt connected in series with the main relay, and wherein the current transducer or shunt is capable of measuring equalization current and all other current through a battery for precise measurement of and calculation of current and charge/discharge capacity through the battery; and an auxiliary relay connected in series with a current limiting resistor, wherein the auxiliary relay and the current limiting resistor are parallel to the main relay.

The present invention provides in another embodiment an inductor module for a battery testing system that includes a modular box holding at least one or two distributed inductors, which comprise at least two or three individual inductors connected together in series. The distributed inductors are connected to a printed circuit board, which has a high-current socket for receiving current. The distributed inductors are preferably connected in series, and a fan is preferably included to pass air through the box. Typically, three distributed inductors are received in the box, each of which preferably comprises six inductors connected together in series, and an external connector is provided on the box for connecting to the distributed inductors.

The inductor module is used in a battery testing system or power supply system that includes a contactor for receiving electricity from a grid; a transformer connected to the contactor; the inductor module, which is connected to the transformer; and an inverter module connected to the inductor module. Preferably, the foregoing equipment is received in a cabinet that has a vertical printed circuit board, which preferably has high-current sockets on each side of the board into which modules can be plugged. A second inductor module is preferably received in the cabinet; and a DCDC module is preferably connected to the second inductor module and plugged into one of the high-current sockets on the PCB. The second inductor module is preferably fixed in the cabinet in a position that allows a person to plug the DCDC module into the second inductor module and into the high-current socket simultaneously. The battery testing system is preferably sized and designed to charge a plurality of batteries and to pass current to the grid while the batteries discharge.

The present invention also provides a high-current, double-polarity, edge-connector socket that comprises first and second outer isolators; first and second sheets of electrically-conductive material bent and cut to have a base portion and a plurality of spring fingers that extend from the base portion, where the base portions of the first and second sheets are between the first and second isolators; an inner isolator is between the base portions of the first and second sheets, where each of the first and second outer isolators, the first and second sheets and the inner isolator have a hole, preferably two; and a rivet, a screw or a bolt is passed through the hole in all of the foregoing components for fastening the components together. The spring fingers on the first sheet contact the spring fingers on the second sheet for allowing current to flow through the spring fingers, but the base portions of the first and second sheets are isolated from each other so that current can only flow from one set of spring fingers to the other set of spring fingers, thereby providing double-polarity capability for the edge-connector socket. An edge connector on a printed circuit board can be pushed in between the two sets of spring fingers, thereby allowing a positive direct current to flow into one side of the edge connector through one set of spring fingers and negative direct current to flow out of the other side of the edge connector into the other set of spring fingers.

Another embodiment of the present invention is a smart battery tray for holding a plurality of batteries during formation and testing of the batteries, which comprises: a printed circuit board (PCB) having opposing upper and lower sides and an edge; a plurality of battery holders on the upper side of the PCB; electronic devices or components operatively engaged with the plurality of battery holders through traces on or in the PCB for measuring parameters of the batteries during formation and testing; and an edge connector on the edge of the PCB, where the edge connector is operatively engaged with the plurality of battery holders and with the electronic devices or components through traces on or in the PCB. Preferably, each battery holder has two or more upright spring fingers for holding and engaging a battery, which also function as a negative terminal, and a positive terminal for contact with one end of a battery. The edge connector preferably has first and second opposing sides, with each positive terminal connected to the first side, and each negative terminal is connected to the second side. Batteries are preferably received in the battery holders in an upright position with the lower end of the battery touching the positive terminal and with the spring fingers touching the cylindrical case of the battery, which is the negative terminal.

The present invention provides a battery formation rack in another embodiment, which comprises: a cabinet having front, back, left and right sides and a plurality of pairs of guide rails, where one of each pair of guide rails is received in the cabinet of the left side and the other is received in the cabinet on the right side; a double-sided printed circuit board (PCB) received in the cabinet in a vertical orientation and dividing the cabinet into a front portion and a back portion; a plurality of double-polarity, high-current edge-connector sockets on the PCB designed, sized and located to receive an edge connector on a battery tray received in a pair of guide rails in the front portion of the cabinet; and a control, measurement and equalizer (CME) module in the back portion of the cabinet for each pair of guide rails, wherein the PCB has an opening or a connector so that the battery tray can also connect to its respective CME module. The battery formation rack preferably receives a smart battery tray, such as described above, in each pair of guide rails, where the edge connector on the battery tray is plugged into the edge-connector socket. The cabinet can also be used as a battery aging rack by eliminating the PCB with the edge-connector socket and by substituting a measurement module for the CME module, where the measurement module can be used to monitor various parameters of a battery as it ages for a desired amount of time. The battery trays can be moved from the formation rack, after the batteries have been formed and tested, to the battery aging rack for periodically measuring the voltage of each battery, such as to check for an unusual decline in charge.

The present invention provides a battery formation and testing system in another embodiment, which comprises: a power supply having a plurality of channels, wherein each channel is designed and sized to provide an output of over 20 volts, of over 25 amps and of over 500 watts, preferably of over 100 volts, of over 1000 amps and of over 100,000 watts; and a battery formation rack for each of the plurality of channels, where each battery formation rack is operatively connected to its respective channel. A battery formation rack comprises: a cabinet having front, back, left and right sides and a plurality of pairs of guide rails, where one of each pair of guide rails is received in the cabinet of the left side and the other is received in the cabinet on the right side; a double-sided printed circuit board (PCB) received in the cabinet in a vertical orientation and dividing the cabinet into a front portion and a back portion; a plurality of double-polarity, high-current edge-connector sockets on the PCB designed, sized and located to receive an edge connector on a battery tray received in a pair of guide rails in the front portion of the cabinet; and a control, measurement and equalizer (CME) module in the back portion of the cabinet for each pair of guide rails, wherein the PCB has an opening or a connector so that the battery tray can also connect to its respective CME module.

The battery formation and testing system uses serial-parallel technology disclosed herein for forming and testing a plurality of batteries. The plurality of batteries are preferably on a smart battery tray such as described above, which is received in one of the pairs of guide rails and plugged into an edge-connector socket. Preferably, only four wires are required between the power supply channel and the battery formation rack for forming and testing a plurality of batteries, preferably over 100 batteries, more preferably over 500 batteries and typically over 1,000 batteries. The power supply or battery testing system preferably includes contactors, transformers, inductor modules, inverter modules and DCDC modules connected together or through sockets on a vertical, double-sided printed circuit board, such as was described above.

The battery formation and testing system preferably includes a serial-parallel testing module (SPTM) for providing control, measurement and safety monitoring for the batteries as the batteries are formed and tested, where the SPTM comprises a printed circuit board, an edge connector on the board for plugging into one of the edge-connector sockets, electronic devices and components on the board that provide control and measurement functions; and a plurality of battery connectors connected to the board, where the SPTM is designed to accommodate a plurality of batteries that are connected together in series and in parallel for forming and testing the batteries, wherein the power supply system preferably provides direct current having a positive polarity to one side of the edge connector on the board and receives direct current having a negative polarity from the other side.

The serial-parallel testing module (SPTM) immediately above preferably includes a parallel test management device (PTMD) for each battery, which comprises: a main relay or switch for connecting to a battery; a current transducer or shunt connected in series with the main relay; and an auxiliary relay connected in series with a current limiting resistor, where the auxiliary relay and the current limiting resistor are parallel to the main relay, and where the PTMD is capable of providing current switching, measurement of current and voltage, current limitation during pre-equalization and battery protection.

The present invention provides in one embodiment a method for forming and testing over 500 batteries simultaneous, preferably over 1,000 batteries, which are arranged in parallel and in series as taught herein, by loading batteries into smart battery trays that include the printed circuit board, the battery holders, the control and measurement, the edge connector, the SPTM and the PTMD disclosed herein; loading the smart battery trays into the battery formation rack disclosed herein; providing a battery testing system such as described with reference to FIG. 22 herein; connecting the battery testing system to the battery formation rack; charging and discharging the batteries to form and test the batteries; and then moving the smart battery trays to a battery aging rack for periodic voltage measurements for a period of time.

BRIEF DESCRIPTION OF THE DRAWINGS

FIG. 1 is a block diagram showing a battery testing system (BTS) for one channel for testing one battery, as used in the prior art.

FIG. 2 is a block diagram showing batteries connected in parallel for simple formation, as used in the prior art.

FIG. 3 is a block diagram showing batteries connected in series for simple formation, as used in the prior art.

FIG. 28 is a side elevation in cross-section of an electrical assembly that includes a double-sided printed circuit board and four of the edge-connector sockets of FIG. 24, according to the present invention.

FIG. 29 is a side elevation of a serial-parallel testing module for forming and testing batteries, according to the present invention.

FIG. 30 is a top plan view of the serial-parallel testing module of FIG. 29.

FIG. 32A is a side elevation of the battery tray of FIG. 32.

FIG. 34 is a partial perspective view of a battery tray, according to the present invention.

FIG. 34A is a top plan view of the battery tray of FIG. 34.

FIG. 34B is a side elevation of the battery tray of FIG. 34A.

TERMINOLOGY USED HEREIN

A C-rate is a measure of the rate at which a battery is charged or discharged relative to its maximum capacity. A 1 C rate means that the discharge current will fully discharge the fully charged battery in 1 hour, and 2 C rate means that the discharge current will fully discharge the fully charged battery in ½ hour. For example, when the capacity of a battery is 2 Ah (AmpHour), 1 C rate current is 2 Amp, and 0.05 C rate is equal to 0.1 Amp.

CCCV represents a procedure that starts with constant current control and when the battery voltage reaches to a set voltage, transfer to constant voltage control and keep the voltage at the set voltage. CC stands for Constant Current and CV stands for Constant Voltage.

Battery: the meaning of battery here includes single cell and battery pack. A battery pack may have only 2 current terminals outside but may have a complicated structure inside such as multiple cells in parallel and serial arrangement and a battery management system.

Battery Management System or BMS is device to manage a battery pack, such as equalizing cells, checking battery health status, checking state of charge, safety protection and communications. According to complexity level, most battery pack have some kind of BMS.

Battery Testing System or BTS refers to a category of electrical equipment, which apply different forms of charge/discharge current/voltage to a battery or batteries to study or characterize the battery or batteries, including formation of the battery or batteries. A commercial BTS is usually composed of one or multiple channels. Each BTS channel can perform the above functions independently and completely.

A BTS channel is specified by output capability, including current, voltage and power. FIG. 1 is a block diagram of a BTS for one channel to test one battery.

Battery formation is a process for performing an initial charge/discharge operation onto a raw battery cell. A cell's capacity and internal resistance is typically measured. A cell-sorting process is typically used to sort cells according to a cell's capacity and internal resistance.

State of Charge or SOC is a level of charge of an electric battery relative to its maximum capacity. SOC is expressed as a percentage of maximum capacity.

Figure 6:
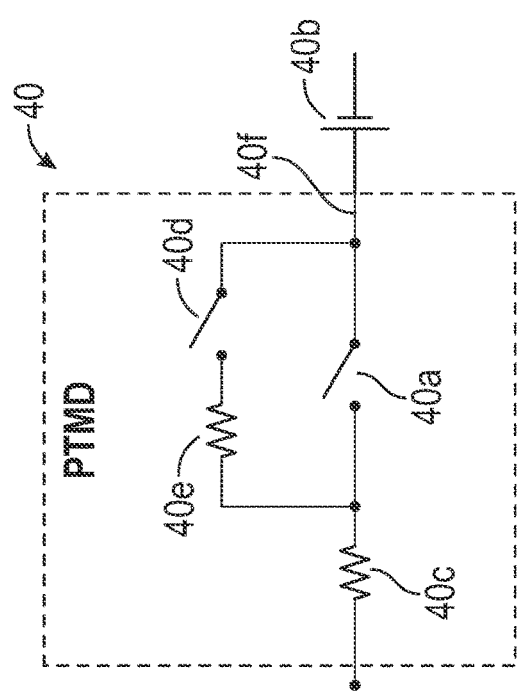
FIG. 6 is a block diagram of a parallel test management device or PTMD, which is used in the present invention.

A Parallel Test Management Device or PTMD refers to a device that connects to a battery or to a group of batteries that are arranged in parallel, where the batteries in the group connect to each other in parallel through the PTMD. Functions of a PTMD include current measurement, voltage pre-equalizing, current switching and other functions. FIG. 6 is a block diagram of a Parallel Test Management Device or PTMD.

Figure 7:
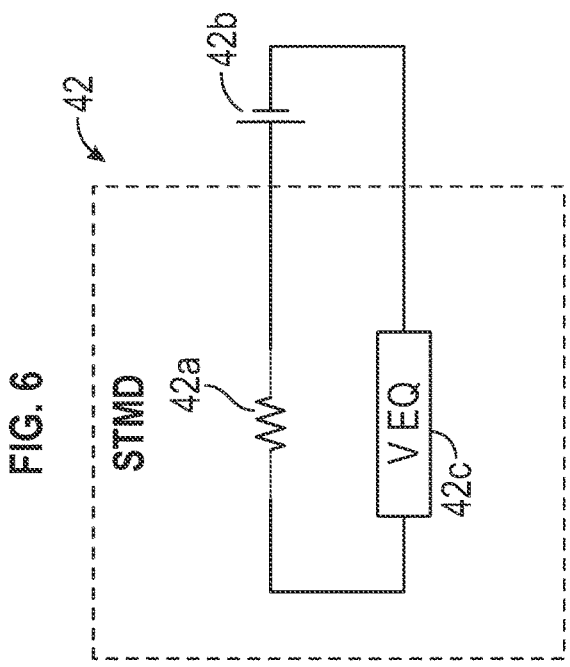
FIG. 7 is a block diagram of a serial test management device or STMD, which is used in the present invention.

A Serial Test Management Device or STMD equalizes voltage and measures current for each single battery in a serial connection. An STMD does not have a current switch. FIG. 7 is a block diagram of a Serial Test Management Device or STMD.

Figure 8:
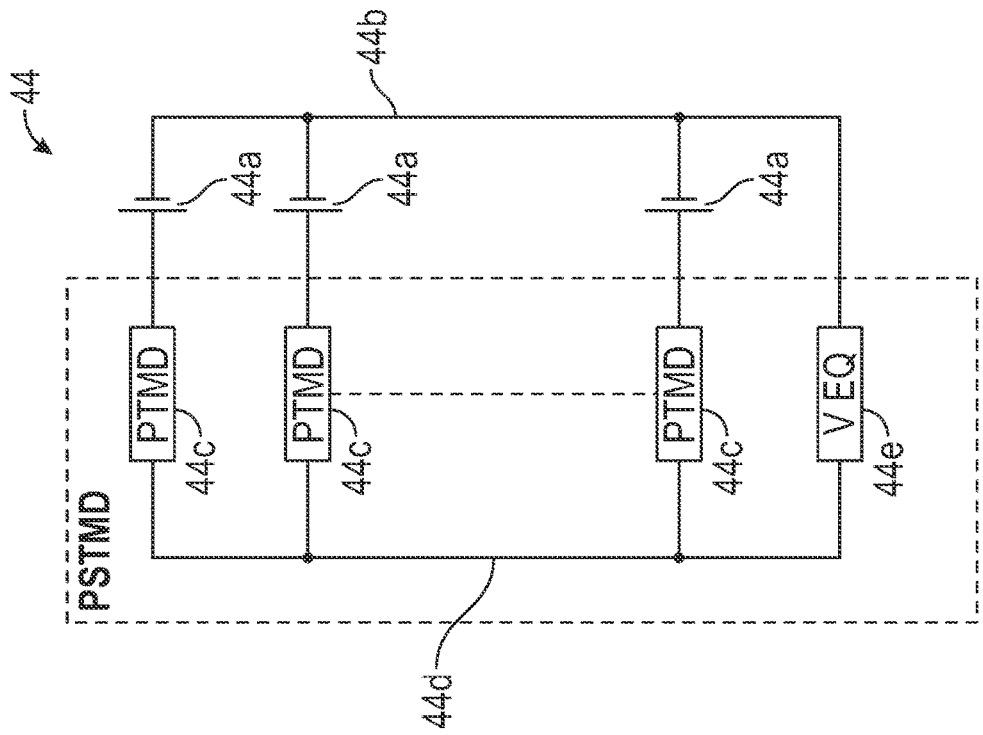
FIG. 8 is a block diagram of a parallel-serial test management device or PSTMD, which is used in the present invention.

A Parallel Serial Test Management Device or PSTMD is a combination of PTMD and STMD, which is used to manage batteries in parallel and serial arrangement. FIG. 8 is a block diagram of a Parallel Serial Test Management Device or PSTMD.

A Voltage Equalizer is used in a battery pack to equalize the voltage across all of the batteries in the battery pack. The voltage equalizer gets energy from the battery pack or from adjacent batteries. U.S. Patent Application Pub. No. 20110062917 A1 by Shiu et al. discloses a battery voltage equalizer circuit for a battery pack and is incorporated by reference. U.S. Pat. No. 6,437,539, issued to Olsson et al., discloses a method and a device for balancing the charges of a plurality of series-connected battery cells using a current dissipative loop connected across the terminals of each battery cell and is incorporated by reference. As discussed below, a voltage equalizer according to the present invention is used in battery formation and testing, and it takes energy from a dedicated equalization power supply and provides equalization at a much higher level of accuracy than a voltage equalizer for a battery pack.

A Parallel Testing/Formation Module or PTFM does not have a BTS channel, but has a battery connector and a battery holding section.

A Serial Testing/Formation Module or STFM does not have a BTS channel, but has a battery connector and a battery holding section.

A Parallel-Serial Testing/Formation Module or PSTFM does not have a BTS channel, but has a battery connector and a battery holding section.

An Integrated Parallel Testing/Formation Module or IPTFM has a BTS channel, a battery connector and a battery holding section.

An Integrated Serial Testing/Formation Module or ISTFM has a BTS channel, a battery connector and a battery holding section.

An Integrated Parallel-Serial Testing/Formation Module or IPSTFM has a BTS channel, a battery connector and a battery holding section.

A Serial-Parallel Technology Module or SPTM represents all of the above non-integrated modules of PTFM, STFM and PSTFM.

An Integrated Serial-Parallel Technology Module or ISPTM represents all of the above integrated modules of IPTFM, ISTFM and IPSTFM

BRIEF DESCRIPTION OF THE PRIOR ART

A simple parallel or serial mode has been used in a starting stage for primitive battery formation. However, this prior art practice does not provide comprehensive functions such as precise measurement of flow through current/capacity and over current protection for each battery. There are no sorting function and no cutoff function and pre-equalization function for each battery in a parallel group. This simple parallel or serial connection can only be applied under the condition that the batteries are very consistent with each other and without risk of shortage.

FIG. 1 is a block diagram showing a battery testing system (BTS) 10 for one channel for testing one battery 12 to 12n, as used in the prior art. A current/voltage charge/discharge regulator channel 14 to channel 14n is connected to each battery 12 to 12n, respectively, through a printed circuit board (PCB) 16 and wires between PCB 16 and each battery 12 to 12n. A microcontroller and control/measurement system 18 is connected to the regulator channel 14 to 14n through the PCB 16. An AC/DC power supply 20 provides current and voltage for forming and testing the batteries 12 to 12n. The symbols I+ and I− represent a current output terminal, and the symbols V+ and V− represent a voltage measuring terminal or a voltage signal. Test equipment according to the present invention has functionality that is similar to a one BTS channel to one battery configuration, but can be used for forming and testing a plurality of batteries. When used in battery formation, the inventive test equipment can provide information that is necessary for sorting batteries, such as by capacity and internal resistance.

FIG. 2 is a block diagram showing batteries 22a and 22b through 22n connected in parallel for simple formation, as used in the prior art. A current/voltage charge/discharge regulator channel 24 is connected to opposing terminals of the batteries 22 in a parallel configuration. The regulator 24 provides a source of current to the batteries 22, which can be used for charging the batteries 22 and for monitoring, measuring and controlling a charge and a discharge of the batteries. Each battery symbol represents a single battery.

FIG. 3 is a block diagram showing batteries 26a and 26b through 26n connected in series for simple formation, as used in the prior art. Each battery symbol represents a single battery or a plurality of batteries connected in series. A regulator 28 is connected to a terminal of a first battery 26a in the series and to an opposing terminal in a last battery 26n in the series. The regulator 28 provides a source of current to the batteries, which can be used for charging the batteries 26 and for monitoring, measuring and controlling a charge and a discharge of the batteries.

Figure 4:
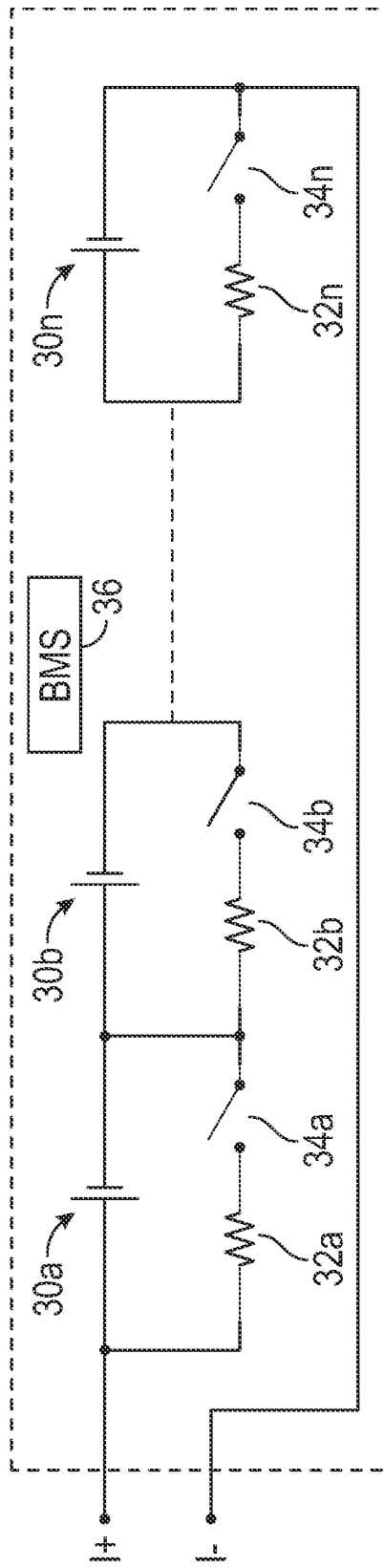
FIG. 4 is a block diagram showing batteries connected in series and using a simple passive voltage equalizer, as used in the prior art.

FIG. 4 is a block diagram showing batteries 30a, 30b to 30n connected in series and using a simple passive voltage equalizer, as used in a prior art battery pack. A resistor 32a, 32b to 32n and a switch 34a, 34b to 43n are connected in parallel to each battery 30a, 30b to 30n, respectively, and are used to control the discharge for each battery for voltage equalization. The equalization may not be carried out all of the time, and the efficiency is low. The batteries 30a, 30b to 30n operate as a single battery. A battery management system 36 is provided for monitoring the batteries. The system of FIG. 4 has been used in a battery pack that is used to provide current to an energy-consuming device, but possibly not for formation and testing of batteries.

Figure 5:
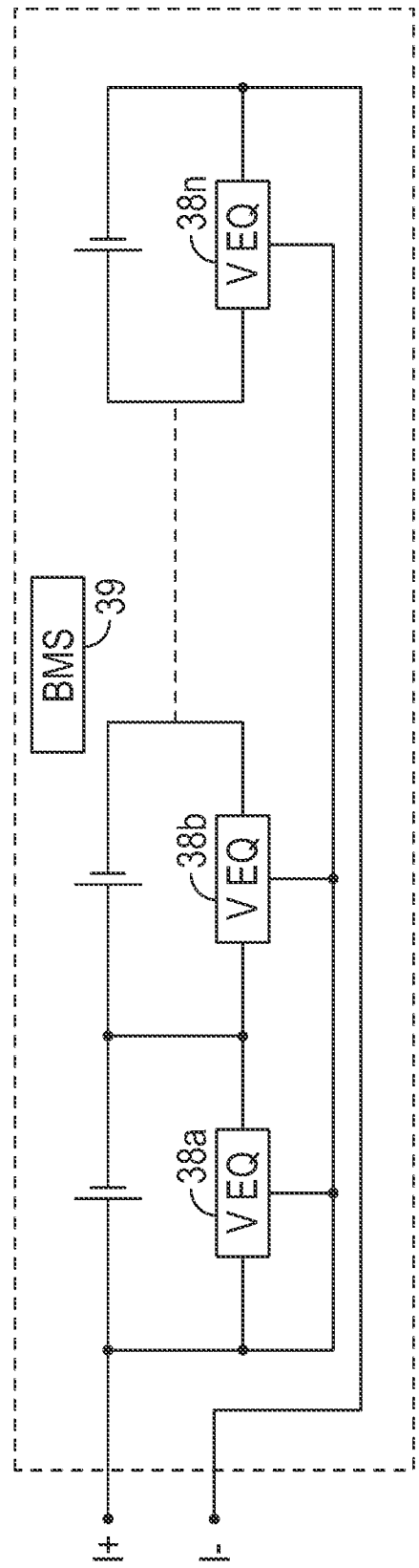
FIG. 5 is a block diagram showing batteries connected in series to form a battery pack and using a more complicated active voltage equalizer, as used in the prior art.

FIG. 5 is a block diagram showing batteries connected in series to form a battery pack and using a more complicated active voltage equalizer, as used in the prior art. This system uses energy from the battery pack or from an adjacent battery to control the charge and discharge for each battery for equalizing voltage across all of the batteries. One of a voltage equalizer 38a, 38b to 38n is connected in parallel to each battery. Rather than have a separate and independent current source, the voltage equalizer 38 draws current from adjacent batteries or from the battery pack. The equalization may not be carried out all of the time, and voltage may swing wildly among the batteries. The battery symbol may represent a group of batteries connected in parallel. A battery management system 39 is provided for monitoring the batteries. The system of FIG. 5 has been used in a battery pack that is used to provide current to an energy-consuming device, but possibly not for formation and testing of batteries.

The present inventor's U.S. Pat. No. 6,291,972, titled "System for Battery Formation, Charging, Discharging and Equalization," is incorporated by reference and states the following in part in its summary. The '972 patent discloses a system for the formation of secondary batteries, such as lithium ion and lithium-polymer cells. The system provides for equalization of each of a number of the battery cells connected in series. Each independent circuit supplements the bulk formation charge of 1 to 5 Amperes with a small equalization current (µA to mA) to normalize the terminal voltage and, hence, the conditions of all cells. No complex external circuitry is required, as a small power supply for each cell position will suffice. The control circuit is simplified further by the generation of a single voltage profile applied only to the first cell in the string or to the whole string. The term "voltage profile" refers to the voltage as viewed over time. This method of control is called "polarization control" and eliminates the need for a separate current regulator for each cell and is universal for cells of any size of a specific chemistry. The profile is simply repeated for every cell in the series and ensures that every position is voltage-equalized. The equalizer connected to each cell is a bipolar potentiostat, which can be used during discharge as well as charging processes.

The '972 patent also discloses a parallel aggregate of cells connected in series, which eliminates the need for current regulation for each cell. Each parallel-grouped cell is equipped with a current-limiting device that protects the entire system against excessive current drains from a particularly weak, poor or bad cell. This arrangement provides a mechanism for self-equalization of the cells configured in this way. Cells in parallel are governed by the same voltage profile, and each cell draws current from a voltage-regulating power supply according to its state of health. In some cases, cells may discharge a slight current to the bipolar power supply. However, since the power supply is a bipolar potentiostat, only one assemblage of electrical connections is needed for each cell. Cells may be charged individually or in strings. The same equalizer circuitry and polarization control methodology can be used for charging as is used with the formation system.

DETAILED DESCRIPTION OF THE EXEMPLARY EMBODIMENTS

The present invention provides a system and method for connecting multiple batteries in parallel and/or in series to perform tests and for formation of the batteries, where the batteries may actually be a plurality of batteries connected in series or in a combination of series and parallel, provided the plurality of batteries perform the same as an individual battery. As an electrochemical process, it is in principle a voltage control process with current self-balancing (adjustment), which is more suitable for the natural characteristics of a battery. Batteries have been formed and tested in the past using the principle of accurate current control. Due to the electrochemical nature of a battery, its voltage is a significant parameter for indicating the health, capability and status of a battery. The present invention uses a voltage-control process with current self-balancing or adjustment, which is more suitable for the natural characteristics of a battery than current control. The present invention provides a battery formation and testing scheme as follows: connect multiple batteries in parallel and/or serial mode; equalize the voltage of all of the batteries; and naturally distribute and/or fine tune a current through the batteries. A system for forming and testing batteries according to the present invention applies complete and precise voltage control and equalizes the voltage among all of the batteries being formed and tested. It is believed that this is the same or better than precisely controlling both current and/or voltage. The present invention enables one to use only one BTS channel to test tens, hundreds or more batteries simultaneously and precisely with high efficiency, high quality and low cost.

When batteries with each having a different SOC/voltage are connected in parallel, a battery with a higher voltage will charge other batteries until the current flow between batteries reaches zero, which results in all of the batteries having the same SOC. Paralleling batteries will force batteries to have the same voltage. When applying current to batteries that are connected in parallel and have the same specifications, the current flow through each battery will be evenly distributed, provided the batteries have the same health status and the same real capacity, or the current will be distributed according to real capacity and health status automatically. A battery formation and testing scheme according to the present invention does not force current distribution between batteries and does not control current flow through a battery at a predefined value while the batteries are in a parallel configuration for testing. When the batteries have the same specifications and health status, the current through each battery will be roughly the same with a slight difference determined by differences in capacity and health status. The current through each battery will be proportional to a battery's real capacity. All batteries in a parallel group are forced to have the same voltage by the nature of paralleling, and one can say that the batteries are actually under voltage control instead of under current control.

The present invention also applies to testing batteries in series. When batteries are connected in series, in CC mode, a BTS channel applies current defined by CC (or CC*N when N batteries are connected in parallel). In CV mode, a BTS channel also applies current to enable an equalizer to fine tune each battery (or each parallel group of batteries) to reach a defined voltage value. The current through each battery cell is the sum of current from the BTS channel plus current from the equalizer. In serial testing according to the present invention, all batteries are controlled to have the same voltage, but the current through each battery will most likely be slightly different. Batteries will be unlikely to have exactly the same current while connected in series with testing according to the present invention.

One embodiment of the present invention is to apply conditional parallel, serial or parallel-serial connections to multiple batteries and use one BTS channel to test the batteries simultaneously with high precision. Precise voltage control can be applied directly or indirectly to each battery, and all batteries will have approximately the same voltage. Current flow will be automatically distributed and/or fine-tuned. Testing time for all batteries will be synchronized and will have the same test time. A test schedule for a large group of batteries can be almost the same as for testing a single battery. A current or a voltage value can be defined the same as for a single battery. A BTS channel current output is calculated as a current through a single battery times the number of groups of batteries arranged in parallel. The current through each battery is not controlled precisely, but it is measured precisely. The voltage across each battery is controlled precisely and measured precisely. In this embodiment of the present invention, each battery is connected to a current transducer serially to measure the current flow through the battery, which can be used to determine the capacity of the battery. The voltage drop across the current transducer and circuit resistance may cause a slight voltage difference of battery voltage while there is current flowing through the battery.

Another embodiment of the present invention is a method comprising measuring battery capacity and coulombic efficiency using both CCCV charge and CCCV discharge so that at end of charge and discharge the current reaches to close to zero, and the voltage drop across a circuit resistance, such as a relay and a shunt, reaches to close to zero; and hence, the voltage and the SOC of all batteries are highly consistent. This method is better than a traditional method of CCCV charge and CC discharge, especially in parallel-serial battery testing.

In a battery pack or in a simple battery formation system, there will generally be some current flow between batteries in parallel mode. Healthier batteries will charge weaker batteries with higher leakage current to keep the same voltage. In a battery formation system according to the present invention, before testing or pre-equalizing is started, all batteries can be virtually isolated without any current flow between the batteries. It is possible to do pre-equalization for all the batteries before starting a test. This pre-equalization procedure can also be used to determine if some batteries are bad so that any bad batteries can be replaced before beginning testing. Multiple batteries can be connected in parallel to form a group, and multiple groups can be connected in series. This enables a BTS channel to test many more batteries, thereby providing higher efficiency and easier and more efficient production while lowering the cost of production. Many batteries can be tested with only one BTS channel with functionality and quality as good as in testing according to the prior art, while providing higher efficiency, simplicity and convenience at a lower cost.

The present invention is directed to battery testing and is for charging and formation of batteries. The system of the present invention can also be applied to testing other energy storage devices, such as super capacitors. A serial-parallel testing module or SPTM and an integrated serial-parallel testing module or ISPTM are test modules designed with this technology. They are highly integrated, precise, very simple and convenient to use. SPTM and ISPTM modules and a temperature chamber can be made so that the modules are placed in the temperature chamber such that the battery section is located inside the temperature chamber while locating temperature-sensitive electronic components outside the temperature chamber. The SPTM and ISPTM modules and the temperature chamber are discussed in more detail below with reference to FIGS. 17 and 18.

An equalizer according to the present invention uses a dedicated, bidirectional power source for equalization instead of getting energy from a charge/discharge power terminal or from batteries that are under test, which were used in the prior art. Voltage is preferably controlled at a precision of better than 0.1% of full voltage range. The equalizer is preferably coordinated with a main charge/discharge channel all of the time. The equalizer can provide and realize CC, CV and CCCV functions without affecting smoothness during a transition from CC to CV. The current requirement for the equalizer is roughly less than one tenth of the current required for testing a battery or a parallel-battery group. The equalizer is preferably isolated electrically from a power supply for the equalizer by a DC-to-DC converter, which is preferably isolated and bidirectional. The equalizer preferably provides programmable, precise voltage control over a wide range. The equalizer according to the present invention preferably provides tight voltage control and can preferably be used to test many batteries in a series configuration. The equalizer is preferably bidirectional. The equalizer has a simple and compact structure, which can be made at a low cost. The equalizer can use a switching mode, which preferably has high energy efficiency. The equalizer operates concurrently with the charge/discharge of the batteries.

The present invention preferably provides a bidirectional current regulation function and uses switching-mode technology to adjust voltage/current so the accumulated equalizer current reaches a value close to zero. This technology for the process of equalization allows energy compensation between batteries, which increases energy efficiency.

A BTS channel provides a main charge and discharge current. A voltage equalizer provides fine tuning current so that all batteries are under the same voltage. In a current-control process, an equalizer voltage is adjusted to a target for an accumulated equalizer current to reach a value close to zero. In a constant-voltage-control process, the voltage of an equalizer is set to a desired value, and the current of a BTS channel is adjusted to a target for an accumulated equalizer current to reach a value close to zero.

FIG. 6 is a block diagram of a parallel test management device or PTMD 40. A main relay or switch 40a is connected to a battery 40b, and a current transducer or shunt 40c is connected in series with the main relay 40a. An auxiliary relay or switch 40d and a current limiting resistor 40e are connected in series and are arranged in parallel to the main relay 40a. One end of the auxiliary relay 40d connects to a connector 40f between the battery 40b and the main relay 40a. The other end of the auxiliary relay 40d connects to the current limiting resistor 40e. One end of the current limiting resistor 40e connects to the auxiliary relay 40d, and the other end connects to the other end of the main relay 40a. For forming and testing a group of batteries according to one embodiment of the present invention, each and every battery in a parallel group connects to a PTMD first and then connects to a bus for the parallel group, which is explained further with reference to FIGS. 8-10 below. Preferably, multiple batteries connect in parallel through a PTMD and then connect to a BTS channel or charge/discharge current/voltage source for balanced charge/discharge testing of all batteries, including control and measurement of current/voltage/capacity and battery/circuit protection. The PTMD 40 can also be used in performing an original charge/discharge and later in a sorting process in battery formation.

The main function of the main relay 40a is: (1) cut off direct connection between batteries in a parallel group so that they can undergo pre-equalization through a current-limiting circuit and then turn on the main relay to complete the equalization before formal testing; (2) cut off and isolate a problematic battery during a test, such as a shorted battery; and (3) enable automatic current calibration one by one for the current transducer 40c of a PTMD. The current transducer 40c is preferably included to measure current precisely for each and every battery. The current transducer 40c preferably uses a shunt for measuring a small current and a Hall-effect component for measuring a large current. The voltage of each and every battery is also preferably measured for testing batteries and for safety such as for preventing the explosion of a battery.

FIG. 6 shows a current-limiting circuit in parallel to the main relay 40a of the PTMD 40, which includes the current limiting resistor 40e and the auxiliary relay 40d connected in series. The current-limiting circuit is used for controlled pre-equalization before testing to prevent damage from over current between severely unbalanced batteries. The limiting current may be set to about 0.01 C to about 0.05 C rate. After pre-equalization, the main relay 40a will connect all paralleled batteries (still through the current transducer 40c) and complete equalization before testing, at which time all current between batteries should be close to zero.

FIG. 7 is a block diagram of a serial test management device or STMD 42. A current transducer 42a is connected to one terminal of a battery 42b. A voltage equalizer 42c is connected between the current transducer 42a and the other terminal of the battery 42b, thereby forming a circuit that includes the battery 42b, the current transducer 42a and the voltage equalizer 42c.

FIG. 8 is a block diagram of a parallel-serial test management device or PSTMD 44. Multiple batteries 44a are connected in parallel such that one terminal of the batteries connect to a common battery bus 44b. Batteries 44a are not a defined number of batteries. A PTMD 44c is connected to each battery 44a such that one end of each PTMD 44c connects to a battery 44a, and the other end of each PTMD 44c connects to a common PTMD bus 44d. One terminal of a voltage equalizer 44e connects to the PTMD bus 44d, and the other terminal of the voltage equalizer 44e connects to the battery bus 44b. The batteries shown in FIGS. 6-8 can be a single battery, multiple batteries connected in series, multiple batteries connected in parallel or a combination of multiple batteries connected in both parallel and series. One PTMD is preferably included for each battery.

Figure 9:
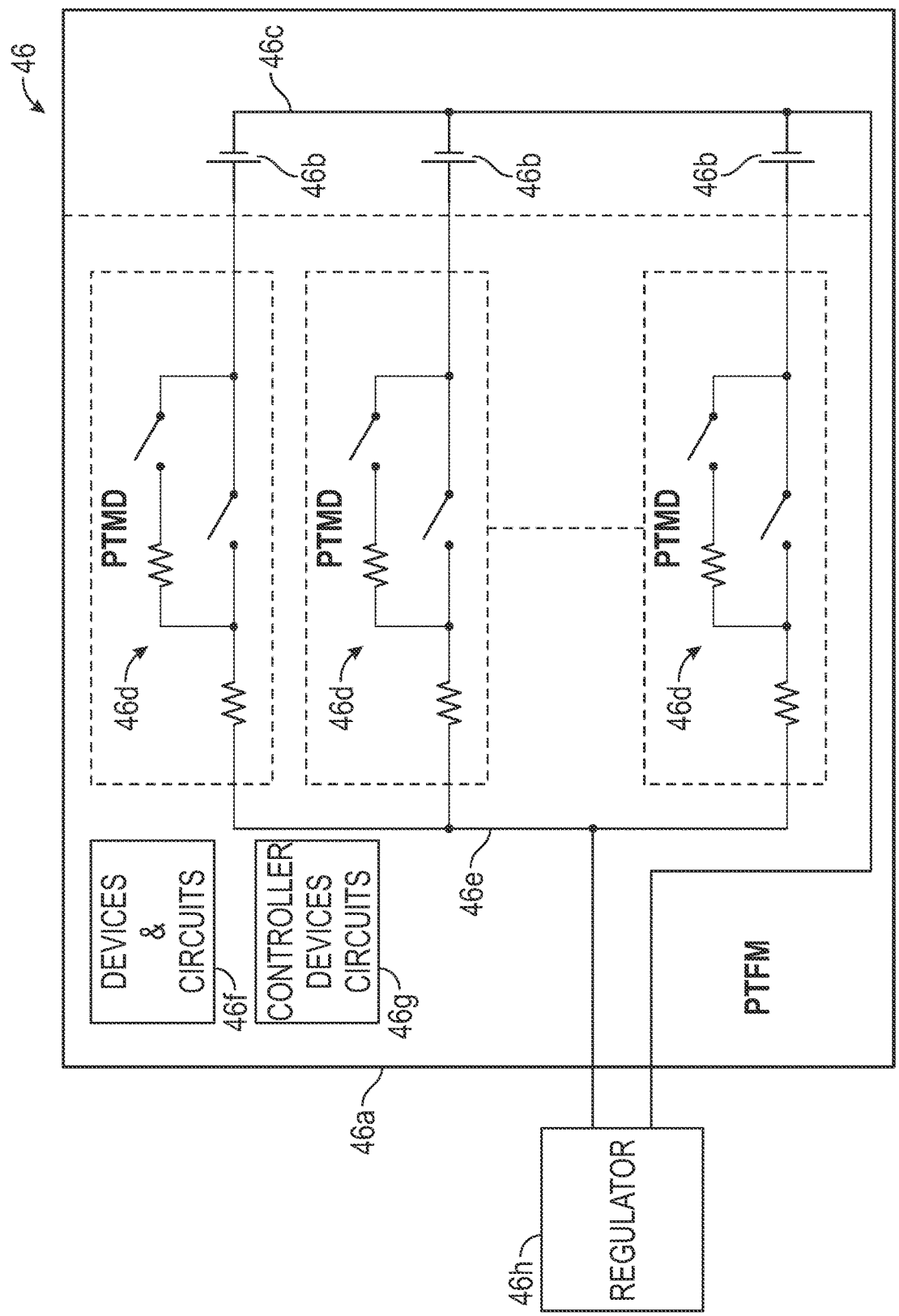
FIG. 9 is a block diagram of a conditional parallel testing module or PTFM, according to the present invention.

FIG. 9 is a block diagram of a conditional parallel testing module 46, which is referred to as a PTFM. An outer box represents a module 46a, which comprises a printed circuit board (PCB). Batteries 46b are received on or in the module. In one embodiment, an individual battery is inserted into a battery holder, which is then electrically connected to a battery tray, which is electrically connected to the PCB. One terminal of each battery 46b is preferably connected to a bus bar 46c, which is preferably on the PCB. The other terminal of each battery 46b is preferably connected to one terminal of an individual and separate PTMD 46d, which was described with reference to FIG. 6. The other terminal of each PTMD 46d is preferably connected to a PTMD bus 46e, which is preferably on the PCB. Electronic devices and circuitry 46f are included on the PCB or in the module 46a for control of the PTMD 46d and for measuring various parameters such as current at certain points and voltage across certain locations. A microcontroller, electronic devices and circuits 46g are included on the PCB or in the module 46a for controlling the PTMD 46d, such as for closing and opening the main and auxiliary relays. A regulator 46h is connected to the PCB and/or the module 46a for forming and testing batteries. The regulator 46h provides a source of current to the module 46a and the PCB, which can be used for charging and discharging the batteries. In all PCB modules, a separate control power supply (not shown) provides power for circuits of monitoring, measuring and controlling the charge and a discharge of the batteries. The regulator 46h and the module 46a illustrated in FIG. 9 can be used to complete the formation of batteries and to test the batteries. Data collected during the formation and testing of the batteries can be used to sort batteries according to capacity and parameters indicating the health and capability of the batteries.

Figure 10:
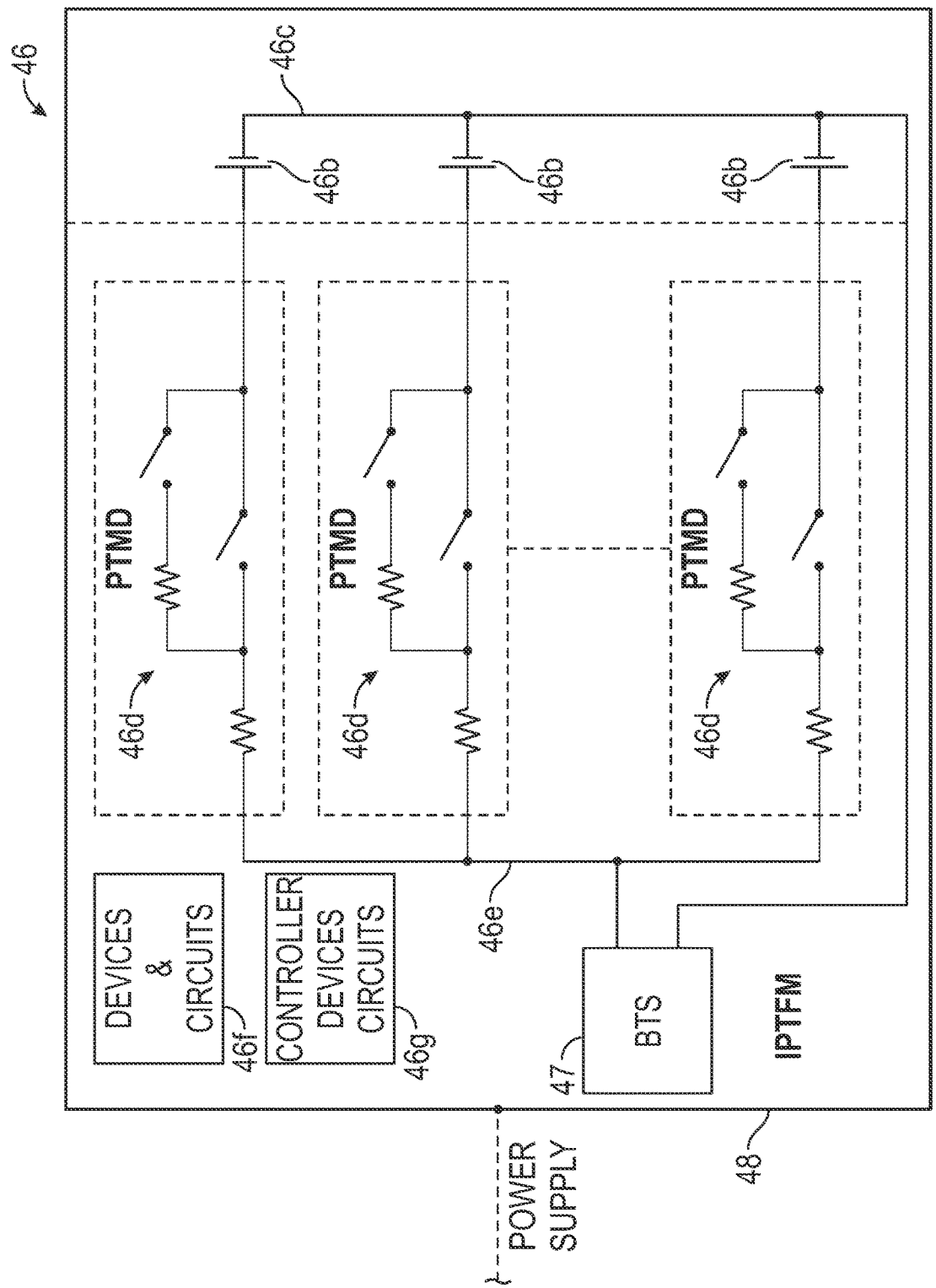
FIG. 10 is a block diagram of a conditional parallel testing module with an integrated BTS channel or IPTFM, according to the present invention.

FIG. 10 is a block diagram showing the conditional parallel testing module 46 of FIG. 9 and a battery testing system 47 integrated into a module and possibly onto a PCB, thereby representing a conditional parallel testing module 46 with an integrated BT 47, which is referred to herein as an IPTFM 48. FIG. 1 shows a battery testing system (a BTS) having a regulator for each battery. The BTS 47 of FIG. 10 has only one regulator, which is connected to a plurality of batteries. The BTS 47 of FIG. 10 is connected to the PTMD bus 46e and to the battery bus 46c. The BTS 47 of FIG. 10 provides a current source for charging and discharging all of the batteries. The FIG. 10 module 48 has the capability to charge, discharge, test, measure, control and regulate the formation and testing of a plurality of batteries, which may be electrically connected in parallel. FIGS. 9 and 10 are simplified schematics of complex circuits having many electronic devices for current and voltage measurement and control. The batteries are shown as individual batteries connected in parallel, but these battery symbols may represent a plurality of batteries arranged in parallel, in series or in a combination of parallel and series connections. The number of PTMDs range from 1 to n, and a plurality of batteries can be included in each battery symbol, so there is no theoretical upper limit to the number of batteries that can be formed and tested with the FIG. 10 IPTFM 48, although there is a practical limit with respect to the current a module can handle within a limited amount of space.

Figure 11:
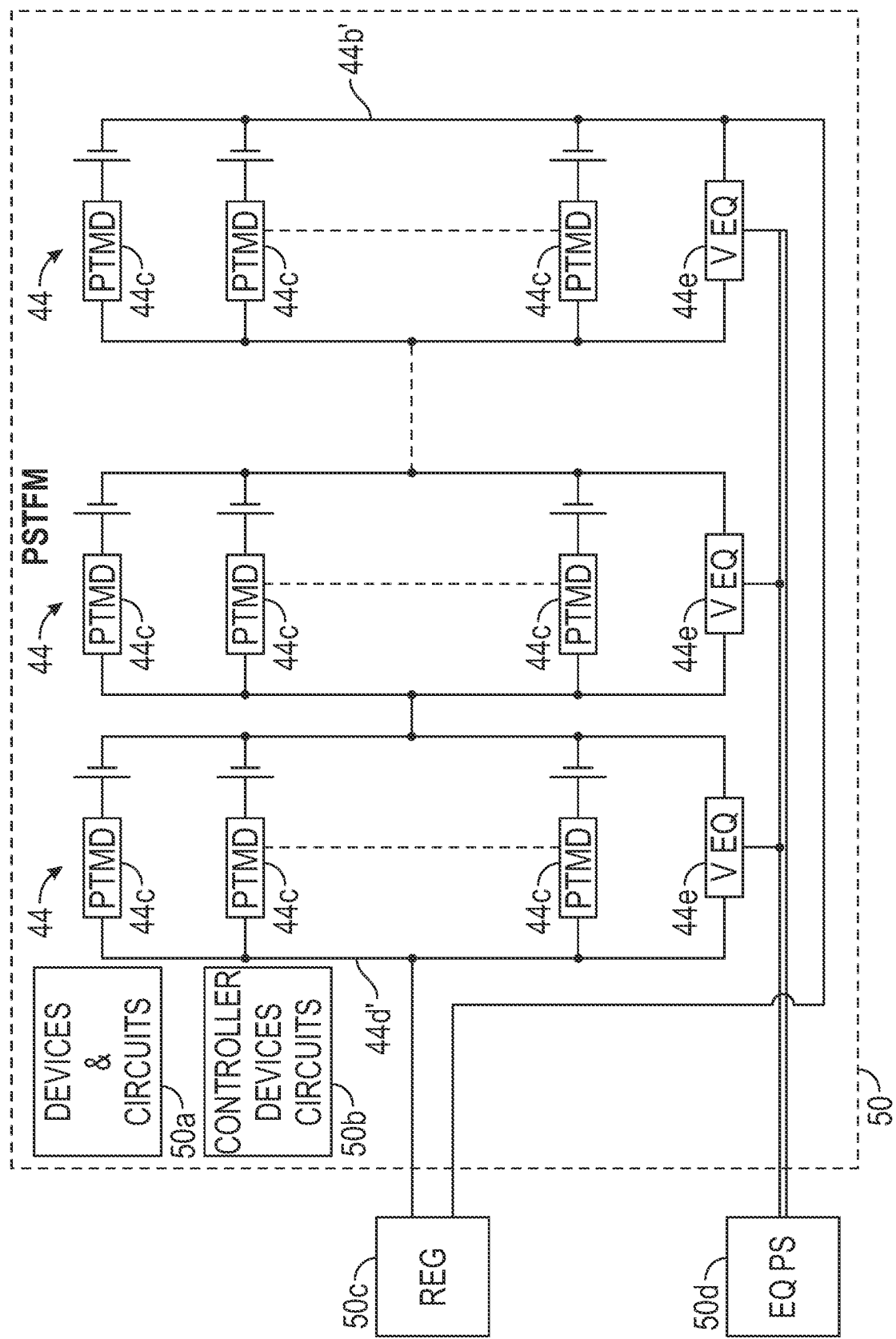
FIG. 11 is a block diagram of a conditional parallel-serial testing module or PSTFM, according to the present invention.

FIG. 11 is a block diagram showing a conditional Parallel-Serial Testing Module PSTFM 50. FIGS. 9 and 10 illustrated multiple PTMDs and their respective batteries connected in parallel. FIG. 8 is a block diagram of a parallel-serial test management device or PSTMD 44, which illustrated multiple PTMDs and their respective batteries connected in parallel. Each PTMD 44c in FIG. 8 is connected to one terminal of a battery and to the common PTMD bus 44d. The other terminal of each battery connects to the battery bus 44b. One terminal of the voltage equalizer 44e connects to the PTMD bus 44d, and the other terminal of the voltage equalizer connects to the battery bus 44b in FIG. 8. A plurality of the PSTMDs 44 of FIG. 8 are connected in series in FIG. 11, thereby making the module 50, which comprises one or more PCBs. FIG. 11 shows a plurality of parallel battery groups with each parallel battery group having its own equalizer 44e. A single, standalone parallel battery group does not need an equalizer, but the multiple parallel battery groups 1 to m connected together in series form a parallel-serial battery group. Each parallel battery group in the parallel-serial battery group needs an equalizer 44e. An equalizer 44e is included in the circuit for a parallel battery group when two or more parallel battery groups are connected in series. Electronic devices and circuitry 50a are included on the PCB or in the module 50 for control of the PTMDs 44c and for measuring various parameters such as current at certain points and voltage across certain locations. A microcontroller, electronic devices and circuits 50b are included on the PCB or in the module 50 for controlling the PTMDs 44c, such as for closing and opening the main and auxiliary relays. A regulator 50c is connected to the PCB and/or the module 50 for forming and testing batteries. The regulator 50c provides a source of current to the module 50 and the PCB for charging the batteries and for monitoring. A separate control power supply (not shown) provides power for circuits for measuring and controlling a charge and a discharge of the batteries in all PCB modules.

An equalizer power or current source 50d is connected to each of the equalizers 44e in FIG. 11, which provides current for the equalizers 44e that is separate from and independent of the current source 50c used to the charge/discharge the batteries, which is referred to as the battery power source 50c. The amount of electricity used by the equalizer power source 50d is about one-tenth ($1/10^{th}$) of the amount of electricity used by the battery power source 50c. During formation and testing of batteries, current flows from the battery power source 50c through the batteries and the PTMDs 44c, while at the same time, current flows from the equalizer power source 50d to the equalizers 44e and from there through the batteries. The batteries are simultaneously subjected to a large current flow from the battery power source 50c and a small current flow from the equalizer power source 50d while being formed and tested. The equalizer current flow causes all of the batteries in a parallel-serial battery group to have the same voltage across their terminals. The equalizers' currents enables all of the batteries in the parallel-serial battery group to have the same voltage.

Figure 12:
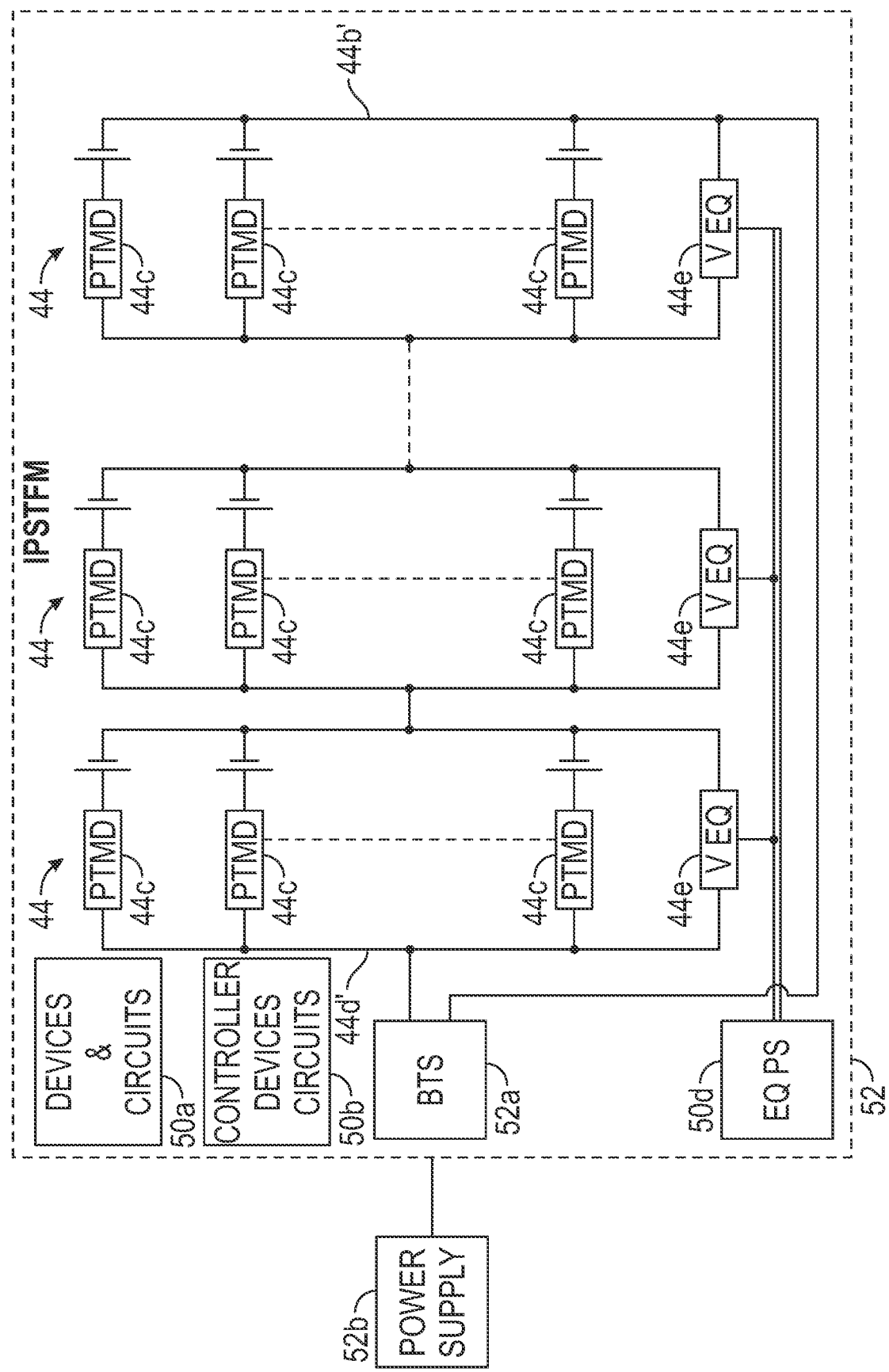
FIG. 12 is a block diagram of a conditional integrated parallel-serial testing module or IPSTFM, according to the present invention.

FIG. 12 is a block diagram that illustrates the circuits, batteries, electronics and devices that comprise a conditional Integrated Parallel-Serial Testing Module IPSTFM 52, which is the PSTFM 50 of FIG. 11 with an added BTS channel 52a. A power source 52b supplies current and voltage for IPSTFM 52. For FIG. 11 or 12, one first parallels a voltage equalizer 44e to a paralleled PTMD/battery group, then connects multiple such PTMD/battery group—equalizer combinations together in series to form a PSTFM or IPSTFM module. The difference between FIGS. 11 and 12 is the incorporation and integration of the BTS channel 52a into the PSTFM module 50 of FIG. 11 to make the IPSTFM module 52 of FIG. 12. The PSTFM module 50 of FIG. 11 and the IPSTFM module 52 of FIG. 12 comprise two or more of the PSTMD modules 44 of FIG. 8 connected in series. The PSTMD module 44 of FIG. 8 comprises multiple PTMDs 44c and the voltage equalizer 44e connected in parallel, which was named as the parallel serial test management device or PSTMD 44.

Figure 13:
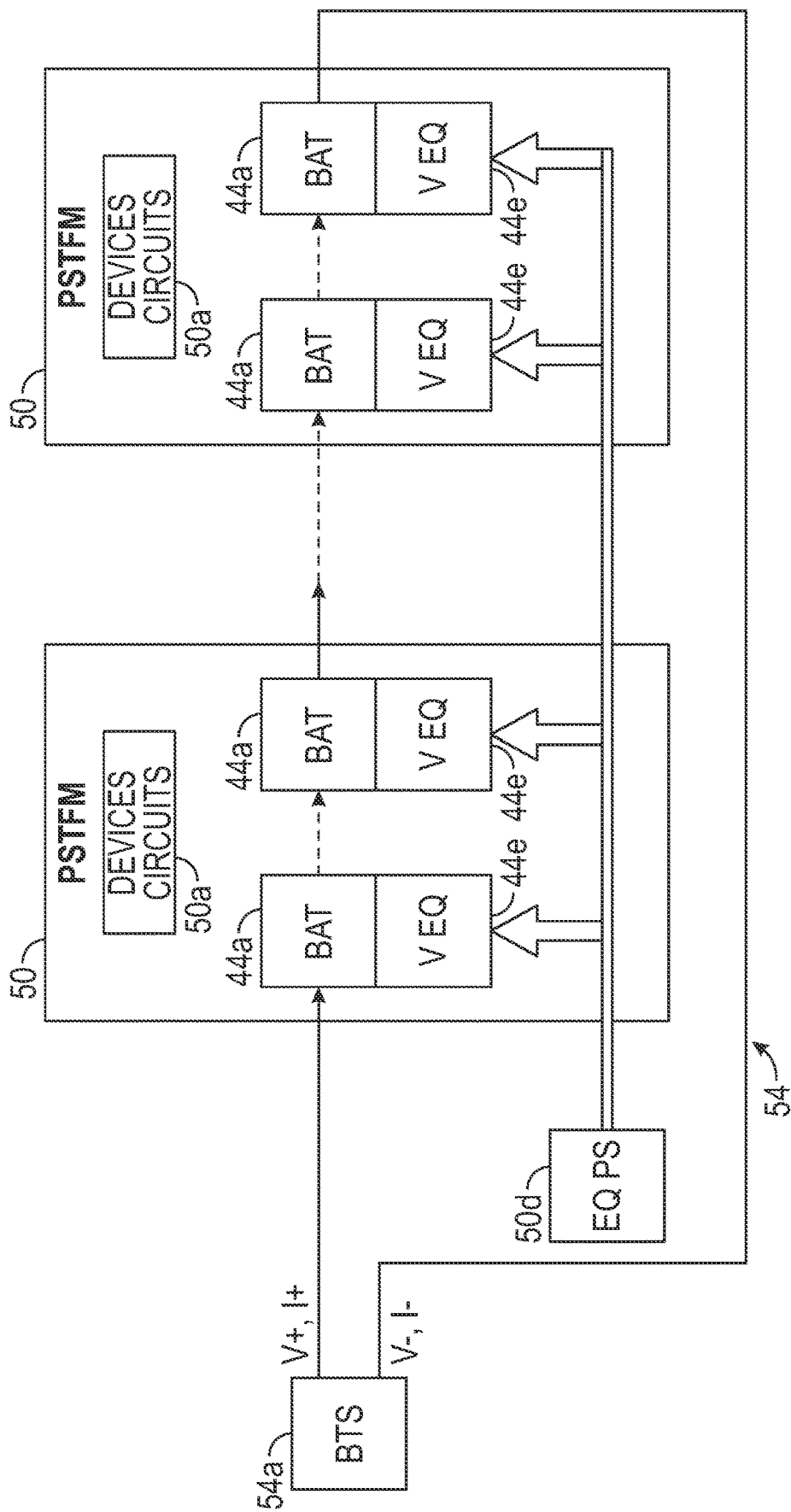
FIG. 13 is a block diagram of multiple PSTFM connected in series for testing batteries, according to the present invention.

FIG. 13 is a block diagram that illustrates multiple PSTFMs 50 of FIG. 11 connected in series for testing batteries. Multiple PSTFM modules 50 of FIG. 11 can be connected in series to make a module 54, which can then be connected to a BTS channel 54a for testing a plurality of batteries simultaneously.

Figure 14:
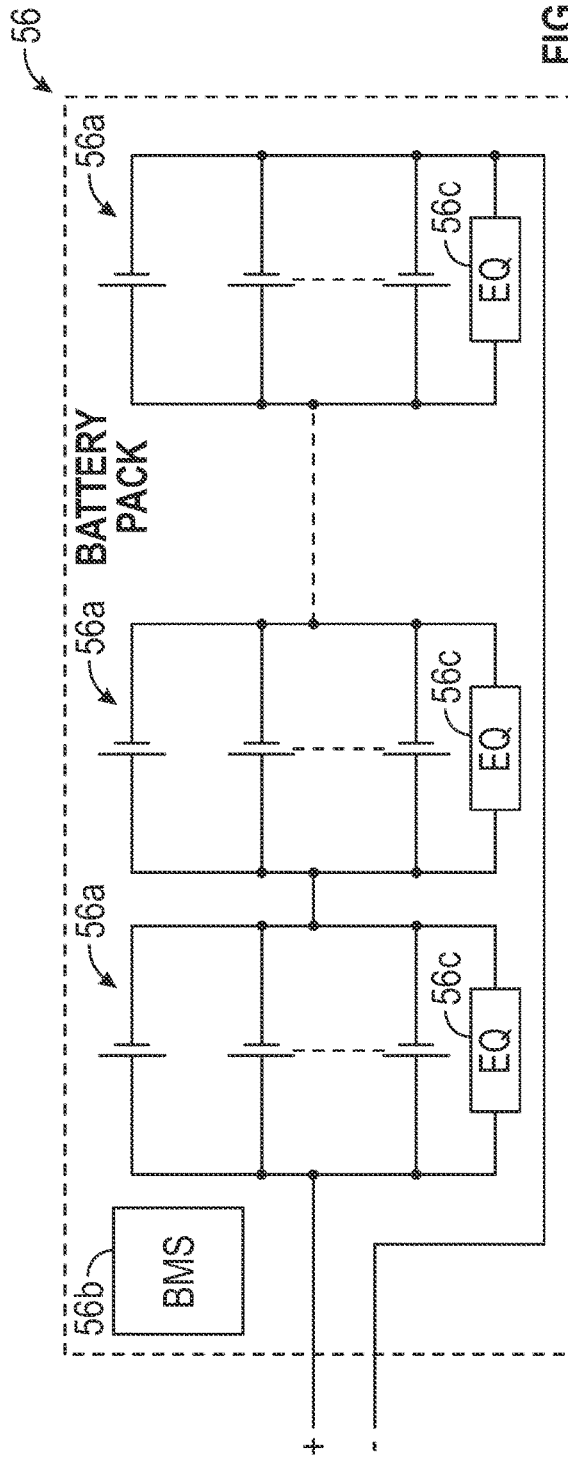
FIG. 14 is a block diagram of a parallel-serial battery pack.

FIG. 14 is a block diagram of a structure for a parallel-serial battery pack 56, which permanently combines multiple batteries for use. Voltage monitoring and equalization are for providing normal and safe operation of the pack. There is no on/off switch and no current protection/measurement function for each battery in a parallel group. There is no current measurement for a battery or for a group of batteries in serial connection. FIG. 14 is a block diagram that illustrates a plurality of parallel battery groups 56a arranged in series with a battery management system 56b. An equalizer 56c is connected in parallel with batteries in each parallel battery group 56a. Without more, FIG. 14 merely illustrates the structure of a prior art battery pack in which batteries are connected together in parallel groups that are then connected in series. The prior art battery pack can be used as a power source for a device or an apparatus such as an electric powered vehicle. However, if the PTMDs, the capability to measure parameters of and to control the PTMDs, the microcontroller and its related circuits, the battery testing system, an external power source and the concepts and principles taught in the present disclosure are added to and incorporated with the prior art battery pack of FIG. 14, then one will have an embodiment of a battery formation and testing system according to the present invention.

Figure 15:
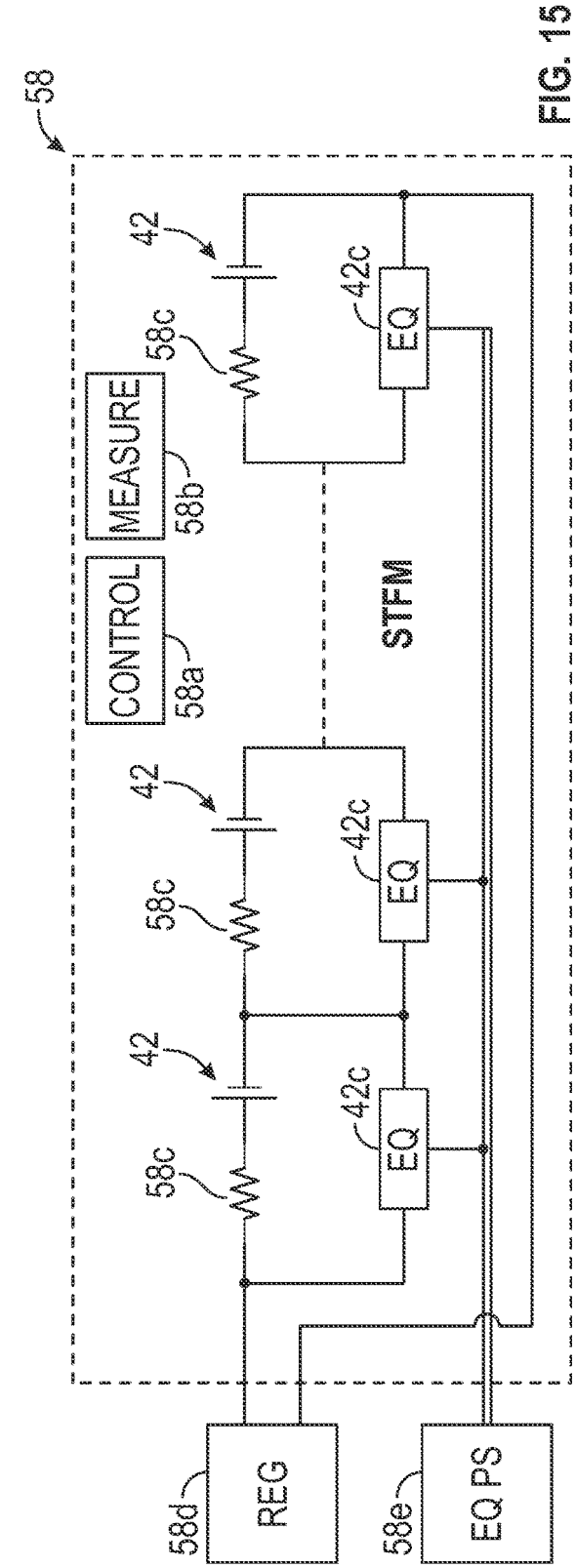
FIG. 15 is a block diagram of a conditional serial testing module or STFM, according to the present invention.

FIG. 15 is a block diagram that illustrates a conditional Serial Testing Module (STFM) 58. The STFM 58 of FIG. 15 incorporates multiple serial test management devices or STMDs 42 of FIG. 7 into a module, which also includes a microcontroller 58a, its related circuits and measurement and control capability 58b for the STFM 58. A shunt 58c is included with each battery in this embodiment of the present invention, which distinguishes a battery pack, as a battery pack would not have a shunt for each battery. A regulator 58d for charge and discharge of batteries and an equalizer power source 58e are connected to the serial testing module 58 of FIG. 15.

Figure 16:
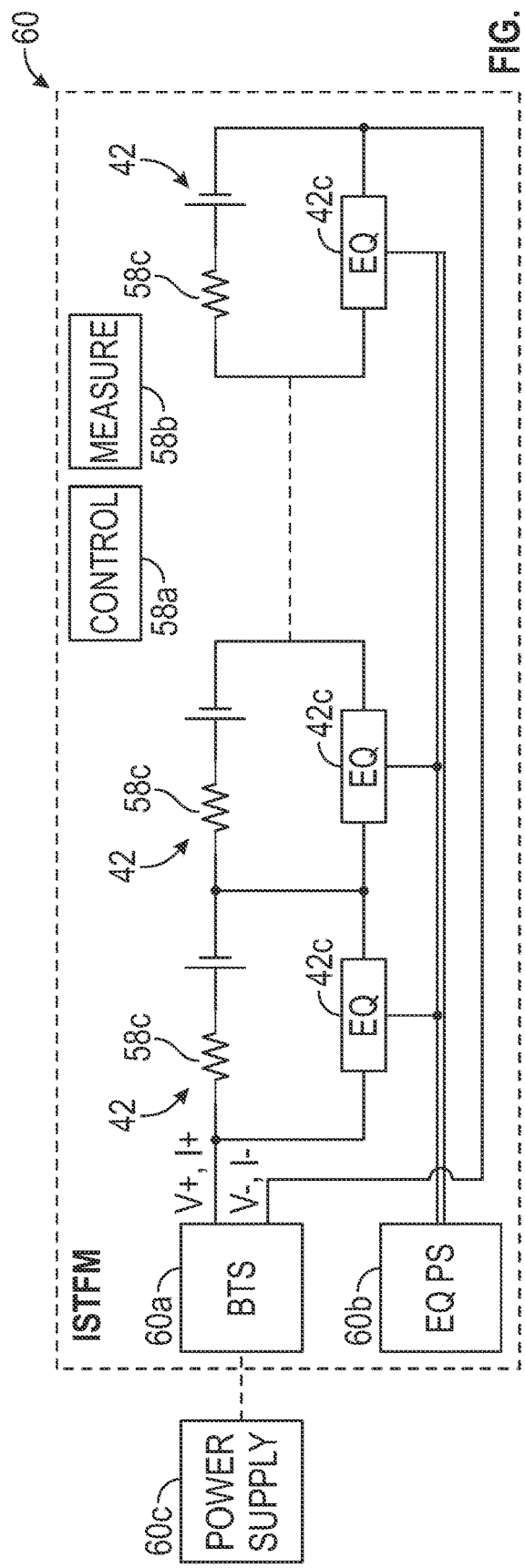
FIG. 16 is a block diagram of an integrated serial testing module or ISTFM, according to the present invention.

FIG. 16 is a block diagram that illustrates an Integrated Serial Testing Module (ISTFM) 60. A BTS channel 60a and an equalizer power source 60b are incorporated into the module 58 of FIG. 15 to make the module 60 of FIG. 16. Module 60 plugs into a power source 60c. One embodiment of the present invention is the Serial Test Management Device (STMD) 42 of FIG. 7 for forming and testing a single battery. The STMD 42 comprises a current transducer 42a connected with a battery in series and an equalizer 42c in parallel with the current transducer-battery series. Multiple STMD/battery combinations connect in series and then connect to a BTS channel or to a charge/discharge current regulator. The STMD embodiment 42 provides only a current transducer 42a and a voltage equalizer 42c for each battery, without a main relay 40a or a current-limiting circuit 40d-40e as shown in FIG. 6. Pre-equalization of batteries will be performed by the equalizer 42c.

Figure 17:
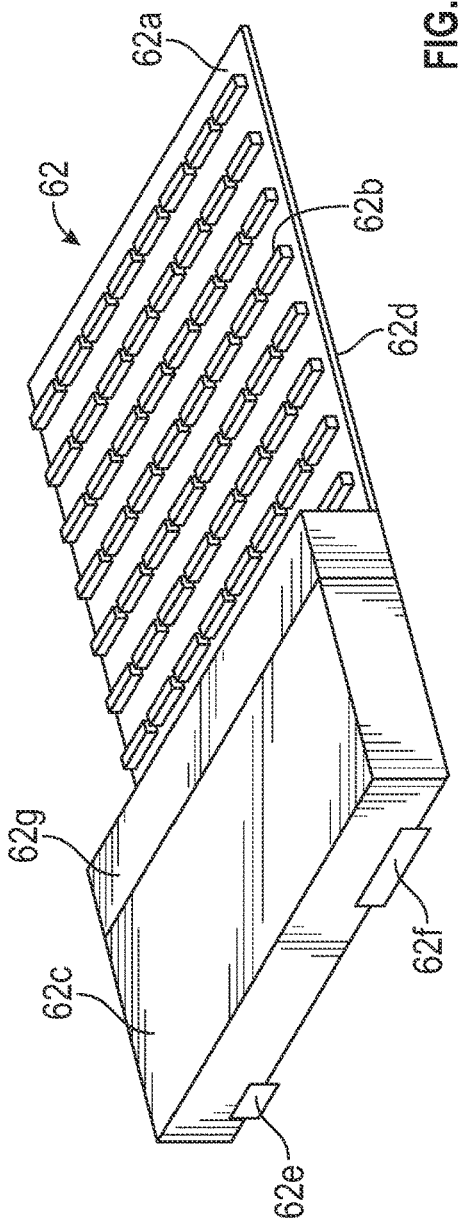
FIG. 17 is a simplified perspective view of a serial-parallel testing module or SPTM, according to the present invention.

FIG. 17 is a simplified perspective view of a module having a structure and functionality suitable for a serial-parallel testing module or SPTM 62. A battery testing system can be added into and integrated with the SPTM to make an integrated serial-parallel testing module or ISPTM. Battery holders and batteries are not shown, but a section 62a with sockets 62b that can receive battery holders is shown. A battery can be received in each battery holder. In the prior art, a mechanical device was used to engage and disengage batteries altogether at once. In the present invention, a battery tray (not shown) can be used to receive batteries. The battery tray can have connectors and a battery holder to engage each battery separately. This mechanism greatly reduces the complexity of the mechanical engagement structure, increases flexibility and reduces volume and weight of the system. Additionally, a temperature sensor (not shown) can be easily fixed to each battery holder and can be attached to each battery, which is convenient for temperature monitoring and protection of each battery during testing/formation. The battery tray can be a separate apparatus for receiving and holding batteries, which connects to the battery section 62a shown in FIG. 17, or the battery section 62a shown in FIG. 17 can be designed to be the battery tray. In either case, each battery is connected to a parallel test management device 40 (not shown in FIG. 17), which is illustrated in FIG. 6, and to an electronics section 62c in FIG. 17 through a printed circuit board 62d.

The electronics section 62c in SPTM 62 comprises a box in which a microcontroller, its related circuits and measurement and control instrumentation are received. A regulator can be incorporated into the electronic circuits for receiving a current input and outputting current to charge/discharge batteries for formation and testing the batteries. A battery testing system is added into the electronic circuits to make the module an integrated serial-parallel testing module or ISPTM. The electronic circuits are integrated with or built into a printed circuit board (PCB), which also receives and holds the sockets that receive the battery holders. Electronic elements and circuits are received on and incorporated into the PCB 62d. A communication port 62e and a power supply port 62f are received into and integrated with the electronic circuits and the PCB 62d. The concepts, the electronic components and the circuits illustrated and shown in the drawings and the description of the same provided above can be incorporated into and carried out with the SPTM 62 and/or the ISPTM shown in FIG. 17. The SPTM or ISPTM 62 shown in FIG. 17 can be placed in a temperature chamber (not shown) if desired for battery formation and testing. The SPTM or ISPTM 62 shown in FIG. 17 includes a thermal isolator 62g between the battery section 62a, which would be placed inside the temperature chamber, and the electronic-circuits section 62c, which would remain outside the temperature chamber while the battery section 62a is inside the battery section. The electronic-circuits section 62c is likely to contain temperature-sensitive electronics.

Figure 18A:
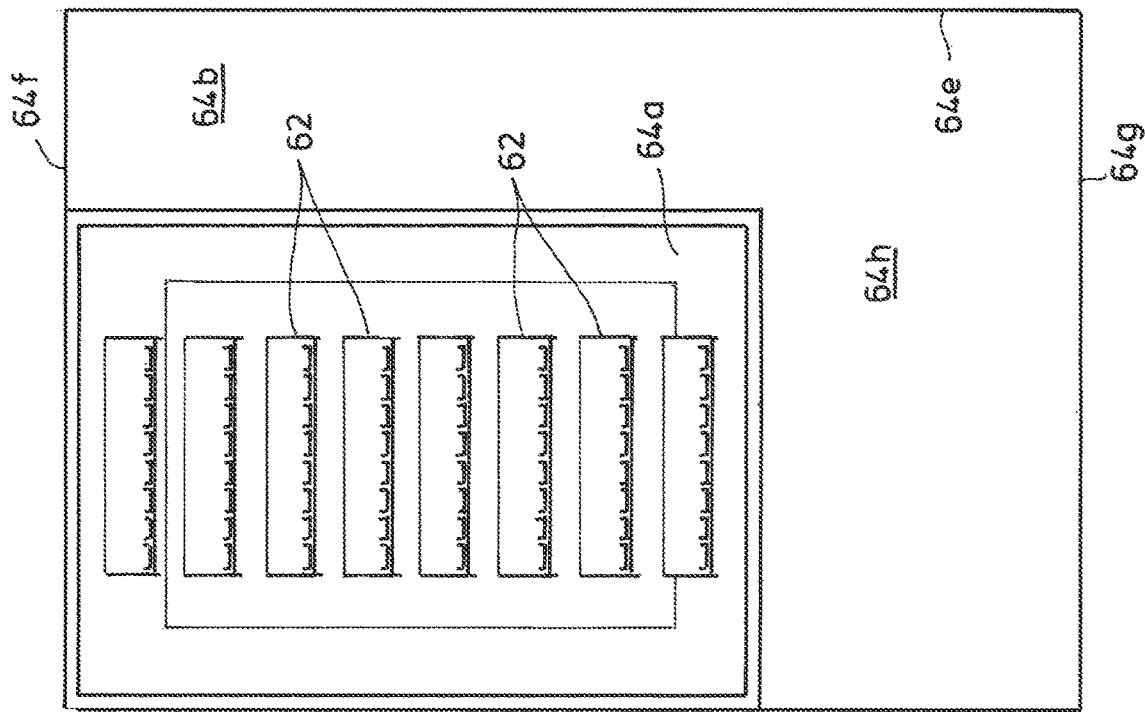
FIG. 18 shows a side elevation in cross-section on the left and a front elevation on the right of a temperature chamber in which SPTMs and/or ISPTMs are received, according to the present invention.
Figure 18B:
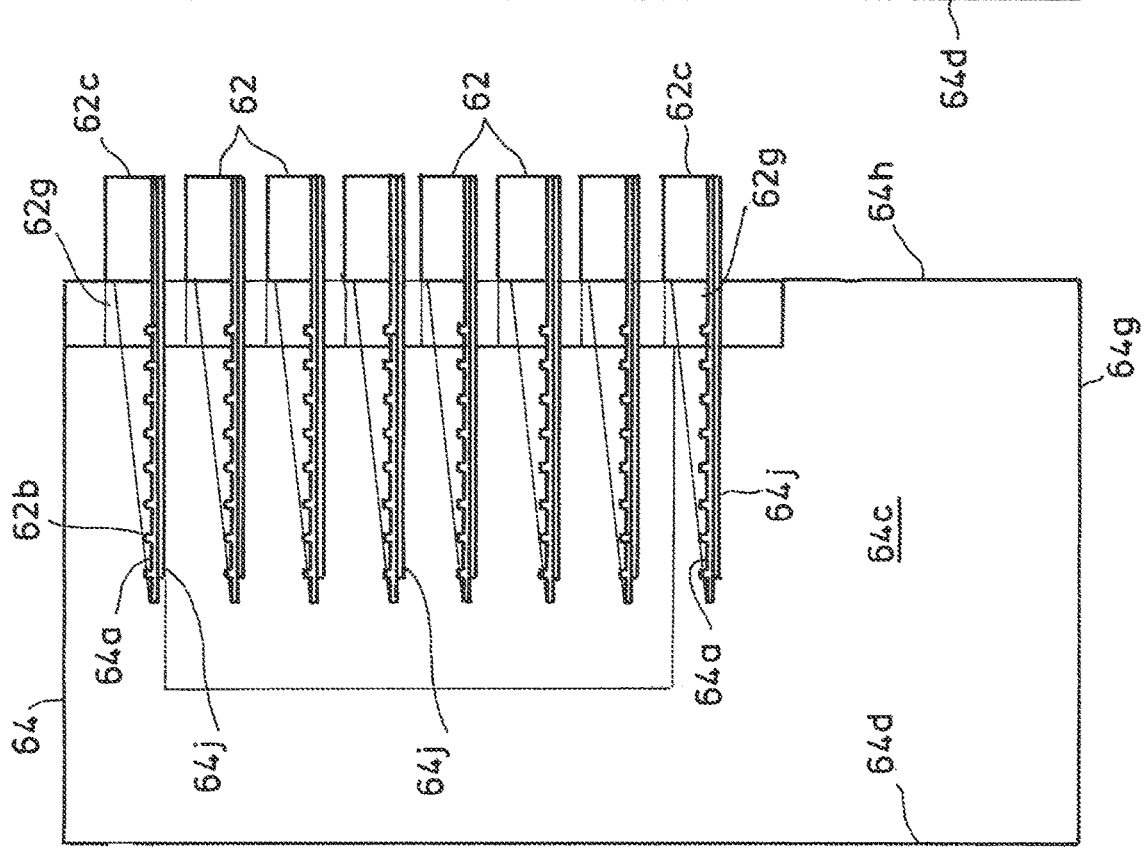

FIG. 18A is a side elevation in cross-section of a temperature chamber 64. FIG. 18B is a front elevation of the temperature chamber 64. The front elevation of the temperature chamber 64 shows a door 64a. Either the door 64a or a front wall 64b of temperature chamber 64 has rectangular openings or slots (not shown) for receiving the SPTM or ISPTM 62 of FIG. 17. The battery tray section 62a of the SPTM or ISPTM 62 of FIG. 17 is placed inside the temperature chamber 64 for temperature control operation while the electronic circuits section 62c remains outside the temperature chamber. The thermal isolator 62g shown in FIG. 17 separates the electronic circuits 62c on the outside from the battery tray 62a inside the temperature chamber. This feature prevents the electronic circuits from dramatic temperature change in the temperature chamber during battery testing and formation. Any openings or slots not filled and sealed with an SPTM or an ISPTM 62 can be sealed with a thermal isolation block (not shown) while operating the temperature chamber 64. The temperature chamber 64 has an inner cavity 64c defined by side walls 64d and 64e, top wall 64f, bottom wall 64g, front wall 64h, rear wall 64i and the door 64a. Guides 64j are provided for each slot or opening, which receive and support the modules 62. A heating/cooling source (not shown) and a temperature control unit (not shown) are used to maintain a desired temperature in the temperature chamber 64. The applicant's U.S. patent application Ser. No. 16/509,685 filed on Jul. 12, 2019, which was published as Pub. No. US 20200064407 A1 on Feb. 27, 2020, and incorporated by reference herein, describes a multi-chamber, explosion-proof, battery-testing apparatus that can be modified and adapted to accommodate the integrated modules of the present invention such as the SPTM and ISPTM 62 of FIG. 17.

The serial-parallel testing module or SPTM and the integrated serial-parallel testing module or ISPTM 62 of FIG. 17, which incorporates the designs described with reference to FIGS. 6-16, can be used to test many batteries simultaneously with a built-in BTS channel or a charge/discharge current source. These modules have integrated battery and battery-pack connections and means for holding and supporting batteries. The SPTM and ISPTM modules 62 have the thermal isolation block 62g between the battery section 62a and temperature-sensitive electronics in the electronics section 62a to enable the module 62 to interface directly with the temperature chamber 64 in a manner such that only the battery section 62a will be inside the chamber. The SPTM and ISPTM modules 62 make testing very simple, convenient and highly efficient. The serial-parallel testing module or SPTM and the integrated serial-parallel testing module or ISPTM 62 of FIG. 17 include circuits for temperature and voltage measurement for each battery, although they are not in parallel or serial mode with the batteries.

FIG. 17 illustrates one embodiment of a serial-parallel testing module or SPTM 62 or an integrated serial-parallel testing module or ISPTM 62, according to the present invention. A plurality of batteries or many batteries can be placed in battery holders, which are received in sockets located on the printed circuit board 62d integrated with the SPTM or ISPTM 62. A parallel test management device or PTMD shown in and described with reference to FIG. 6 is connected to each battery. The batteries are preferably first connected in parallel to form one or more parallel battery groups, and preferably a plurality of parallel battery groups are formed. The parallel battery groups are preferably connected in series, and a voltage equalizer is included with each parallel battery group in a manner illustrated in and described with respect to FIGS. 11 and 12. The voltage equalizer operates concurrently and simultaneously with charging the batteries for formation and testing. The PTMD of FIG. 6 provides safety in that it helps to prevent and avoid the explosion of a battery, and also, an unacceptable battery, such as one that has a short or inadequate capacity, can be isolated using the PTMD. A serial-parallel testing module or SPTM or an integrated serial-parallel testing module or ISPTM, according to the present invention, can be made with sufficient precision and sensitivity to serve the function of a battery sorting machine in addition to and while forming and testing many batteries simultaneously, thereby eliminating the need for a separate battery-sorting machine. A serial-parallel testing module or SPTM 62 or an integrated serial-parallel testing module or ISPTM 62, according to the present invention, provides a much higher throughput for forming and testing batteries than prior art battery formation and testing technology and provides a battery-sorting function while forming and testing the batteries.

Batteries are charged on the basis of constant current or at constant voltage (CCCV). Charging and discharging through CCCV to reach very low current can make the voltage drop at an end point across the sub-channel circuit to be within the precision limit of voltage control. Thus, all batteries are under same voltage with an allowable difference at an endpoint of CCCV. This technology allows measurement and control of endpoint voltage of all batteries by only one control and measurement of the master channel. Thus, it is possible to avoid the need for voltage measurement and control circuits for each battery. In comparison, traditionally, CCCV is mainly used for charging. Its purpose is to achieve a precise state of charge.

Figure 19:
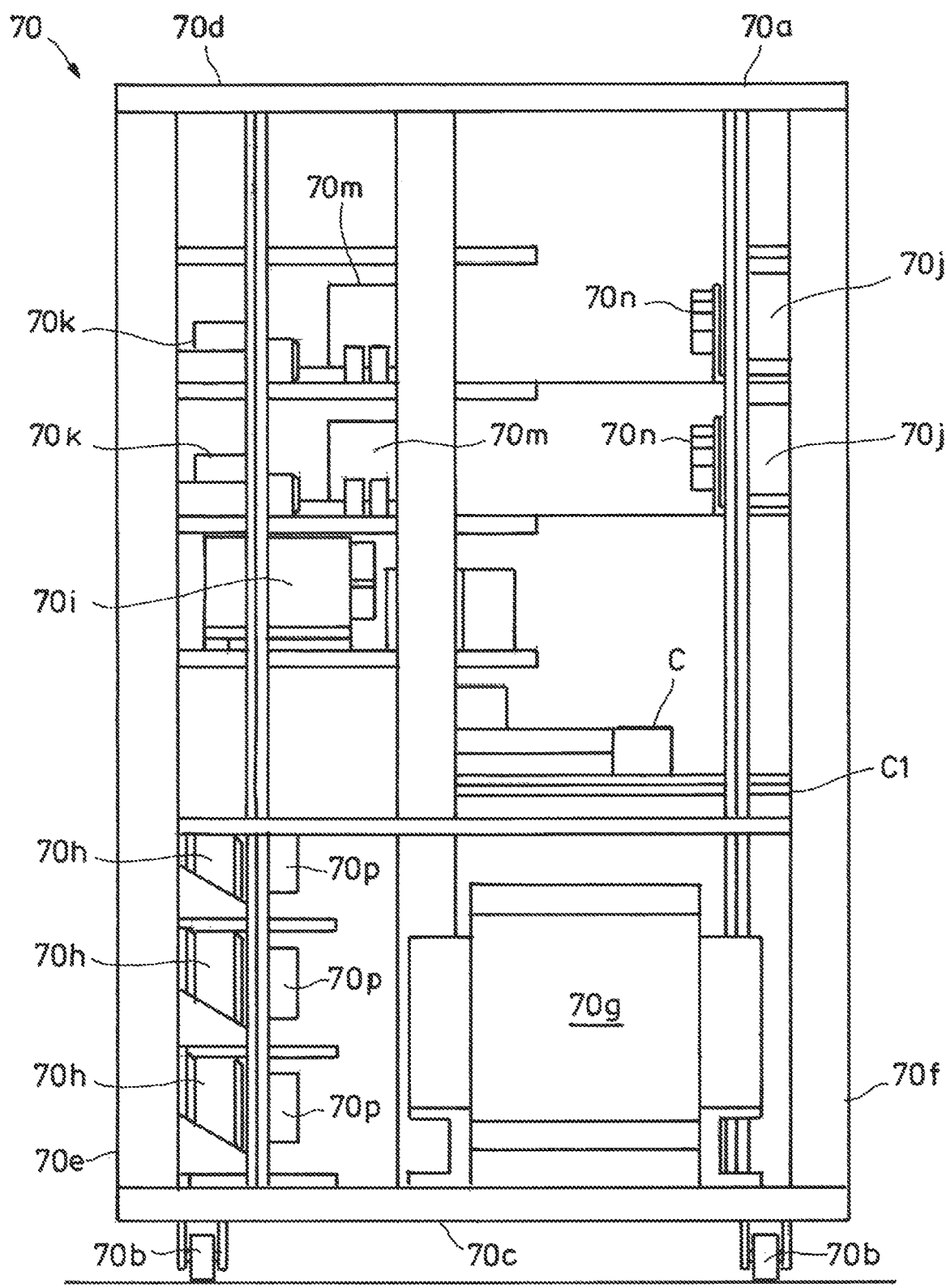
FIG. 19 is a side elevation of a power supply system for forming and testing batteries, according to the present invention.

The present invention teaches how a great number of batteries can be formed and tested simultaneously. However, a great deal of energy or power or electricity is required to form and test so many batteries simultaneously. FIG. 19 is a side elevation of a suitable power supply system 70 for forming and testing batteries, according to the present invention. A cabinet 70a is mounted on caster wheels 70b and has a height extending from a lower end 70c to an upper end 70d, a width that accommodates two columns of equipment and a depth from a side 70e to a side 70f. The wheels 70b allow one person to move the cabinet 70a into a desired location, although the cabinet 70a can be quite heavy when filled with equipment. A contactor C having a connector C1 receives electricity or power from an electrical grid via electrical cables, which are not shown, but which would be attached to connector C1. A transformer 70g is received near the lower end 70c. Transformer 70g is connected to the contactor C by cables or copper bars, which are not shown. The electricity or power that is received could be in the thousands of watts at whatever combination of voltage and amperage is required for a particular application. Transformer 70g converts the electricity or power from the grid into an output that is a desired combination of voltage and amperage with almost the same power.

The output from transformer 70g is an input for inductors 70h via cables, which are not shown. There are six inductors 70h, which are in two groups of three inductors and which are placed as three rows high and two columns wide. The inductors 70h are connected by cables or copper bars to provide inputs to two inverter modules 70i separately, which are arranged side-by-side in the two columns of the cabinet 70a. Through cables and/or copper bars, which are not shown, outputs from the inverter modules 70i serve as an input to four DCDC converter modules 70k arranged two modules wide and two modules high. Each DCDC module 70k will use a DCDC choke 70j through cables, which are not shown. The DCDC chokes 70j are arranged as two modules wide and two modules high.

The equipment in cabinet 70a generates heat, which should be removed. Each of the DCDC modules 70k have a fan and heat sink 70m, and each of the DCDC chokes 70j have a fan 70n. Each of the inductors 70h has a fan $70_p$. The fans 70m, 70n and 70p operate cooperatively to cause air to flow into cabinet 70a through side 70e, flow through the cabinet 70a, and flow out through side 70f. The air flow removes heat as the equipment generates heat. Sides 70e and 70f can be louvered to provide sufficient open space to allow adequate air flow while still enclosing cabinet 70a, if preferred over open sides.

Power supply system 70 comprises the equipment and modules described as received in the cabinet 70a. Each DCDC module 70k provides an output for the power supply system 70. The output depends entirely on the selection of the equipment, which should be based on the needs of a particular application. Adjustments can be made to how the equipment is set to operate in order to regulate the output to a desired set of values for voltage, current or power. Possible values include a range of 100 to 700 volts; 0 to 100 kw; or −130 to +130 amps. Power supply system 70 provides high current and high power, which can be used in battery testing and formation.

Figure 20:
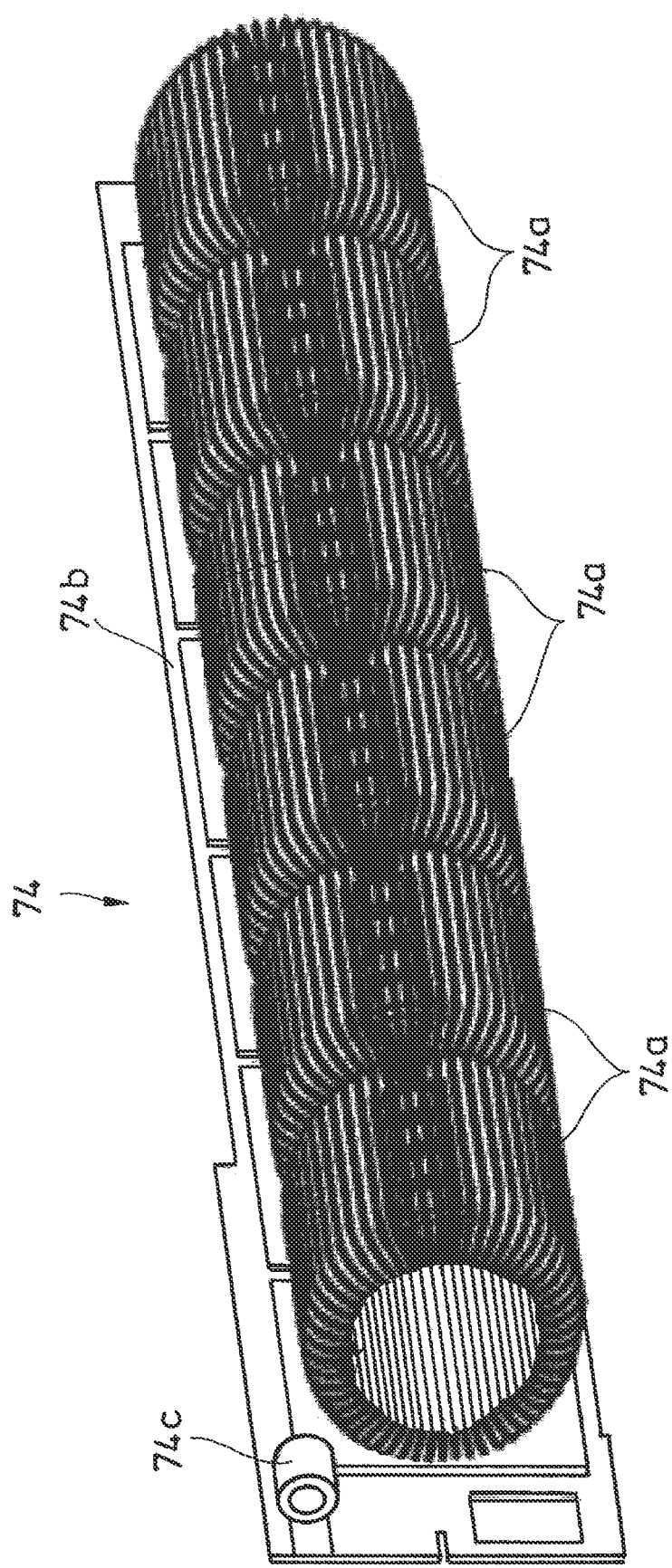
FIG. 20 is a side elevation of a distributed inductor, according to the present invention.
Figure 21:
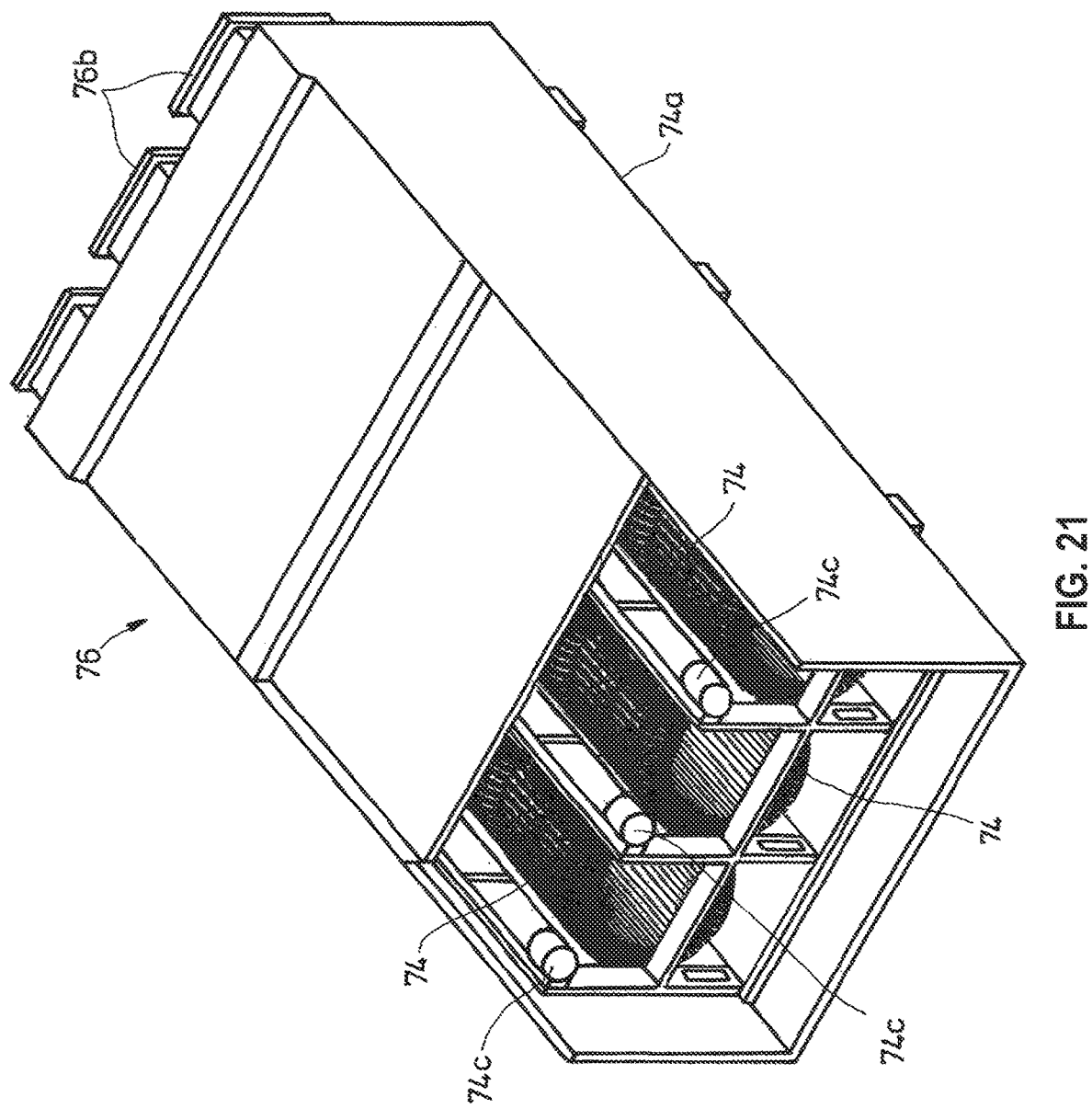
FIG. 21 is a perspective view of an inductor module that comprises three of the distributed inductors of FIG. 20.

The inductors 70h in FIG. 19 are large and require adequate space. Turning now to FIG. 20, the present invention provides a distributed inductor 74. Distributed inductor 74 includes six small inductors 74a, which are connected to each other in series. Since the small inductors 74a are connected in series, they operate collectively as a single, unified inductor, which is the distributed inductor 74. The small inductors 74a are operatively connected to a printed circuit board 74b, which has a high current socket 74c. FIG. 21 is a perspective view of an inductor module 76, which comprises three of the distributed inductors 74. The three distributed inductors 74 are enclosed in a rectangular box 76a. The three distributed inductors 74 and the rectangular box 76a are preferably designed and sized to be received in a cabinet such as cabinet 70a in FIG. 19. Three fans 76b provide a flow of air through the box 76a for cooling the distributed inductors 74. The inductance of inductors connected in series is additive. The inductance of each of the six small inductors 74a in FIG. 21 provides a total inductance equal to the sum of the six individual inductances. By arranging small inductors in series, the inductors can be modularized to provide the inductor module 76 of FIG. 21. The distributed inductors 74 in FIG. 21 can be operated in series to provide an even larger single, unified inductor, or the distributed inductors 74 in FIG. 21 can be operated independently to provide three separate inductors. Two or more of the inductor modules 76 can be connected in series to provide an even larger single, unified inductor. This modularization provides a great deal of flexibility in designing a power supply system. This modularization decentralizes from a single, large inductor, such as one of the inductors 70h in FIG. 19, to multiple, relatively smaller inductor modules 76 in FIG. 21.

Figure 22:
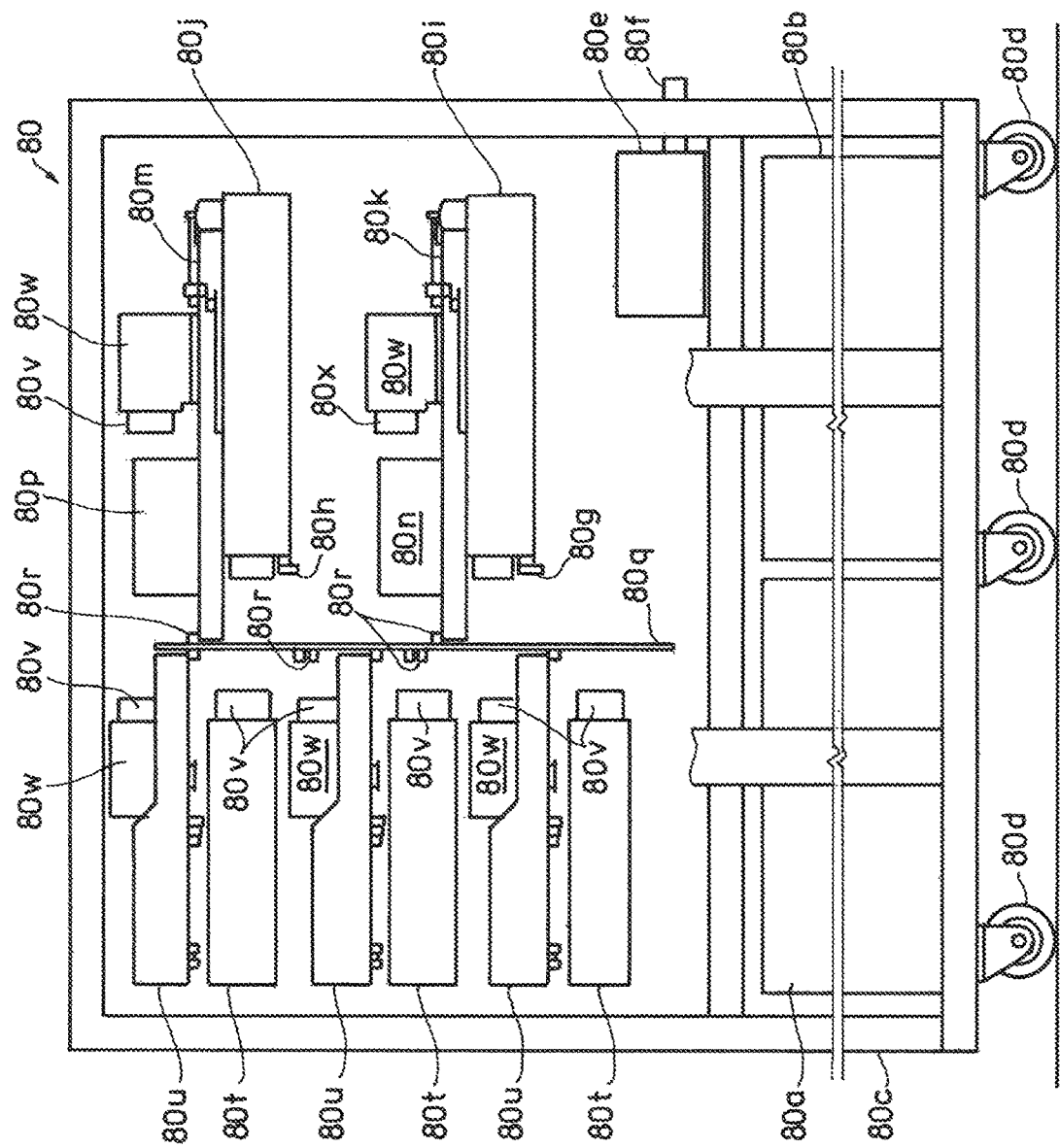
FIG. 22 is a side elevation of a power supply system or a battery testing system, according to the present invention.

FIG. 22 is a side elevation of a power supply system 80, according to the present invention. Two transformers 80a and 80b are received in a bottom portion of a cabinet 80c, which is received on wheels or casters 80d. Each of two contactors 80e has a connector 80f to which a cable can be connected for receiving power or electricity from a power grid. Each of the contactors 80e connect to a respective transformer 80a or 80b through cables or bars such as copper bars. The transformers 80a and 80b are connected to connectors 80g and 80h for suppling power or AC current to inductor modules 80i and 80j, respectively, according to the present invention. Inductor modules 80i and 80j connect through bus bars 80k and 80m to inverter modules 80n and 80p, respectively.

A large piece of double-sided bus board 80q made of a multiple-layer printed circuit board (PCB) is received in cabinet 80c above the transformers 80a and 80b, oriented vertically and extended toward opposing sides. Bus board 80q includes multiple lines for high current (up to 1000 Amps), lines for signals and control power supplies, and corresponding connectors on both sides of the bus board 80q. Modules can be plugged into connectors on both sides of the bus board 80q. For example, one can place modules that require a user interface in a front part of the cabinet 80c and supporting modules, such as power supplies, which do not require a user interface, in a back or rear part of the cabinet 80c. Bus board 80q has connectors or sockets 80r, and various modules can be plugged into the sockets 80r.

Cabinet 80c has guides, rails and/or shelves for receiving modules. Inductor modules 80i and 80j comprise one or more inductor modules 76 described with reference to FIG. 21. A person can lift and place the inductor modules 80i and 80j into a guide or in guide rails or on a shelf in the cabinet 80c. Cables or bars can be connected between one or both of the transformers 80a and 80b and the connectors 80g and 80h. The inductor module 80i is preferably fixed in a particular location so as to allow a person to slide the inverter module 80n into the cabinet 80c and to simultaneously plug the inverter module 80n into the inductor module 80i and into its respective connector 80r on the double-sided bus board 80*q*. The person can then slide the inverter module 80*p* into the cabinet 80*c* and plug simultaneously into the inductor module 80*j* and its respective connector 80*r* on the double-sided bus board 80*q*. This modularity and the compactness of the inductor modules 80*i* and 80*j* allows efficient use of space in cabinet 80*c*, and the ability to plug the inverter modules into their respective inductor modules simultaneously with plugging into the bus board improves assembly efficiency, eliminates connecting cables between modules and reduces the likelihood of connection errors. The elimination of high current cables or copper bars by using a PCB bus board also reduces stray inductance tremendously and improves system performance.

Turning now to the other side of the bus board 80*q*, a side elevation shows three inductor modules 80*t*, which are preferably made as described for inductor module 76 in FIG. 21. The inductor modules 80*t* are placed on shelves or in guide rails or in some manner fixed inside cabinet 80*c*. DCDC modules 80*u* are one at a time simultaneously plugged into a respective inductor module 80*t* and a connector 80*r* on bus board 80*q*. The double-sided bus board 80*q* and the simultaneous plugging of the DCDC modules 80*u* into respective inductor modules 80*t* and connectors 80*r* on the bus board 80*q* eliminates the need to make connections between modules using cables or copper bars. No high current cables or copper bars are needed in power supply system 80, except for cable connection from the transformers 80*a* and 80*b* to connectors 80*g* and 80*h* on the inductor modules 80*i* and 80*j*. Power supply system 80 in FIG. 22 is preferably built as having two columns of the modules illustrated in FIG. 22, thereby doubling the number of these modules. The modules have a number of fans 80*v* and heat sinks 80*w*.

Figure 23:
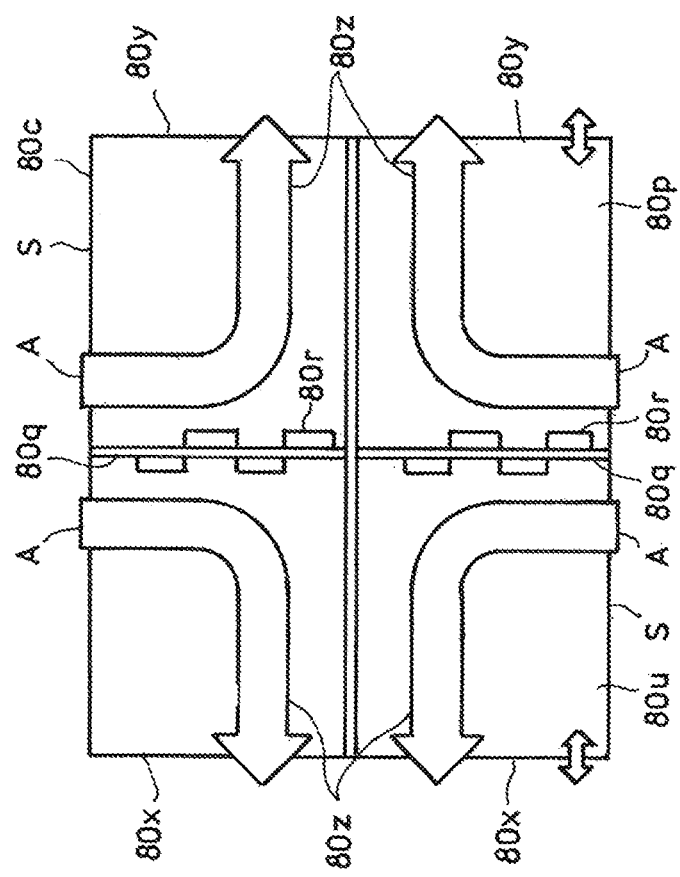
FIG. 23 is a schematic representation of air flow for cooling the power supply system of FIG. 22, according to the present invention.

FIG. 23 is a schematic representation of air flow for cooling the power supply system 80 of FIG. 22, as seen in a top plan view with two columns of the modules described with reference to FIG. 22. To provide efficient and adequate air flow for cooling the modules and components in cabinet 80*c*, the sides S are provided with a great deal of open space, being either entirely open or having closed sides with a great number of louvered openings. The fans 80*v* draw air A in through the sides S, which flows over and around the various modules 80*n*, 80*p*, 80*t* and 80*u* and the heat sinks 80*w* and absorbs heat generated by the modules and components, and exhaust the air to the front and rear sides 80*x* and 80*y*, respectively, as indicated by the curved arrows 80*z*.

The inverter modules and the DCDC modules in FIG. 22 plugged into connectors on a double-sided bus board. These are single polarity connections. Some applications require a direct current flow from a positive polarity to a negative polarity, which is a double polarity. The present invention provides a double polarity connector. Modules that require double polarity can be an assembly of electronic devices and components connected to and connected together by a printed circuit board (PCB). Some modules, which have a PCB, have an edge connector. An edge connector is literally an edge of a PCB, which has been designed to be a male connector, where electrically-conductive traces on the PCB connect the edge of the PCB to various electronic devices and components on the PCB. The male edge connector is received in a female socket, thereby making an electrical connection.

An example of a female socket for an edge connector is an expansion slot on a motherboard of a personal computer. A card received in the expansion slot would have an edge connector. One example of a prior art socket for an edge connector comprises a metal base received in a plastic housing, where the metal base has an upper row of metal extending spring fingers and an opposing lower row of metal extending spring fingers. The upper and lower rows of spring fingers are close to one another, possibly touching one another, and the edge connector on a PCB is pushed in between the upper and lower rows of spring fingers. There is typically some constraint provided to ensure proper alignment of the spring finger with trace connections on the PCB and to ensure only the proper type of PCB can be inserted into the socket. The metal portions of the socket are connected together and are not isolated from one another. All of the metal portions of the socket, namely the base and the upper and lower rows of spring fingers, are under the same status with respect to polarity and voltage potential because they are a contiguous part of a piece of electrically-conductive metal.

Figure 24:
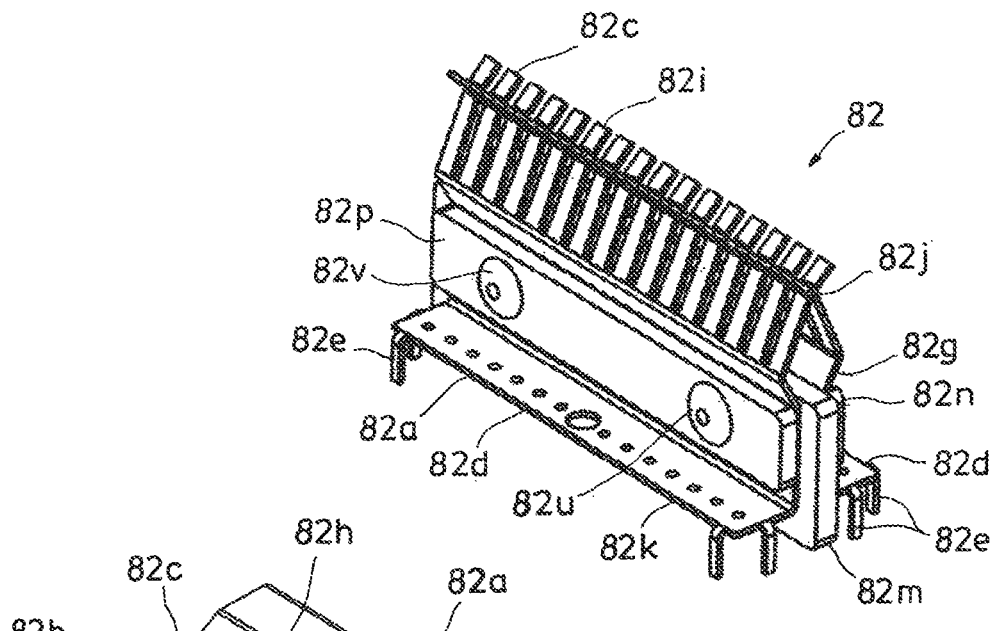
FIG. 24 is a perspective view of a double-polarity, edge-connector socket, according to the present invention.
Figure 25:
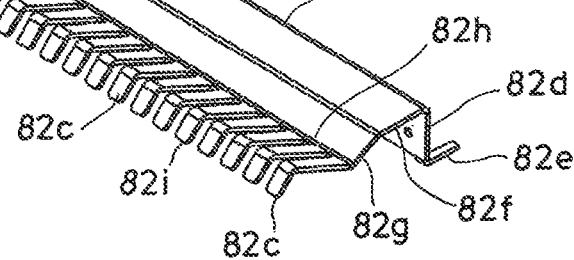
FIG. 25 is a perspective view of a first contact in the edge-connector socket of FIG. 24.

FIG. 24 is a perspective view of an edge-connector socket 82, according to the present invention, which is for receiving an edge connector on a printed circuit board. FIG. 25 is a perspective view of a first contact 82*a* in socket 82. First contact 82*a* has a base portion 82*b* and a plurality of spring fingers 82*c*. Base portion 82*b* has a flat portion 82*d*, prongs 82*e* that extend perpendicular from an edge of the flat portion 82*d* at opposing ends of the flat portion 82*d*, a right angle portion 82*f* that extends from an edge of the flat portion 82*d* such that a side edge view of the flat portion 82*d* and the right angle portion 82*f* shows a 90 degree angle, and an obtuse angle portion 82*g* that extends from the right angle portion 82*f* such that the right angle portion 82*f* is between the flat portion 82*d* and the obtuse portion 82*g*. The obtuse angle portion 82*g* bends toward the flat portion 82*d* and forms an obtuse angle with the right angle portion 82*f* as seen from a side edge view of the base portion 82*b*. The obtuse angle portion 82*g* has an edge 82*h* distal to the right angle portion 82*f*. The plurality of spring fingers 82*c* extend away from the edge 82*h* at an angle equal to and in the opposite direction of the obtuse angle formed between the obtuse angle portion 82*g* and the right angle portion 82*f*. The spring fingers 82*c* have a tip 82*i* at a distal end and a bend 82*j*, which forms an angle equal to and in the opposite direction of the angle between the spring fingers 82*c* and the obtuse portion 82*g*. The angle of the bend 82*j* is approximately equal to and in the same direction as the obtuse angle between the obtuse portion 82*g* and the right angle portion 82*f*.

In a side edge view of the first contact 82*a* with the prongs 82*e* in a horizontal position, the flat portion 82*d* extends vertically upward from the prongs 82*e*; right angle portion 82*f* extends horizontally from the upper edge of the flat portion 82*d* away from the prongs 82*e*; the obtuse angle portion 82*g* bends downwardly; the spring fingers 82*c* bend upwardly in an equal and opposite amount; and the bend 82*j* is at an angle such that the portion of the fingers 82*c* between the bend 82*j* and the tip 82*i* slopes downwardly an equal and opposite amount. The portion of the fingers 82*c* between the bend 82*j* and the tip 82*i* is approximately parallel to the obtuse angle portion 82*g*.

Figure 26:
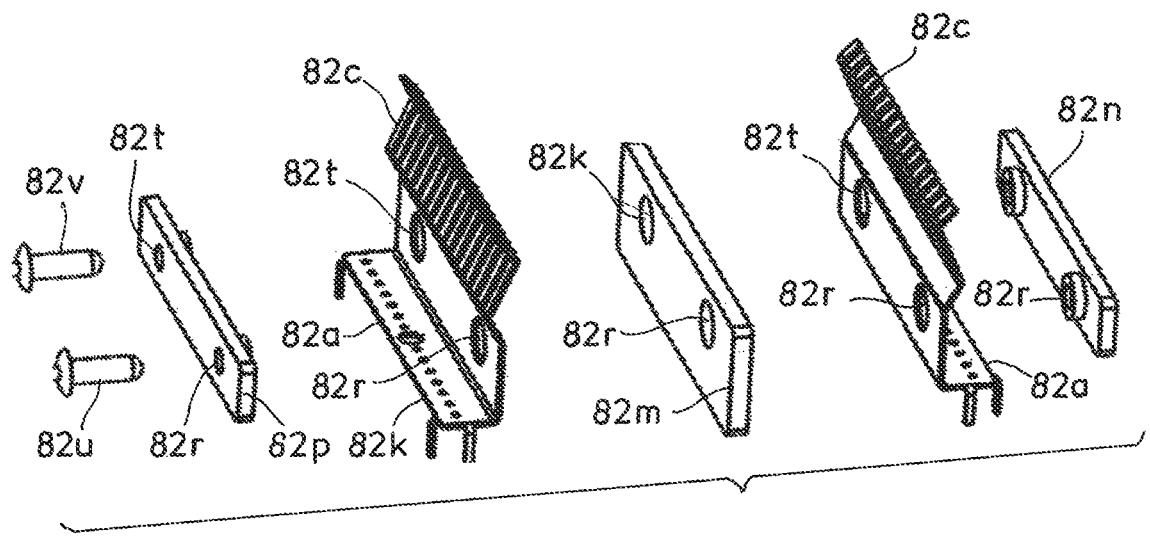
FIG. 26 is an exploded view of the edge-connector socket of FIG. 24.

FIG. 26 is an exploded view of the socket 82 in FIG. 24. FIG. 26 shows a perspective view of the first contact 82*a*, which was described with reference to FIG. 25, shown rotated clockwise about 90 degrees. A second contact 82*k* is a mirror image of the first contact 82*a* and is identical in size and shape. Two of the first contacts 82*a* can be made, and one can be rotated or turned to be the mirror image of the other. An inner electrically nonconductive isolator 82*m* having approximately the shape and the size of the right angle portion 82*f* is between the right angle portions 82*f* of the first and second contacts 82*a* and 82*k*, respectively. Outer electrically nonconductive isolators 82*n* and 82*p* are outside of the first and second contacts 82*a* and 82*k*, respectively. Each of the outer isolators 82*n* and 82*p*, the first and second contacts 82*a* and 82*k* and the inner isolator 82*m* have through holes 82*r* and 82*t* that align so that electrically nonconductive rivets 82*u* and 82*v* can pass through the holes 82*r* and 82*t*, respectively, thereby connecting together the outer isolators 82*n* and 82*p*, the first and second contacts 82*a* and 82*k* and the inner isolator 82*m* in a manner such that the first and second contacts 82*a* and 82*k* are electrically isolated from one another, except for the spring fingers 82*c* of the first contact 82*a* contacting and touching the spring fingers of the second contact 82*k*. The rivets 82*u* and 82*v* can be made of an electrically conductive material, provided that an electrically nonconductive sleeve (not shown) is placed around the shank of the rivets 82*u* and 82*v* so that the rivets do not provide an electrical connection between the first and second contacts 82*a* and 82*k*. FIG. 24 shows the socket 82 of the present invention fully assembled.

Figure 27:
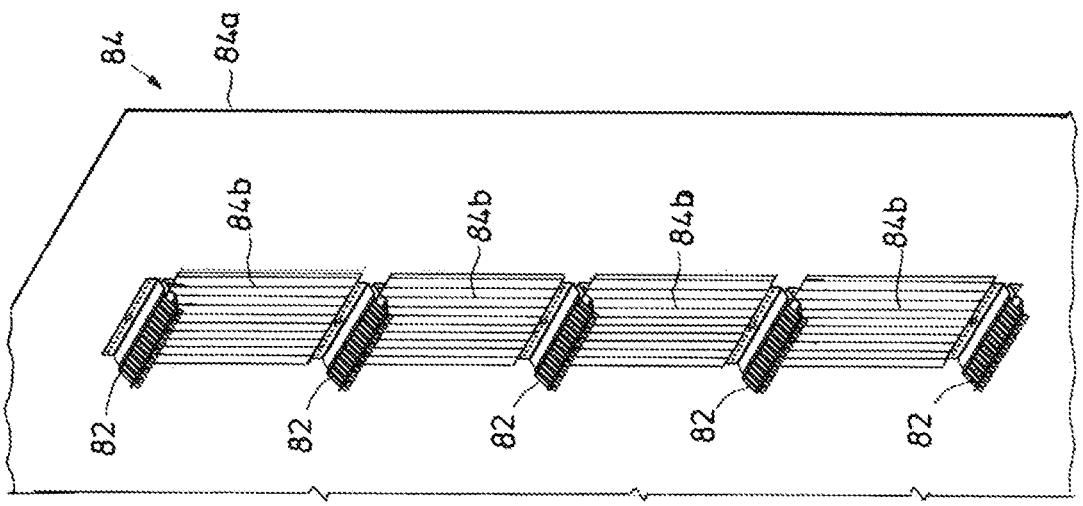
FIG. 27 is a perspective view of an electrical assembly that includes a printed circuit board and five of the edge-connector sockets of FIG. 24.

FIG. 27 is a perspective view of an electrical assembly 84 that includes a printed circuit board (PCB) 84*a* that has five of the edge-connector sockets 82 mounted on PCB 84*a*. Copper trace lines 84*b* on PCB 84*a* connect the sockets 82 in series. PCB 84*a*, copper trace lines 84*b* and the edge-connector sockets 82 can be designed and sized to handle up to nearly any amount of current, preferably up to about 1,000 A. The five edge-connector sockets 82 are illustrated as being mounted horizontally in a vertical column, but any desired arrangement can be used, including having PCB 84*a* in a horizontal position with the sockets 82 in an upright, vertical position.

FIG. 28 is a side elevation in cross-section of an electrical assembly 86 that includes a double-sided printed circuit board (PCB) 86*a* that has four edge-connector sockets 82 mounted on PCB 86*a*. Copper trace lines 86*b* on PCB 86*a* connect the sockets 82 in series. The copper trace lines 86*b* are on a first side 86*c* of PCB 86*a*. There are also matching copper trace lines 86*d* on a second side 86*e* of PCB 86*a*. Vias 86*f* are plated through-holes that provide an electrical connection between the copper traces 86*b* on side 86*c* to the copper traces 86*d* on side 86*e*. The copper traces 86*d* are arranged the same as the copper traces 86*b*. The edge-connector sockets 82 provide continuity or connectivity for the copper trace lines 86*b* because the opposing spring fingers 82*c* touch each other and provide an electrical path, a circuit, through the otherwise isolated parts of the socket 82.

An important aspect of the edge-connector sockets 82 shown in FIG. 28 is that the sockets 82 provide double polarity. A module 88 has an edge connector 88*a*, which is received in the lowermost edge connector socket 82. The edge connector 88*a* has conductors 88*b* on a lower side and conductors 88*c* on an upper side. The edge connector 88*a* spreads the spring fingers 82*c* apart from one another, and the lower side conductor 88*b* is in electrical contact with the lower spring fingers 82*c*, and the upper side conductor 88*c* is in electrical contact with the upper spring fingers 82*c*. The parts of the socket 82 other than contact between the upper and lower spring fingers 82*c* are electrically isolated from each other. Direct current having a positive polarity flows through the upper set of spring fingers 82*c* into the upper side conductor 88*c*, through electrical devices in the module 88, out through the lower side conductor 88*b*, into the lower set of spring fingers 82*c* and out into the copper trace lines 86*b* with a negative polarity.

Similarly, a module 88*f* is plugged into another one of the edge connector sockets 82. Direct current having a positive polarity flows into electrical contacts on an upper surface 88*g* of an edge connector 88*h* of a PCB 88*i* through traces on the upper surface 88*g* through electronic devices and components in the module 88*f* through the PCB 88*i* into electrical contacts on a bottom surface 88*j* of the edge connector 88*h* and into the copper trace lines 86*b* on PCB 86*a* with a negative polarity. Direct current flows into the module 88*f* with a positive polarity and out of module 88*f* with a negative polarity. Edge connector sockets 82 provide double polarity, which is possible because the isolators 82*m*, 82*n* and 82*p* described with reference to FIGS. 24-26 serve to create an electrical current pathway from one side of the socket 82 to the other side of the socket 82 through only the spring fingers 82*c*. Direct current flows from a positive polarity to a negative polarity through the modules 88 and 88*f* while they are plugged into one of the sockets 82.

A module 88*k* has been pulled out of or not yet been pushed into the uppermost socket 82. The uppermost socket 82 and the third one down are empty sockets. Arrows 87 indicate the direction of current flow. The curved arrow 87 on the third socket 82 down from the top of PCB 86*a* indicates that when one of the sockets 82 is empty, the spring fingers 82*c* on the opposing sides of the socket 82 are touching and provide an electrical flow path through the empty socket 82. Socket 82 is shorted while it is empty. When no edge connector is plugged into a socket 82, the socket 82 is a conductor through one set of its spring fingers 82*c* being in contact with its other set of spring fingers 82*c*. Current arrows 87 by the second socket 82 down from the top show current, which has a positive polarity, flows into module 88*f* through electrical contacts on the upper surface 88*g* of the edge connector 88*h* and out through electrical contacts on the bottom surface 88*j* of the edge connector 88*h* with a negative polarity.

The double-sided PCB 86*a*, the copper trace lines 86*b* on PCB 86*a*, the vias 86*f*, the copper traces 86*d* on side 86*e* of PCB 86*a* and the edge-connector sockets 82 are preferably designed and sized for high current, such as at 1,000 A. The sockets 82 are sized and designed to be double-polarity, high-current, edge-connector sockets. Modules 88, 88*f* and 88*k* can be plugged in or pulled out at will while current flows through the copper traces 86*b* and 86*d* and through the sockets 82. The double-sided PCB 86*a* can be placed in a cabinet such as was described with reference to FIGS. 19 and 22. The power supply system 70 described with reference to FIG. 19 or the power supply system 80 described with reference to FIG. 22 can be connected by cables to provide power and charge/discharge capability to the double-sided PCB 86*a*. There are many different uses for the present inventions, and forming and testing batteries in parallel and in series is an important application for the present invention. The double-polarity, high-current, edge-connector sockets 82 of FIGS. 24-26, the combination of the sockets 82 and the double-sided PCB 86*a* in FIG. 28, and the high-current, high-density power supply system 70 of FIG. 19 or 80 of FIG. 22 can be used to form and test batteries in parallel and in series, according to the present invention.

FIG. 29 is a side elevation of a serial-parallel testing module (SPTM) 90 for forming and testing batteries, according to the present invention. An alternative embodiment of a serial-parallel testing module, SPTM 62, was described above with reference to FIG. 17. SPTM 90 can be one of the modules 88, 88*f* and 88*k* described immediately above with reference to FIG. 28. SPTM 90 comprises a printed circuit board (PCB) 90*a*, which has an edge connector 90b, which operates as described for module 88 in FIG. 28. The edge connector 90b can be plugged into one of the double-polarity, high-current, edge-connector sockets 82 of FIGS. 24-26 as illustrated in the combination of the sockets 82 and the double-sided PCB 86a in FIG. 28. A control-and-measurement unit 90c is operatively received on the PCB 90a.

FIG. 30 is a top view of the SPTM 90 of FIG. 29. The edge connector 90b is illustrated as spanning about one-third of the width of the PCB 90a, which is a design choice that may vary with a particular application. The control-and-measurement unit 90c is illustrated schematically as a rectangular box, but may be a number of different electronic devices and components spread across the PCB 90a. SPTM 62 of FIG. 17 was illustrated as having sockets for receiving battery holders. A plurality of batteries 90d are schematically illustrated as being received on PCB 90a in SPTM 90 of FIG. 30. The batteries 90d in the module 90 are connected in parallel and in series and have one pair of terminals for a battery group to connect to a charge/discharge current source through the edge connector 90b. Multiple SPTM 90 can be connected in series to share one charge/discharge regulator. SPTM 90 is illustrated as having 4 groups of batteries 90d connected in a serial mode. Each group has 4 batteries connected in parallel. This is referred to as a S4P4 configuration, and SPTM 90 can hold a total 16 batteries 90d. The group of 16 batteries 90d have a pair of terminals to accept current through the edge connector 90b. The edge connector 90b of SPTM 90 can be plugged into one of the double-polarity, high-current, edge connector sockets 82 illustrated in FIG. 28. Power and charge/discharge capability can be provided to the double-polarity, high-current, edge connector sockets 82 by power supply system 70 described with reference to FIG. 19 or power supply system 80 described with reference to FIG. 22.

A plurality of batteries connected together in parallel and in series, such as described for SPTM 90 in FIGS. 29 and 30, can be formed and tested using the power supply systems 70 and 80, the double-sided printed circuit board 86a in FIG. 28, the double-polarity, high-current, edge connector sockets 82, and other equipment and modules necessary to implement and control the formation and testing. Batteries can also be aged and sorted using this same arrangement of equipment and components. FIGS. 29 and 30 are simplified for explanatory purposes. Battery manufacturing is done on a very large scale, so battery formation and testing equipment is also preferably provided on a large scale.

Figure 31:
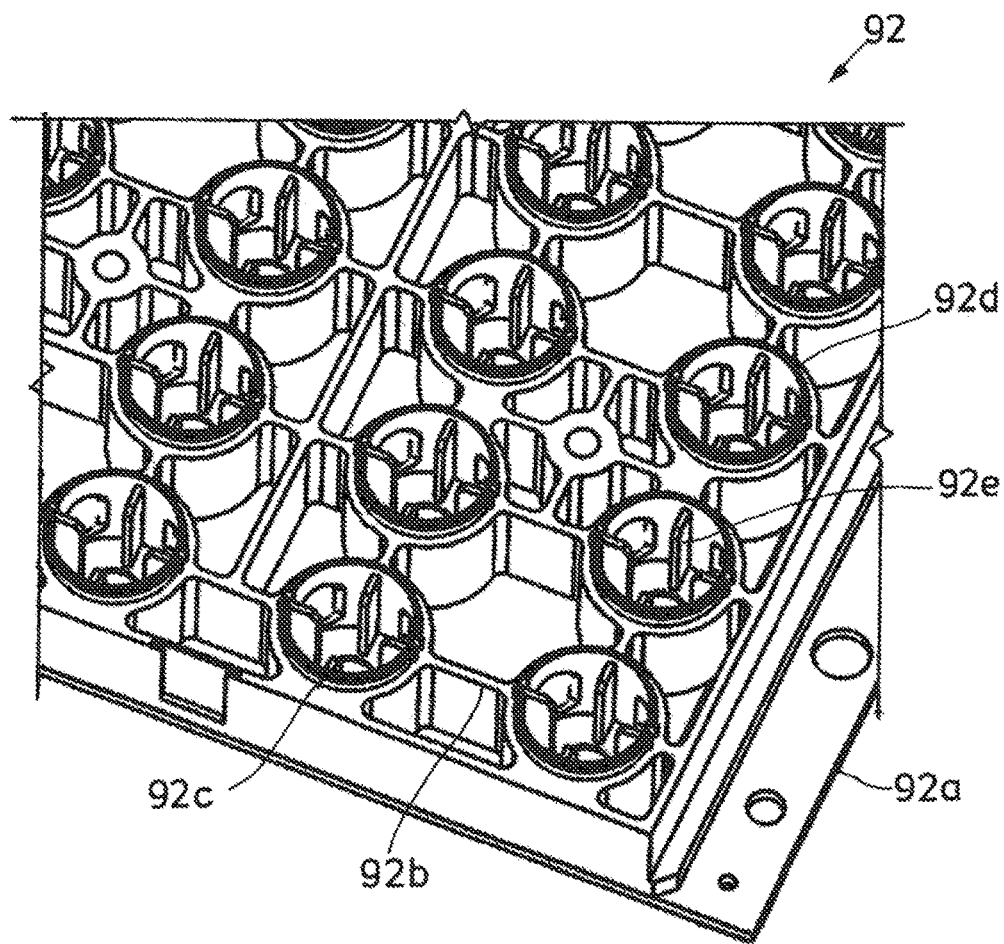
FIG. 31 is a partial perspective view of a battery tray used to hold a plurality of batteries.
Figure 32:
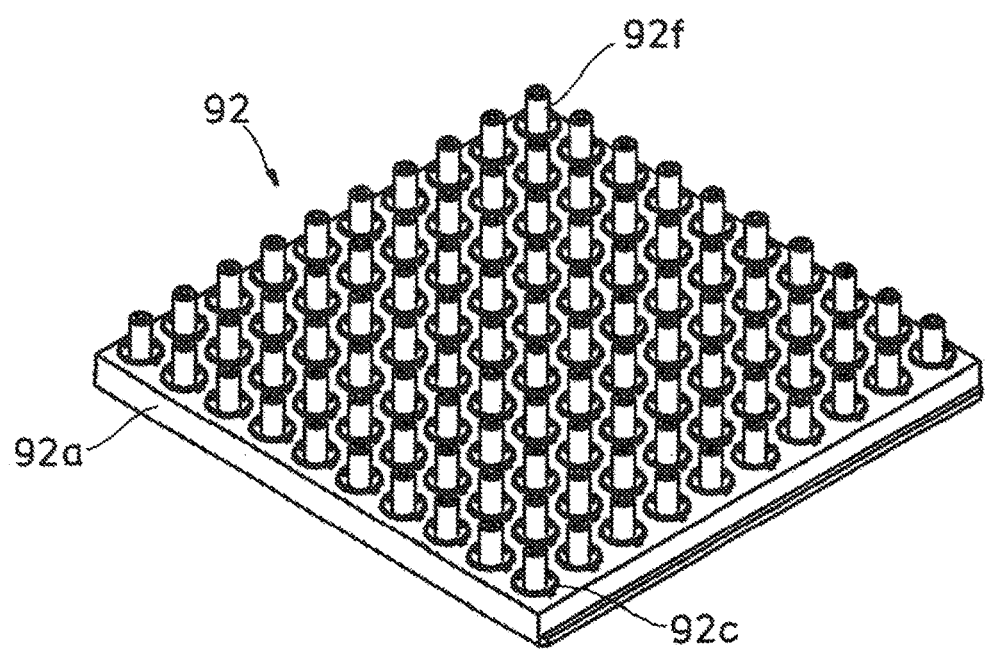
FIG. 32 is a perspective view of the battery tray of FIG. 31 holding 100 batteries.

FIG. 31 is a partial perspective view of a battery tray 92, which is used to hold a plurality of batteries. Battery tray 92 is a simple, plastic structure, which does not provide contact to battery terminals, control and testing devices and layouts or safety monitoring of voltage for each battery during an aging process, contrary to the SPTM 90, which does provide these functions. Battery tray 92 has a strong, rigid base 92a, a web structure 92b that extends upwardly from the base 92a, which adds rigidity and strength for supporting the weight of batteries. Cylindrical battery holders 92c extend upwardly from the base 92a and are supported by the base 92a and the web structure 92b. The battery holders 92c and open on an upper end 92d and have guide posts 92e that receive, hold and center a battery within a battery holder 92c. The base 92a has a small hole (not shown) below the center of each battery holder 92c for providing access to the battery for formation and testing. FIG. 32 is a perspective view of battery tray 92 holding 100 batteries 92f. Each of the batteries 92f is received in a respective battery holder 92c. Battery tray 92 has 100 battery holders 92c arranged in a ten-by-ten grid. FIG. 32A is a front elevation of the battery tray 92 in which the batteries 92f have been received.

Figure 33:
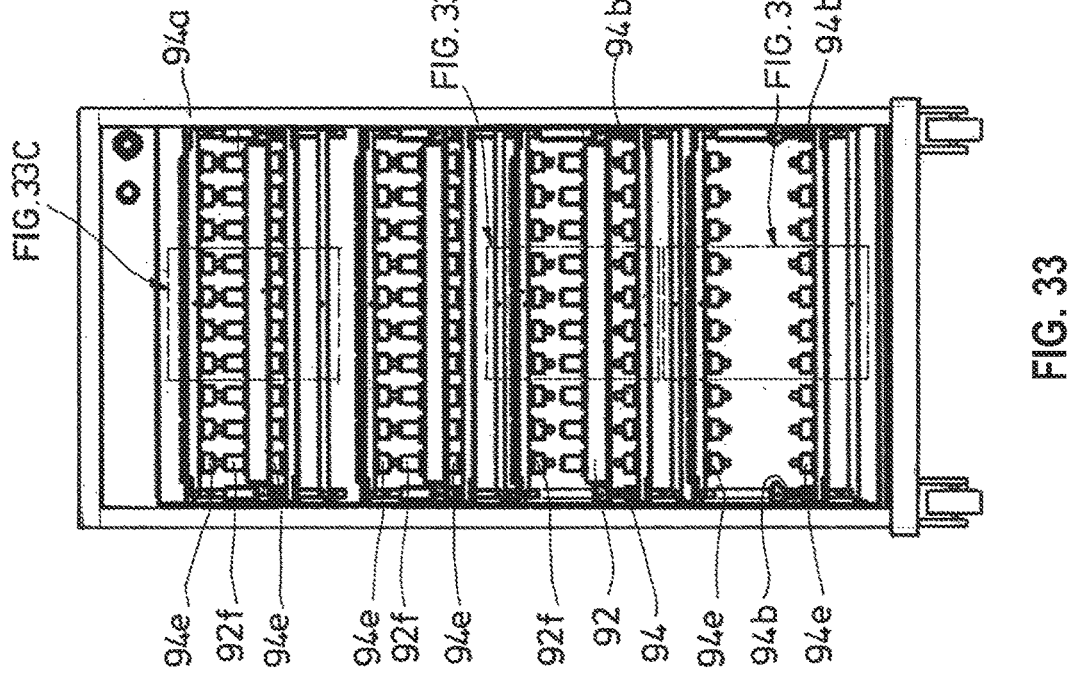
FIG. 33 is a front elevation of a battery formation and testing system.
Figure 33A:
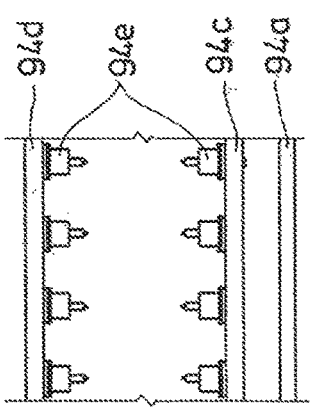
FIG. 33A is an enlarged view of a portion of the system of FIG. 33 showing opposing pogo probes.
Figure 33B:
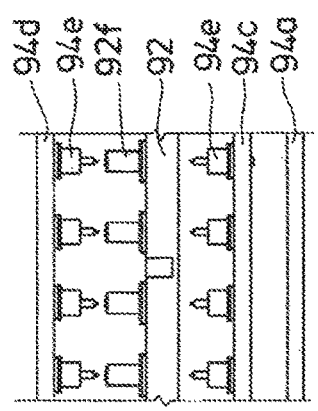
FIG. 33B is an enlarged view of a portion of the system of FIG. 33 showing batteries received between the opposing pogo probes.
Figure 33C:
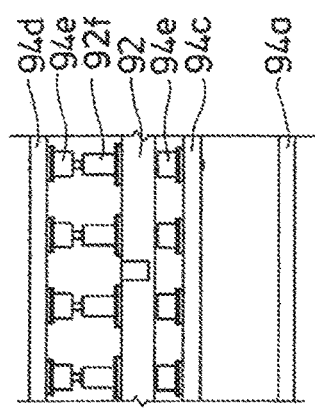
FIG. 33C is an enlarged view of a portion of the system of FIG. 33 showing the opposing pogo probes engaged with a plurality of batteries.

FIG. 33 is a front elevation of a battery formation and testing system 94 in a cabinet that is defined by an outer frame 94a and pairs of racks or guides 94b for receiving the battery trays 92. FIG. 33A is an enlarged view of a portion of the battery testing cabinet 94 in which no battery tray 92 has been received. FIG. 33A shows lower and upper probe supports 94c and 94d, respectively. Opposing lower and upper spring-loaded needle probes called pogo probes 94e are received on the lower and upper probe supports 94c and 94d. The battery testing cabinet 94 has one pair of lower and upper pogo probes 94e for each battery that is tested. FIG. 33B is an enlarged view of a portion of the battery testing cabinet 94 in which a battery tray 92 has been received, which holds 100 batteries 92f. Battery tray 92 in FIG. 33B has been received in the cabinet 94a and is resting on the racks or guides 94b, but the pogo probes 94e have not been engaged with the batteries 92f. FIG. 33C is an enlarged view of a portion of the battery testing cabinet 94 in which a battery tray 92 holding 100 batteries 92f has been received in the cabinet 94a. Battery tray 92 is resting on the racks or guides 94b, and the pogo probes 94e have been moved toward and have been engaged with the batteries 92f.

Typically, each pair of racks or guides 94b receives a respective battery tray 92 with 100 batteries prior to starting a battery formation and testing operation. Each pogo probe 94e has to align with a hole in the base 92a of the battery holder 92 below a battery 92f and contact its respective battery 92f as the lower probe support 94c is moved into position. Simultaneously, each of the pogo probes 94e on the upper probe support 94d has to align with an upper end of its respective battery 92f as the upper probe support 94d is moved into position for contact between the pogo probes 94e and the batteries 92f. A great deal of precision is required for this mechanical motion, and a great deal of maintenance may be required to keep the pogo probes 94e operational and in proper alignment. Each of the pogo probes 94e is wired to a low current, low voltage, low power battery formation or testing system. Typically, about four wires are used to connect each of the batteries 92f in the cabinet 94 to a battery formation and testing system. Consequently, a massive amount of cabling is required to connect a battery formation and testing system to the battery formation and testing cabinet 94 in FIG. 33.

FIG. 34 is a partial perspective view of a battery tray 100, according to the present invention. A printed circuit board (PCB) 100a has a plurality of battery holders 100b. Each battery holder 100b has a positive terminal 100c in the center of a magnetic ring 100d and a pair of spring fingers 100e outside of the magnetic ring 100d, which are bent to have a curved portion between an end fixed to the PCB 100a and an opposing free end. The curved portion of the spring fingers 100e is closer to the center of the magnetic ring 100d than the fixed and free ends of the spring fingers 100e. Each of a plurality of batteries 100f is received in a respective battery holder 100b. The magnetic ring 100d attracts a ferromagnetic case around a lithium-ion battery and holds a respective battery 100f in contact with the positive terminal 100c. The spring fingers 100e receive a respective battery 100f in spaced-apart free ends and hold the battery with their closer-together curved portions. The curved portions of a pair of spring fingers 100e contact the ferromagnetic case around a battery 100f and function as a negative terminal. The fixed end of the spring fingers 100e is connected to the PCB 100a. The positive terminal 100c and the negative terminal 100e are each connected to a separate trace on the PCB 100*a*. A plastic cylinder 100*g* surrounds each battery holder 100*b* for holding and supporting a battery 100*f* in a battery holder 100*b*. Plastic cylinders 100*g* are fixed to the PCB 100*a*.

FIG. 34A is a top plan view of battery tray 100 holding one hundred batteries 100*f*. Battery tray 100 is a serial-parallel testing module. Electronic devices and components are integrated in PCB 100*a*. Some of the electronic devices and components are grouped in a control and measurement module 100*h*, which is integrated with PCB 100*a*. PCB 100*a* has an edge connector 100*i*. Battery tray 100 is a module similar to the module 88 described with reference to FIG. 28. The edge connector 100*i* can be plugged into the double-polarity, high-current edge-connector socket 82 described with reference to FIGS. 24-28. FIG. 34B is a side elevation of the battery tray 100 of FIG. 34A. Battery tray 100 has electronic devices and components 100*j* and electrically-conductive traces 100*k* on a lower side 100*m*, and the battery holders 100*b* and the batteries 100*f* are on an upper side 100*n*. Traces are also provided on the upper side 100*n* of the board. The positive and negative terminals 100*c* and 100*e*, respectively, are connected indirectly through circuit traces and components for parallel and serial connections to different sides of the edge connector 100*i*. Current having a positive polarity is delivered from one side of the double-polarity, high-current edge-connector socket 82 to the positive terminal 100*c* of the battery holder 100*b*. Current having a negative polarity is passed from the negative terminal 100*e* of the battery holder 100*b* to the other side of the double-polarity, high-current edge-connector socket 82. Connectors 100*p* and 100*q* are provided for connections for power, control, measurement and internet.

Battery tray 100 integrates battery holders and terminal connections with a printed circuit board and uses traces to connect batteries to electronic components and devices and to an edge connector and other connectors. Battery tray 100 can be plugged into a battery testing system. The traditional battery tray 92 described with reference to FIGS. 31 and 32 does not does not incorporate any wiring or electronics, as it is just a plastic structure for holding batteries. Battery tray 100 may be referred to as a smart battery tray herein because it not only holds batteries, but also connects the batteries through sophisticated electronics to CME module 104*f* and to the battery testing system through the double-polarity edge connection.

The smart battery tray 100 has the following advantages over the traditional battery tray 92 of FIGS. 31 and 32 and the traditional battery formation and testing system 94 described above with reference to FIG. 33. Massive cables are required between the battery testing system and the pogo probes in engagement system 94 because four wires are needed per cell position. The present invention needs only 4 wires, two for current output and two for voltage measurement, between the battery testing system and the batteries for up to thousands of batteries. The pogo probes of the traditional system 94 require precision operation and a great deal of maintenance, but are not required for the present invention. The traditional battery formation and testing system 94 of FIG. 33 required a bulky machine and system and pogo probes for engaging batteries, which are not required in the present invention. The battery holders 100*b* of the present invention provide a built-in battery engagement and holding mechanism, where the magnetic ring 1004 is used to keep a battery in place and to keep good contact between the battery and the positive terminal 100*c* on the tray 100. The smart battery tray 100 not only eliminates the need for the bulky engagement equipment 94 of FIG. 33, it also eliminates the need for the extra battery holder 92 and the plug and the socket to accept and engage the batteries in the battery tray 92.

Figure 35:
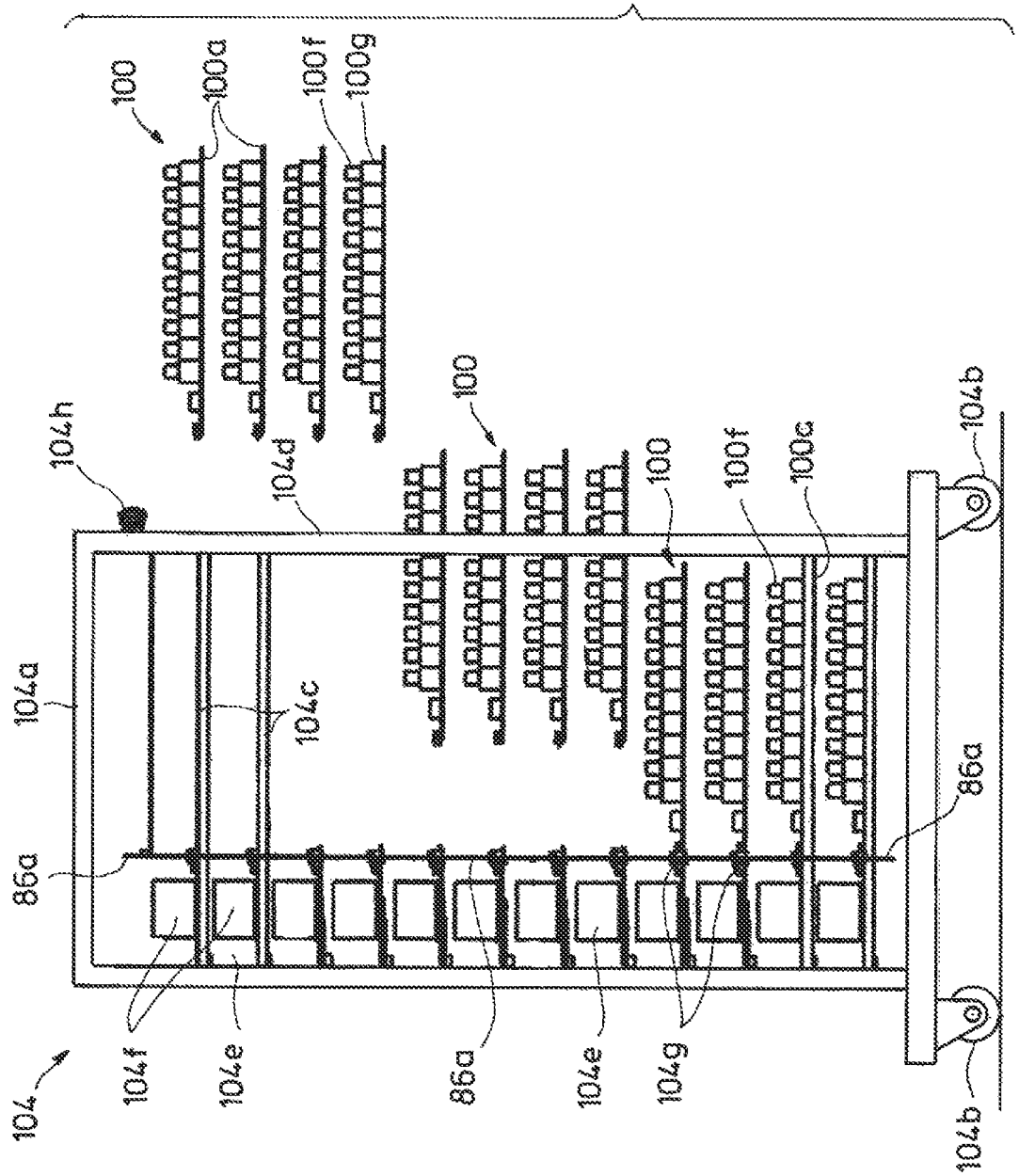
FIG. 35 is a side elevation of a battery formation rack, according to the present invention.

FIG. 35 is a side elevation of a battery formation rack 104. Battery formation rack 104 comprises a cabinet 104*a* on wheels 104*b*. Rack 104 has twelve shelves, guides or rails 104*c* for receiving the battery trays 100 described with reference to FIGS. 34, 34A and 34B. Shelves 104*c* preferably comprise a pair of rails with one rail on one side of the cabinet, and the other rail on the other side of the cabinet. Side edges of PCB 100*a* of the battery tray 100 slide into the pair of rails. The bottom four shelves 104*c* are illustrated as having received one of the battery trays 100 on each shelf 104*c*. The top four shelves 104*c* are illustrated as being empty and ready to receive a battery tray 100 on each shelf 104*c*, and four battery trays 100 are shown outside of the cabinet 104*a* and adjacent to respective shelves 104*c*. The middle four shelves 104*c* are illustrated as having partially received one of the battery trays 100 on each shelf 104*c*. The cabinet 104*a* has an open front entry 104*d* for each of the shelves 104*c* for receiving a respective battery tray 100. The cabinet 104*a* has a back portion 104*e* for each shelf 104*c*. A control, measurement and equalizer (CME) module 104*f* is received in the back portion 104*e* for each of the shelves 104*c*.

The double-sided printed circuit board (PCB) 86*a* described with reference to FIG. 28 is received in a vertical orientation in cabinet 104*a* adjacent to the CME modules 104*f*. Each CME module 104*f* is fixed in the cabinet 104*a* between a back wall of the cabinet and the PCB 86*a*. PCB 86*a* is part of the electrical assembly 86 described with reference to FIG. 28, which includes a double-polarity, high-current, edge-connector socket 104*g* at each shelf 104*c* for receiving the edge connector 100*i* for each battery tray 100 received in the battery formation rack 104. The edge-connector sockets 104*g* are as described for the edge-connector socket 82 in FIGS. 24 and 28. A battery testing system, such as the power supply 80 of FIG. 22, is connected through a cable (not shown) to a socket 104*h*, which is connected to PCB 86*a* and its edge-connector sockets 104*g*.

After a battery tray 100 is placed in its respective guide rails 104*c* in the battery formation rack 104, the edge connector 100*i* is pushed into and engaged with its respective double-polarity, high-current, edge-connector socket 104*g*. Although not visible in FIG. 35, PCB 86*a* has an opening adjacent to each CME module 104*f*. The battery tray 100 is simultaneously connected to or plugged into the CME module 104*f* as the battery tray 100 is plugged into the edge connector socket 104*g*. One of the connectors 100*p* or 100*q* adjacent to the edge connector 100*i* connects to its respective CME module 104*f*. Twelve of the battery trays 100 are loaded into the battery formation rack 104 and plugged into their respective edge-connector socket 104*g* and CME module 104*f*.

The double-sided printed circuit board 86*a* of the electrical assembly 86 described above with reference to FIG. 28 is used in the battery formation rack 104 in FIG. 35. The edge-connector sockets 104*g* are on the double-sided printed circuit board 86*a*. The battery trays 100 are plugged into the edge-connector sockets 104*g*, which are operatively connected to the double-sided printed circuit board 86*a*. The battery trays 100, through one of the connectors 100*p* or 100*q*, simultaneously plug into the CME modules 104*f* through openings in the double-sided printed circuit board 86*a*. A battery testing system, preferably the power supply system 80 described with reference to FIG. 22, is connected by a cable through socket 104*h* to the double-sided printed circuit board 86*a*, and through the bus board 86*a* to all of the sockets 104*g* serially, for formation, testing, charging and discharging the batteries 100*f* that have been loaded into the battery formation rack 104. The CME modules 104*f* may not be needed if their functionality is provided on the smart battery trays 100. FIG. 35 illustrates that 1,200 of the batteries 100*f* can be formed and tested simultaneously in the battery formation rack 104. After the batteries 100*f* have been formed and tested in the battery formation rack 104, each of the twelve battery trays 100 is moved to a battery aging rack. A battery aging rack according to the present invention looks to be identical to the battery formation rack 104 described with reference to FIG. 35, except a measurement module is substituted for each of the CME modules 104*f* for monitoring battery voltage.

Figure 36:
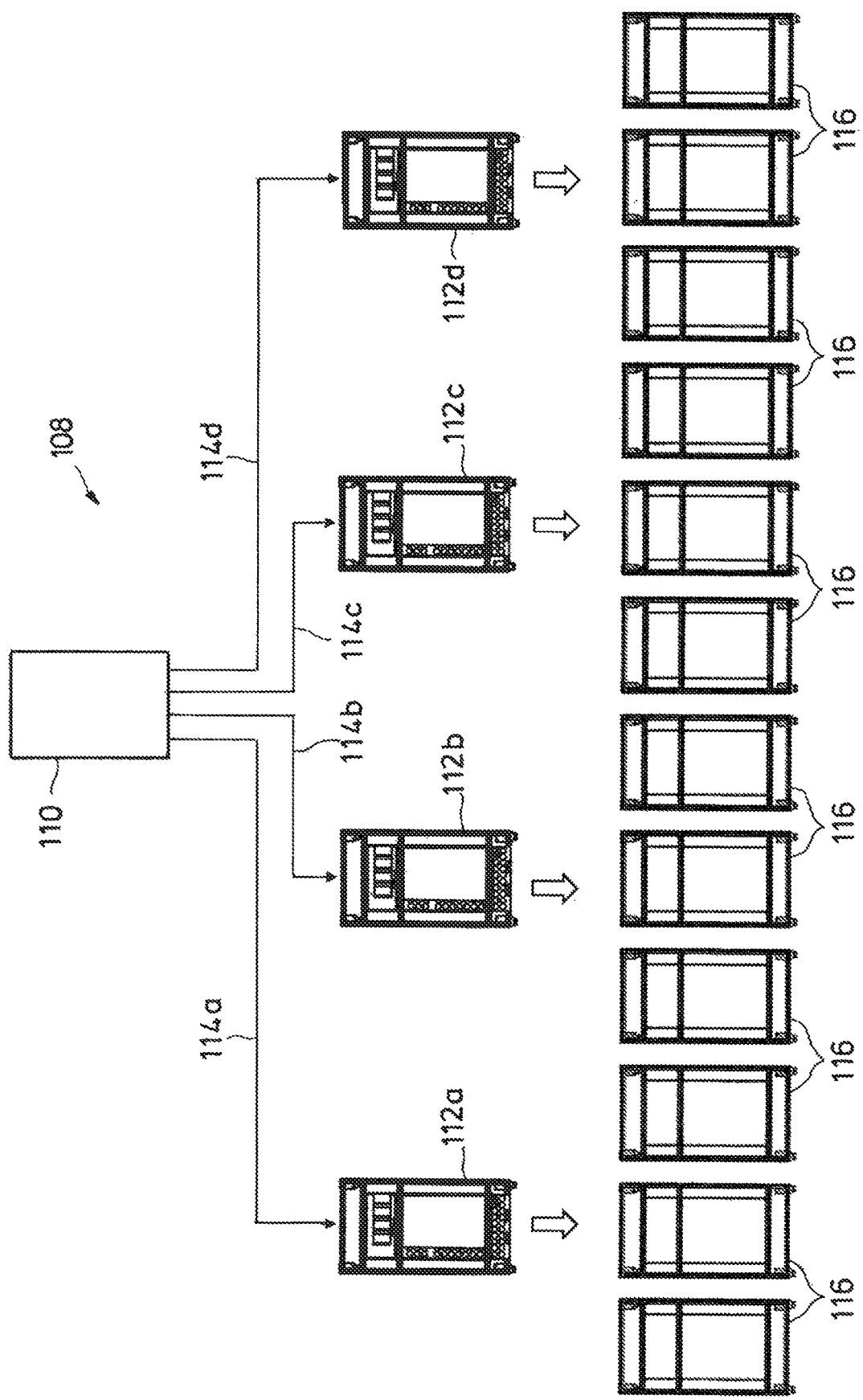
FIG. 36 is a block flow diagram for a process for forming and testing batteries according to the serial and parallel formation and testing technology of the present invention.

FIG. 36 is a simplified block flow diagram 108 for a process for forming and testing batteries according to the serial and parallel formation and testing technology of the present invention. A battery test system 110 is provided, which may be built according to the descriptions provided above for the power supply systems 70 and 80, which were described above with reference to FIGS. 19 and 22, respectively. As an example, the battery test system 110 may have four channels providing about 250 volts, about 200 amps and about 5,000 watts for each channel. The battery test system 110 is operatively connected to four battery formation racks 112*a*, 112*b*, 112*c* and 112*d*, each of which is the same as the battery formation rack 104 described above with reference to FIG. 35. Each of the four battery formation racks 112*a*, 112*b*, 112*c* and 112*d* holds 1,200 batteries. Cables 114*a*, 114*b*, 114*c* and 114*d* connect the battery formation racks 112*a*, 112*b*, 112*c* and 112*d*, respectively, to a respective channel in the battery test system 100. Each of the cables 114*a*, 114*b*, 114*c* and 114*d* requires only four wires, two for current output and two for voltage measurement, for forming and testing 1,200 batteries in its respective battery formation rack 112. This is a significant contrast to the wiring and cabling required for the traditional battery formation and testing system 94 described above with reference to FIG. 33, which has lower and upper pogo probes for each battery that require four wires per battery.

Each of the battery formation racks 112*a*, 112*b*, 112*c* and 112*d* holds 1,200 batteries, which is twelve of the battery trays 100 described with reference to FIGS. 34. 34A and 34B. After a set of 1,200 batteries is formed and tested, the set of twelve battery trays that hold 100 batteries each are moved to one of a number of battery aging racks 116 for periodically checking the voltage of each battery to detect any bad batteries.

The present inventor has been issued the following U.S. patents, which provide background information and systems and equipment that can be used to implement the present invention. U.S. Pat. No. 5,903,154, issued May 11, 1999; U.S. Pat. No. 5,966,014, issued Oct. 12, 1999; U.S. Pat. No. 6,291,972, issued Sep. 18, 2001; and U.S. Pat. No. 10,161,963, issued Dec. 25, 2018, were issued to Zhang or Zhang et al. and are incorporated by reference in their entirety for all purposes. The present inventor filed U.S. patent application Ser. No. 16/509,685 on Jul. 12, 2019, which was published as Pub. No. US 20200064407 A1 on Feb. 27, 2020, and which is incorporated by reference in its entirety for all purposes.

Embodiments of the Invention

A mechanism and method to use one BTS channel to test multiple batteries simultaneously. It is realized by connecting each battery serially to a passive PTMD to form a PTMD/battery combination, then connecting the battery/PTMD combinations in parallel and then connect the parallel battery/PTMD group to a BTS channel. The BTS channel provides programmed current, voltage or power, and current is distributed to each battery in a balanced manner, and all batteries' voltage are equal within a precision range.

A device named as PTMD herein is to be used in parallel mode and comprises passive electronic components such as a relay, a resistor and a current transducer. It provides to each battery connected to it the following functions: current switching, measurement of current and voltage, current limitation during pre-equalization and protection.

A circuit named as pre-voltage equalizer/current limiting circuit herein comprises a current-limiting resistor and an auxiliary relay, which are connected in parallel to a main relay. The pre-voltage equalizer/current limiting circuit is used to get batteries to reach pre-balanced status and for current limiting during a starting stage of testing and formation.

A current transducer such as a shunt or a Hall-effect component connected in series with each battery in a PTMD to measure all current through the battery, including equalization current, for precise measurement and calculation of current and charge/discharge capacity through the battery.

A current switch such as a relay connected in series with each battery in PTMD to cut off and isolate a problematic battery, such as battery in shortage, for safety protection. The current switch can be used also for switching current transducers during automatic current calibration process.

A mechanism or method to parallel connect a voltage equalizer to a parallel PTMD/battery group, then connect multiple such groups of parallel PTMD/battery group-and-equalizer in series. The equalizer gets energy for equalization from an equalization power supply. Connect such serial-parallel combination to a BTS channel or charge/discharge current source for testing, formation and charging of all batteries in the combination simultaneously under the same voltage and balanced-current distribution.

A device named as PSTMD constructed by paralleled multiple PTMD and an equalizer in the manner described above.

A device named as STMD constructed by a current transducer connected in parallel with a voltage equalizer through a battery, which is in series with the current transducer. A mechanism or method to connect multiple combinations of a single battery and an STMD as described above in a serial manner, which is then connected to a BTS channel or to a charge/discharge current source for testing, formation and charging of all batteries in the combination simultaneously under the same voltage and balanced-current distribution.

The function of the voltage equalizer is to get all batteries to reach high consistency during a whole testing process, instead of only for the safety of a battery pack. The voltage equalizer gets energy from a dedicated power source for equalization instead of from a charge/discharge power source or from batteries undergoing testing. A BTS channel provides a main charge and discharge current. A voltage equalizer provides a fine-tuning current so that all batteries are under the same voltage. The BTS channel and the voltage equalizer coordinate with each other. In a current-control process, equalizer voltages are adjusted to a target in which the accumulated equalizer current reaches a value close to zero. In a constant-voltage-control process, the voltage of equalizer is set to the desired value, and the current in the BTS channel is adjusted to a target in which the accumulated equalizer current reaches a value close to zero. One preferably uses a dedicated power supply to provide power to all the voltage equalizers for voltage equalization.

The voltage equalizer preferably has a control precision better than 0.1% of full voltage range. The voltage equalizer coordinates with the main charge/discharge channel all of the time and over the full range of voltage. The voltage equalizer can realize CC, CV and CCCV functions without affecting smoothness during a CC-to-CV transition. The current required for the equalizer is roughly less than one-tenth (1/10th) of the current required for testing of a battery or a parallel battery group. The voltage equalizer is electrically isolated from its equalizer power supply by a DC-to-DC converter and has a sophisticated voltage regulator to provide programmable, precise voltage control over a wide range. The voltage equalizer is bidirectional, which allows it to both charge and discharge a battery.

A device or equipment named as an SPTM module integrates a PTMD or an STMD or a PSTMD and related control/measurement circuit, voltage equalization power source, control power source, communication ports and battery/battery pack's connectors and other components and circuits together. The SPTM can connect to a BTS channel or to a charge/discharge current source for testing, formation and charging of all batteries simultaneously.

A device or equipment named as ISPTM module integrates an SPTM with a BTS channel for testing, formation and charging of all batteries simultaneously.

A mechanism or method to connect multiple SPTM modules in series and then connect to a BTS channel for testing, formation or charging of all batteries simultaneously.

An SPTM or an ISPTM that has a thermal isolator sealing block for separating a battery section from a temperature-sensitive electronics section. The SPTM or an ISPTM has a battery section that can be slid into a temperature chamber through a rectangular slot, while leaving temperature-sensitive electronics outside the temperature chamber with the thermal isolator sealing block sealed against the temperature chamber.

A temperature chamber having rectangular slots or openings for receiving and accommodating multiple SPTM and/or ISPTM. Empty slots can be sealed while testing modules in other slots.

The present invention is not limited to a single battery. The present invention can be used with a battery pack and with a super-capacitor and other energy storage devices. The present invention is not limited to testing. The present invention can be used in formation and charging of batteries.

A method in battery testing, especially in parallel-serial testing, for measurement of battery capacity and coulombic efficiency using both CCCV charge and CCCV discharge instead of CCCV charge and CC discharge.

One embodiment of the present invention is a system for forming and testing batteries comprising:
a module;
a regulator in electrical contact with the module, wherein the regulator is attachable to a source of current, and wherein the regulator can be used to output a current;
a plurality of battery holders, wherein the holders are in electrical contact with the module, wherein the holders are divided into subgroups that are connected together in parallel to form two or more parallel subgroups, wherein the parallel subgroups are connected together in series to form a parallel-serial battery group; and
a voltage equalizer attached to the opposing terminals of the parallel subgroups, wherein the voltage equalizer is attachable to a current source,
wherein the module, the regulator, the one or more holders and the voltage equalizer are designed and made for operating in a mode in which:
(a) the regulator receives current and outputs current to the terminals of the parallel-serial battery group; and
(b) the voltage equalizer receives current and outputs current to the terminals of each parallel subgroup, wherein the voltage equalizer outputs current at the same time that the regulator outputs current, wherein the voltage equalizer operates in a manner such that the voltage across the terminals of each parallel subgroup is maintained at an approximately equal value while the regulator outputs current to the parallel-serial battery group.

It is apparent that the above-described embodiments are merely examples for the sake of clarity, and are not intended to limit the embodiments. Other variations or modifications may be made by those skilled in the field of the above-described technology. There is no need and no way to describe all possible implementations. Obvious changes or variations resulting therefrom are still within the scope of the invention.

What is claimed is:

1. A circuit assembly for forming and testing batteries comprising:
 a battery testing system (BTS) having channels for testing multiple batteries simultaneously;
 a parallel test management device (PTMD) for each battery, wherein each PTMD connects to its respective battery serially to form a PTMD-battery combination, the PTMD comprising:
  a main relay or switch for connecting to a battery;
  a current transducer or shunt connected in series with the main relay or switch, wherein each of the current transducer and the shunt is configured to measure current through the respective battery; and
  an auxiliary relay connected in series with a current limiting resistor, wherein the auxiliary relay and the current limiting resistor are parallel to the main relay; and
 circuits for connecting PTMD-battery combinations in parallel to form parallel PTMD-battery groups and for connecting the parallel PTMD-battery groups to a BTS channel,
 wherein the BTS channel is configured to provide programmed current, voltage or power, wherein the BTS channel is configured to pass current through each battery in a parallel PTMD-battery group, wherein current is distributed to each battery in a balanced manner, and
 wherein the BTS channel is configured to provide programmed current, voltage or power to multiple batteries simultaneously, thereby forming or testing multiple batteries with one BTS channel.

2. The circuit assembly of claim 1, further comprising means for maintaining voltage across each battery in the parallel PTMD-battery groups approximately equal within a desired precision range.

3. The circuit assembly of claim 1, wherein the current transducer or shunt is capable of measuring equalization current and all other current through a battery for precise measurement of and calculation of current and charge/discharge capacity through the battery.

4. The circuit assembly of claim 1, wherein the main relay or switch is capable of isolating a battery that has a problem such as a short, and wherein the main relay or switch is capable of connecting and disconnecting the current transducer for a current calibration process.

5. The circuit assembly of claim 1, further comprising means for maintaining voltage across each battery in the parallel PTMD-battery groups approximately equal within a desired precision range, wherein the current transducer or shunt is capable of measuring equalization current and all other current through a battery for precise measurement of and calculation of current and charge/discharge capacity through the battery, wherein the main relay or switch is capable of isolating a battery that has a problem such as a short, and wherein the main relay or switch is capable of connecting and disconnecting the current transducer for a current calibration process.

6. A circuit assembly for forming and testing a plurality of batteries, the circuit assembly comprising:
    a battery testing system (BTS) having channels for testing multiple batteries simultaneously;
    a parallel test management device (PTMD), as recited in claim 1, for each battery, wherein each PTMD connects to its respective battery serially to form a PTMD-battery combination, wherein the main relay or switch of the PTMD is capable of isolating a battery that has a problem, and wherein the current transducer or shunt of the PTMD is capable of measuring equalization current and all other current through a battery for precise measurement of and calculation of current and charge/discharge capacity through the battery;
    circuits for connecting PTMD-battery combinations in parallel to form a parallel PTMD-battery group and for connecting the parallel PTMD-battery groups to a BTS channel, wherein the BTS channel provides programmed current, voltage or power, and wherein current is distributed to all batteries in a balanced manner,
    wherein a BTS channel is connected to the parallel PTMD-battery group, and wherein the BTS channel provides a current and voltage source for charging and discharging the batteries.

7. The circuit assembly of claim 6, further comprising circuits for connecting two or more parallel PTMD-battery groups in series, thereby forming a parallel-serial battery group; and a voltage equalizer connected to each parallel PTMD-battery group.

8. The circuit assembly of claim 7, further comprising a regulator connected to the parallel-serial battery group.

9. A method for forming and testing a plurality of batteries connected in parallel and in series, the method comprising the steps of:
    assembling components and circuits according to claim 7;
    connecting a PTMD to each battery to form a PTMD-battery combination;
    connecting the PTMD-battery combinations in parallel to form a parallel PTMD-battery group;
    connecting two or more parallel PTMD-battery groups in series to form a parallel-serial battery group;
    connecting a voltage equalizer to each parallel PTMD-battery group;
    connecting an equalizer power supply to the voltage equalizers;
    connecting a BTS channel to the parallel-serial battery group, wherein the BTS channel provides a current and voltage source for charging and discharging the batteries; and
    forming and/or testing the batteries by running current from the BTS and from the equalizer through the plurality of batteries simultaneously.

10. The method of claim 9, wherein the batteries are formed and tested using a current-control process, and wherein equalizer voltages are adjusted to a target in which the accumulated equalizer current reaches a value close to zero.

11. The method of claim 9, wherein the batteries are formed and tested using a constant-voltage-control process, and wherein the equalizer voltages are set to a desired value, and wherein the current in the BTS channel is adjusted to a target value in which the accumulated equalizer current reaches a value close to zero.

12. The method of claim 9, wherein the voltage equalizer has a control precision better than 0.1% of its full voltage range.

13. The method of claim 12, further comprising coordinating the BTS with the voltage equalizer during the formation and testing of the batteries over the full range of voltage under which the batteries are formed and tested.

14. The method of claim 9, wherein the voltage equalizer can realize constant current (CC), constant voltage (CV) and CC-CV functions without affecting smoothness during a CC-to-CV transition.

15. The method of claim 9, wherein the current required for the voltage equalizer is approximately less than one-tenth (1/10th) of the current required for testing a battery or a parallel battery group.

16. The method of claim 9, further comprising electrically isolating the voltage equalizers from the equalizer power supply by a DC-to-DC converter.

17. A serial-parallel testing module (SPTM) for forming and testing a plurality of batteries, the SPTM comprising:
    a circuit board or an alternative means for receiving and connecting to the plurality of batteries and for receiving electrical components and for providing circuits among the electrical components and between the electrical components and the batteries;
    a parallel test management device (PTMD), as recited in claim 1, for each battery, wherein each PTMD connects to its respective battery serially to form a PTMD-battery combination,
        wherein the main relay or switch of the PTMD is capable of isolating a battery that has a problem, and wherein the current transducer or shunt of the PTMD is capable of measuring equalization current and all other current through a battery for precise measurement of and calculation of current and charge/discharge capacity through the battery;
    circuits for connecting PTMD-battery combinations in parallel to form a parallel PTMD-battery group and for connecting the parallel PTMD-battery group to a BTS channel or to a regulated power source, wherein the BTS channel or the regulated power source provides programmed current, voltage or power, and wherein current is distributed to each battery in a balanced manner;
    a voltage equalizer connected to the parallel PTMD-battery group;
    an equalizer power supply connected to the voltage equalizer; and
    a power supply port for receiving an electrical current from an outside source, wherein the BTS or the regulator and the equalizer power supply are connected to the power supply port,
        wherein a BTS channel or the regulator is connected to each PTMD, wherein the BTS or the regulator provides a current and voltage source for charging and discharging the batteries, and wherein the batteries are formed and tested by running current from the BTS or the regulator and from the equalizer through the plurality of batteries simultaneously.

18. The SPTM of claim 17, further comprising a communication port connected to the circuit board or to the alternative means.

19. The SPTM of claim 17, further comprising connectors for connecting to the batteries.

20. The SPTM of claim 17, further comprising circuits for connecting the parallel PTMD-battery groups in series, wherein a voltage equalizer is connected to each parallel PTMD-battery group.

21. The SPTM of claim 20, wherein each PTMD is configured as recited in claim 6, further comprising connectors for connecting to the batteries,
wherein a circuit board is used for receiving and connecting to the plurality of batteries and for receiving electrical components and for providing circuits among the electrical components and between the electrical components and the batteries,
wherein the circuit board is rectangular and has a length and a width, wherein the circuit board has opposing first and second ends along the length,
wherein the power supply port and temperature-sensitive electrical components are located at and near the first end of the circuit board, and
wherein the connectors for connecting to the batteries are located at and near the second end of the circuit board;
further comprising a thermal isolator between the temperature-sensitive electrical components and the connectors for connecting to the batteries.

22. A method for forming, testing and charging batteries comprising:
connecting two or more SPTMs of claim 17 in series;
connecting the SPTMs to a BTS channel; and
passing an electrical current from the BTS through the batteries while simultaneously passing an electrical current through the batteries from the equalizers.

23. A temperature chamber, comprising a box having a front side, wherein the front side has a plurality of slots or openings configured to accommodate an ISPTM according to claim 22.

24. A temperature chamber comprising a box having a front side, wherein the front side has a plurality of slots or openings configured to accommodate an SPTM according to claim 17.

25. The temperature chamber of claim 24, further comprising one or more blank plates for covering and sealing any slots or openings not filled by an SPTM.

26. An integrated serial-parallel testing module (ISPTM) for forming and testing a plurality of batteries, the ISPTM comprising:
a circuit board for receiving and connecting to the plurality of batteries and for receiving electrical components and for providing circuits among the electrical components and between the electrical components and the batteries;
connectors for connecting to the batteries, wherein the connectors are connected to the circuit board;
a battery testing system (BTS) having a channel for testing multiple batteries simultaneously or a regulator for providing a current and voltage charge and discharge source;
a parallel test management device (PTMD), as recited in claim 1, for each battery, wherein each PTMD connects to its respective battery serially to form a PTMD-battery combination, wherein the main relay or switch of the PTMD is capable of isolating a battery that has a problem, and wherein the current transducer or shunt of the PTMD is capable of measuring equalization current and all other current through a battery for precise measurement of and calculation of current and charge/discharge capacity through the battery;
circuits for connecting PTMD-battery combinations in parallel to form parallel PTMD-battery groups;
a voltage equalizer connected to each parallel PTMD-battery group;
circuits for connecting the parallel PTMD-battery groups in series, thereby forming a parallel-serial battery group;
an equalizer power supply connected to the voltage equalizers; and
a power supply port for receiving an electrical current from an outside source, wherein the BTS and the voltage equalizer are connected to the power supply port,
wherein a BTS channel is connected to the parallel-serial battery group, wherein the BTS provides a current and voltage source for charging and discharging the batteries, and
wherein the batteries are formed and tested by running current from the BTS and from the equalizer through the plurality of batteries simultaneously.

27. The ISPTM of claim 26, wherein the circuit board is rectangular and has a length and a width, wherein the circuit board has opposing first and second ends along the length,
wherein the power supply port and temperature-sensitive electrical components are located at and near the first end of the circuit board, and
wherein the connectors for connecting to the batteries are located at and near the second end of the circuit board;
further comprising a thermal isolator between the temperature-sensitive electrical components and the connectors for connecting to the batteries.

28. The ISPTM of claim 26, further comprising a battery tray operatively connected to the circuit board for receiving and holding batteries.

29. A serial-parallel testing module (SPTM) for use with an energy storage device such as a super-capacitor or a battery pack, the SPTM comprising:
a circuit board for receiving and connecting to the energy storage device and for receiving electrical components and for providing circuits among the electrical components and between the electrical components and the energy storage device;
a parallel test management device (PTMD), as recited in claim 1, wherein the main relay or switch of the PTMD is configured for connection to the energy storage device serially, thereby forming a PTMD-device combination,
wherein the current transducer or shunt of the PTMD is capable of measuring equalization current and all other current through the energy storage device;
circuits for connecting two or more PTMD-device combinations in parallel to form a parallel device group;
a voltage equalizer connected to the parallel device group;
a power supply port for receiving external input and for providing a control power supply;
an equalizer power supply for the voltage equalizer; and
a charge/discharge current source, wherein the power supply port is integrated with the circuit board, and
wherein one or more energy storage devices are formed and tested by running current from the charge/discharge current source and from the equalizer through the one or more energy storage devices simultaneously.

30. A parallel test management device (PTMD) for connecting to a battery terminal and useful for forming and testing batteries comprising:
    a main relay; a current transducer; an auxiliary relay; and a current limiting resistor,
    wherein the main relay and the current transducer are connected in series, wherein the main relay has first and second terminals,
    wherein the first terminal of the main relay is for connecting to the battery terminal,
    wherein the second terminal of the main relay is connected to the current transducer,
    wherein the auxiliary relay and the current limiting resistor are in series with each other and in parallel with the main relay,
    wherein the auxiliary relay has first and second terminals, wherein the first terminal of the auxiliary relay is connected to the first terminal of the main relay,
    wherein the current limiting resistor has first and second terminals, wherein the second terminal of the auxiliary relay is connected to the first terminal of the current limiting resistor, and
    wherein the second terminal of the current limiting resistor is connected to the second terminal of the main relay.

31. The PTMD of claim 30, wherein the second terminal of the current limiting resistor is connected to a connector between the second terminal of the main relay and the current transducer.

32. A method for equalizing voltage between a plurality of raw batteries connected in parallel for formation of the batteries, the method comprising the steps of:
    connecting a PTMD according to claim 30 to each battery;
    connecting a regulator to the current transducer of each PTMD, wherein the regulator provides a current and voltage source for charging and discharging the batteries; and
    using the PTMDs to get batteries to reach a pre-balanced status, wherein the PTMDs limit current during a starting stage of pre-balancing the batteries.

33. A method for equalizing voltage between a plurality of batteries connected in parallel for formation and testing of the batteries, the method comprising the steps of:
    connecting a PTMD according to claim 6 to each battery to form a PTMD-battery combination;
    connecting the PTMD-battery combinations in parallel to form a parallel PTMD-battery group;
    connecting a regulator to the PTMD-battery group, wherein the regulator provides a current and voltage source for charging and discharging the batteries;
    connecting a voltage equalizer to the parallel PTMD-battery groups;
    connecting an equalizer power supply to the voltage equalizer; and
    running current from the regulator and from the equalizer through the plurality of batteries simultaneously.

34. The method of claim 33, further comprising connecting in series two or more of the parallel PTMD-battery groups, thereby forming a parallel-serial battery group.

35. The method of claim 34, further comprising connecting a battery testing system channel or a charge/discharge current source to the parallel-serial battery group for forming, testing and charging all of the batteries simultaneously under the same voltage and under a balanced-current distribution.

36. A method for forming and testing a plurality of batteries connected in parallel and in series, the method comprising the steps of:
    connecting a PTMD according to claim 6 to each battery to form a PTMD-battery combination;
    connecting the PTMD-battery combinations in parallel to form a parallel battery group;
    connecting two or more parallel battery groups in series, thereby forming a parallel-serial battery group;
    connecting a voltage equalizer to each parallel battery group;
    connecting an equalizer power supply to the voltage equalizers;
    connecting a regulator to the parallel-serial battery group, wherein the regulator provides a current and voltage source for charging and discharging the batteries; and
    forming and/or testing the batteries by running current from the regulator and from the equalizer through the plurality of batteries simultaneously.

37. A parallel serial test management device or PSTMD for forming and testing a plurality of batteries connected in parallel and in series, the PSTMD comprising:
    a PTMD according to claim 6 for connecting to a battery to form a PTMD-battery combination;
    a parallel battery group formed by connecting the PTMD-battery combinations in parallel;
    a series of parallel battery groups formed by connecting two or more parallel battery groups in series;
    a voltage equalizer connected to each parallel battery group;
    an equalizer power supply connected to the voltage equalizers; and
    a regulator connected to the parallel-serial battery group, wherein the PSTMD is capable of forming and/or testing batteries by running current from the regulator and from the equalizer through the plurality of batteries simultaneously.

38. A parallel serial test management device or PSTMD for forming and testing a plurality of batteries connected in parallel and serial, the PSTMD comprising:
    a PTMD according to claim 30 connected to each battery to form a PTMD-battery combination;
    a parallel PTMD-battery group formed by connecting the PTMD-battery combinations in parallel; and
    a voltage equalizer connected to the parallel PTMD-battery groups.

39. A method for forming and testing a plurality of batteries connected in parallel and in series, the method comprising the steps of:
    connecting a PTMD according to claim 6 to each battery to form a PTMD-battery combination;
    connecting the PTMD-battery combinations in parallel to form a parallel battery group;
    connecting two or more parallel battery groups in series to form a parallel-serial battery group;
    connecting a voltage equalizer to each parallel battery group;
    connecting an equalizer power supply to the voltage equalizers;
    connecting a battery testing system (BTS) or a regulator to the parallel-serial battery group, wherein the BTS or the regulator provides a current and voltage source for charging and discharging the batteries; and forming and/or testing the batteries by running current from the regulator and from the equalizer through the plurality of batteries simultaneously.

40. The method of claim 39, further comprising measuring battery capacity and coulombic efficiency using both CCCV charge and CCCV discharge, wherein CC stands for constant current and CV stands for constant voltage.

41. The method of claim 40, wherein current through batteries is approximately zero at the end of charge and discharge, and wherein the voltage drop across a circuit resistance, such as a relay and a shunt, is approximately zero at the end of both charge and discharge.

42. The method of claim 41, wherein the voltage is approximately the same for all of the batteries at the end of CCCV, wherein the state of charge (SOC) is approximately the same at the end of CCCV, and wherein the SOC is expressed as a percentage of the maximum capacity of a battery.

43. A circuit assembly for forming and testing batteries comprising:
a battery testing system (BTS) having channels for testing multiple batteries simultaneously;
a parallel test management device (PTMD) for each battery, wherein each PTMD connects to its respective battery serially to form a PTMD-battery combination, wherein the PTMD comprises:
a main relay or switch configured for connection to a terminal of a battery;
a current transducer or shunt connected in series with the main relay or switch, wherein each of the current transducer and the shunt is configured to measure current through the battery, wherein the main relay or switch is between the current transducer or shunt and the battery terminal;
an auxiliary relay connected in series with a current limiting resistor, wherein the auxiliary relay and the current limiting resistor are connected to and in parallel with the main relay,
wherein the auxiliary relay connects directly to the current limiting resistor, wherein the auxiliary relay connects between the battery and the main relay or switch, and wherein the current limiting resistor connects between the main relay or switch and the current transducer or shunt; and
circuits for connecting PTMD-battery combinations in parallel to form parallel PTMD-battery groups and for connecting the parallel PTMD-battery groups to a BTS channel,
wherein the BTS channel provides programmed current, voltage or power, wherein the BTS channel is configured to pass current through each battery in a parallel PTMD-battery group, wherein current is distributed to each battery in a balanced manner, and
wherein the BTS channel is configured to provide programmed current, voltage or power to multiple batteries simultaneously, thereby forming or testing a plurality of batteries simultaneously with one BTS channel.

44. The circuit assembly of claim 43, further comprising means for maintaining voltage across each battery in the parallel PTMD-battery groups approximately equal within a desired precision range, wherein the current transducer or shunt is configured to measure equalization current and all other current through a battery for precise measurement of and calculation of current and charge/discharge capacity through the battery, wherein the main relay or switch is configured to isolate a battery that has a problem such as a short, and wherein the main relay or switch is configured to connect and disconnect the current transducer for a current calibration process.

45. The circuit assembly of claim 44, further comprising:
a parallel-serial battery group formed by connecting two or more parallel PTMD-battery groups in series;
a voltage equalizer connected to each parallel PTMD-battery group;
an equalizer power supply connected to the voltage equalizers; and
a regulator connected to the parallel-serial battery group, wherein the regulator is configured to form and test a plurality of batteries by running current from the regulator and from the equalizer through the plurality of batteries simultaneously.

46. A circuit assembly for forming and testing a plurality of batteries, comprising:
a current transducer for connecting to a battery in series;
a voltage equalizer connected in parallel to the current transducer, wherein the voltage equalizer is connected to the current transducer through a battery;
a circuit board or an alternative means for receiving and connecting to the plurality of batteries and for receiving electrical components and for providing circuits among the electrical components and between the electrical components and the batteries;
a parallel test management device (PTMD) according to claim 43 for each battery, wherein each PTMD connects to its respective battery serially to form a PTMD-battery combination, wherein the current transducer or shunt of the PTMD is configured for measuring equalization current and all other current through a battery for precise measurement of and calculation of current and charge/discharge capacity through the battery;
circuits for connecting PTMD-battery combinations in parallel to form a parallel PTMD-battery group and for connecting the parallel PTMD-battery group to a BTS channel or to a regulated power source, wherein the BTS channel or the regulated power source provides programmed current, voltage or power, and wherein current is distributed to each battery in a balanced manner;
an equalizer power supply connected to the voltage equalizer,
a power supply port for receiving an electrical current from an outside source,
wherein the voltage equalizer is connected to the parallel PTMD-battery group; and
wherein the BTS channel or the regulator and the voltage equalizer power supply are connected to the power supply port,
wherein a BTS channel or the regulator is connected to each PTMD, wherein the BTS channel or the regulator provides a current and voltage source for charging and discharging the batteries, and
wherein the batteries are formed and tested by running current from the BTS channel or the regulator and from the equalizer through the plurality of batteries simultaneously.

47. The circuit assembly of claim 46, further comprising two or more of the circuit assemblies of claim 46 connected in series, thereby forming a serial battery group, wherein
the BTS channel or the regulator is configured to provide a charge/discharge current source for testing, formation and charging of all batteries in the combination simultaneously under the same voltage and balanced-current distribution, and wherein the BTS channel or the regulator is connected across the serial battery group.

* * * * *